United States Patent
Mori et al.

(10) Patent No.: US 10,923,562 B2
(45) Date of Patent: Feb. 16, 2021

(54) SEMICONDUCTOR DEVICE, AND METHOD FOR MANUFACTURING SEMICONDCUTOR DEVICE

(71) Applicant: ROHM CO., LTD., Kyoto (JP)

(72) Inventors: Seigo Mori, Kyoto (JP); Masatoshi Aketa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/325,963

(22) PCT Filed: Aug. 10, 2017

(86) PCT No.: PCT/JP2017/029204
§ 371 (c)(1),
(2) Date: Feb. 15, 2019

(87) PCT Pub. No.: WO2018/034250
PCT Pub. Date: Feb. 22, 2018

(65) Prior Publication Data
US 2019/0181219 A1      Jun. 13, 2019

(30) Foreign Application Priority Data
Aug. 19, 2016   (JP) .................... 2016-161487

(51) Int. Cl.
*H01L 29/06* (2006.01)
*H01L 21/76* (2006.01)
(Continued)

(52) U.S. Cl.
CPC ...... *H01L 29/063* (2013.01); *H01L 21/02529* (2013.01); *H01L 21/02573* (2013.01);
(Continued)

(58) Field of Classification Search
CPC ........................ H01L 29/063; H01L 29/7811
See application file for complete search history.

(56) References Cited

U.S. PATENT DOCUMENTS 9,018,633 B2 * 4/2015 Wakimoto .......... H01L 29/0619
257/76
2005/0029568 A1   2/2005 Tokuda et al.
(Continued)

FOREIGN PATENT DOCUMENTS

JP   2005093972 A   4/2005
JP   2007165424 A   12/2005
(Continued)

OTHER PUBLICATIONS

PCT: International Search Report and Written Opinion of PCT/JP2017/029204; dated Nov. 7, 2017; 11 pages. (including English translation for the International Search Report only).
(Continued)

*Primary Examiner* — Eugene Lee
(74) *Attorney, Agent, or Firm* — Gregory M. Howison

(57) ABSTRACT

There is provided a reverse-blocking semiconductor device that has a simple configuration, that is capable of improving a yield in a manufacturing process, and that secures a reverse withstand voltage by using a Schottky junction, and there is provided a method for manufacturing the reverse-blocking semiconductor device. A semiconductor device is provided that includes a first conductivity type semiconductor layer that has a front surface, a rear surface on an opposite side of the front surface, and an end surface, a MIS transistor structure formed at a front-surface portion of the semiconductor layer, a first electrode that forms a Schottky junction with a part of the semiconductor layer in the rear surface of the semiconductor layer, and an electric-field relaxation region that is formed to reach the rear surface from the front surface of the semiconductor layer in a peripheral region surrounding an active region in which the MIS transistor structure is formed and that is either a high-resistance region
(Continued)

having higher resistance than the semiconductor layer or a second conductivity type impurity region.

19 Claims, 57 Drawing Sheets

(51) Int. Cl.
| | |
|---|---|
| *H01L 21/322* | (2006.01) |
| *H01L 21/28* | (2006.01) |
| *H01L 29/78* | (2006.01) |
| *H01L 29/12* | (2006.01) |
| *H01L 21/02* | (2006.01) |
| *H01L 21/04* | (2006.01) |
| *H01L 21/78* | (2006.01) |
| *H01L 23/31* | (2006.01) |
| *H01L 23/495* | (2006.01) |
| *H01L 29/10* | (2006.01) |
| *H01L 29/16* | (2006.01) |
| *H01L 29/32* | (2006.01) |
| *H01L 29/40* | (2006.01) |
| *H01L 29/66* | (2006.01) |
| *H01L 29/20* | (2006.01) |
| *H01L 29/739* | (2006.01) |
| *H02M 5/293* | (2006.01) |

(52) U.S. Cl.
CPC ........ *H01L 21/046* (2013.01); *H01L 21/0475* (2013.01); *H01L 21/28* (2013.01); *H01L 21/322* (2013.01); *H01L 21/76* (2013.01); *H01L 21/78* (2013.01); *H01L 23/3114* (2013.01); *H01L 23/4952* (2013.01); *H01L 23/49513* (2013.01); *H01L 23/49562* (2013.01); *H01L 29/06* (2013.01); *H01L 29/0623* (2013.01); *H01L 29/1095* (2013.01); *H01L 29/12* (2013.01); *H01L 29/1608* (2013.01); *H01L 29/32* (2013.01); *H01L 29/407* (2013.01); *H01L 29/66068* (2013.01); *H01L 29/78* (2013.01); *H01L 29/7806* (2013.01); *H01L 29/7811* (2013.01); *H01L 29/16* (2013.01); *H01L 29/2003* (2013.01); *H01L 29/7395* (2013.01); *H02M 5/293* (2013.01)

(56) References Cited

U.S. PATENT DOCUMENTS

| | | |
|---|---|---|
| 2006/0249797 A1 | 11/2006 | Nakazawa et al. |
| 2007/0272979 A1 | 11/2007 | Saito et al. |
| 2008/0135926 A1* | 6/2008 | Ono .................... H01L 29/0634 257/328 |
| 2009/0101974 A1* | 4/2009 | Saito .................... H01L 29/7811 257/342 |
| 2010/0093164 A1 | 4/2010 | Nakazawa et al. |
| 2010/0200936 A1 | 8/2010 | Saito et al. |
| 2010/0264455 A1 | 10/2010 | Nakazawa et al. |
| 2011/0121440 A1* | 5/2011 | Fujiwara ............. H01L 23/3142 257/675 |
| 2011/0193133 A1* | 8/2011 | Ogura ................. H01L 31/1105 257/184 |
| 2011/0215435 A1 | 9/2011 | Wakimoto et al. |
| 2012/0056262 A1* | 3/2012 | Saito .................... H01L 29/7839 257/330 |
| 2012/0211768 A1 | 8/2012 | Yoshikawa |
| 2014/0001487 A1* | 1/2014 | Nakazawa .......... H01L 29/2003 257/76 |
| 2014/0094020 A1 | 4/2014 | Wakimoto et al. |
| 2014/0225120 A1* | 8/2014 | Zhu .................... H01L 29/2003 257/76 |
| 2014/0361312 A1* | 12/2014 | Yoshikawa ....... H01L 29/66068 257/76 |

FOREIGN PATENT DOCUMENTS

| | | |
|---|---|---|
| JP | 2006303410 A | 11/2006 |
| JP | 2008004643 A | 1/2008 |
| JP | 2009123914 A | 6/2009 |
| JP | 2011181770 A | 9/2011 |
| JP | 2012-174831 A | 10/2012 |
| JP | 2016-004930 A | 1/2016 |
| WO | 2012124190 A1 | 9/2012 |
| WO | 2012124191 A1 | 9/2012 |
| WO | 2013172059 A1 | 11/2013 |

OTHER PUBLICATIONS

PCT: International Preliminary Report on Patentability of PCT/JP2017/029204; dated Feb. 28, 2019; 22 pages.

* cited by examiner

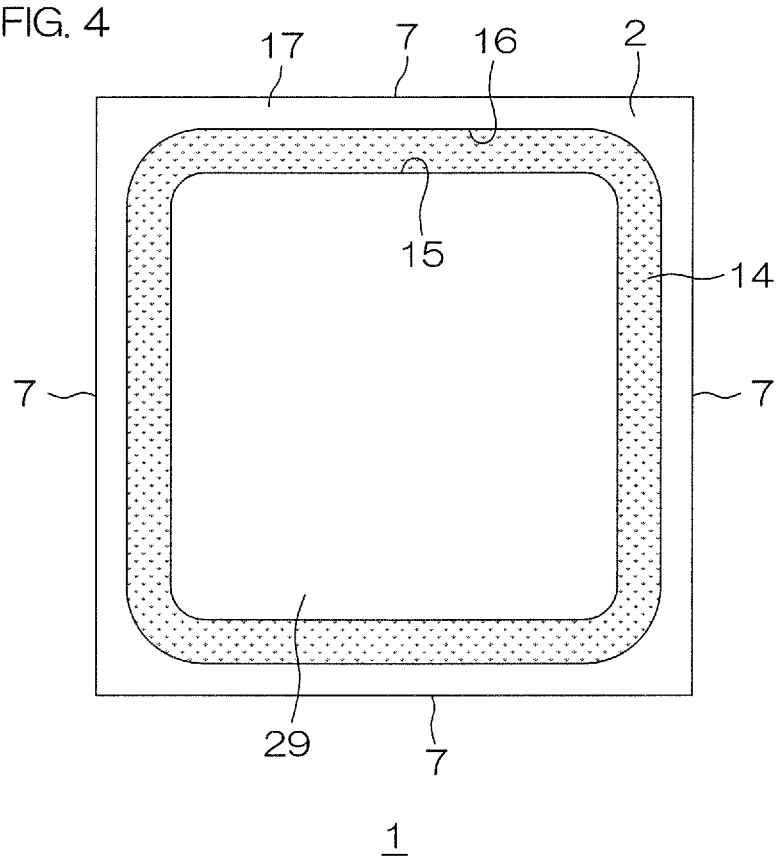

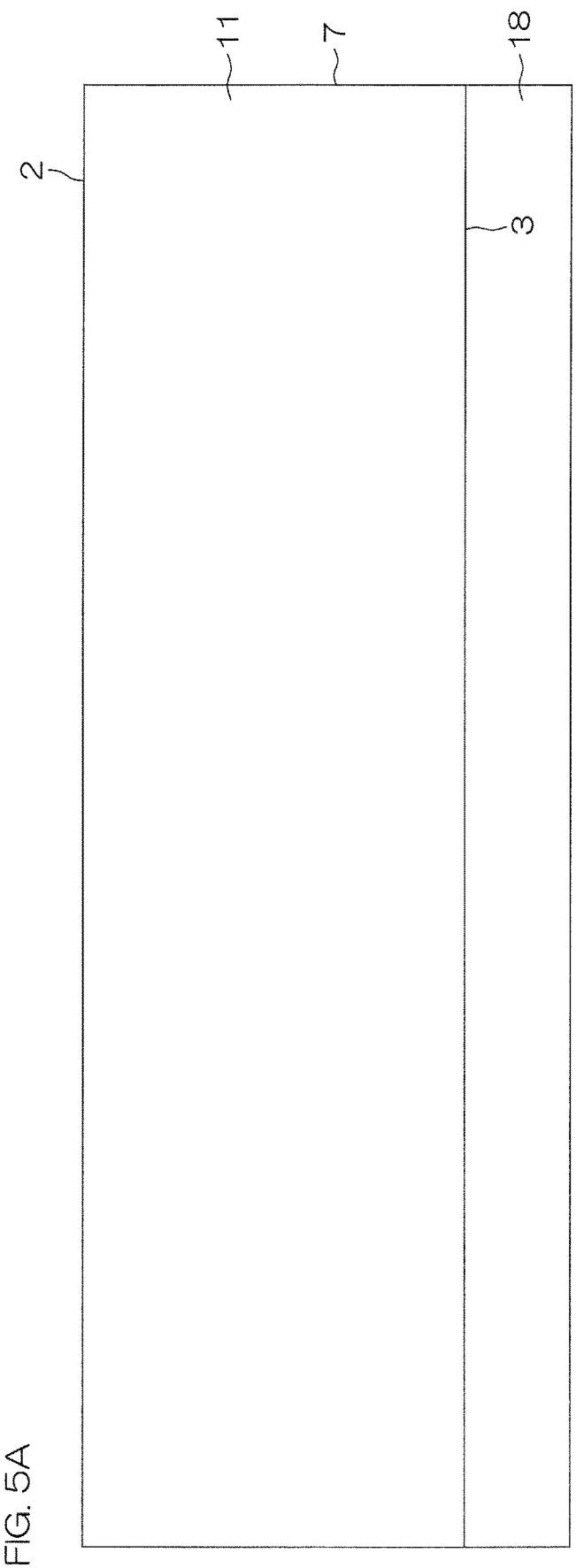

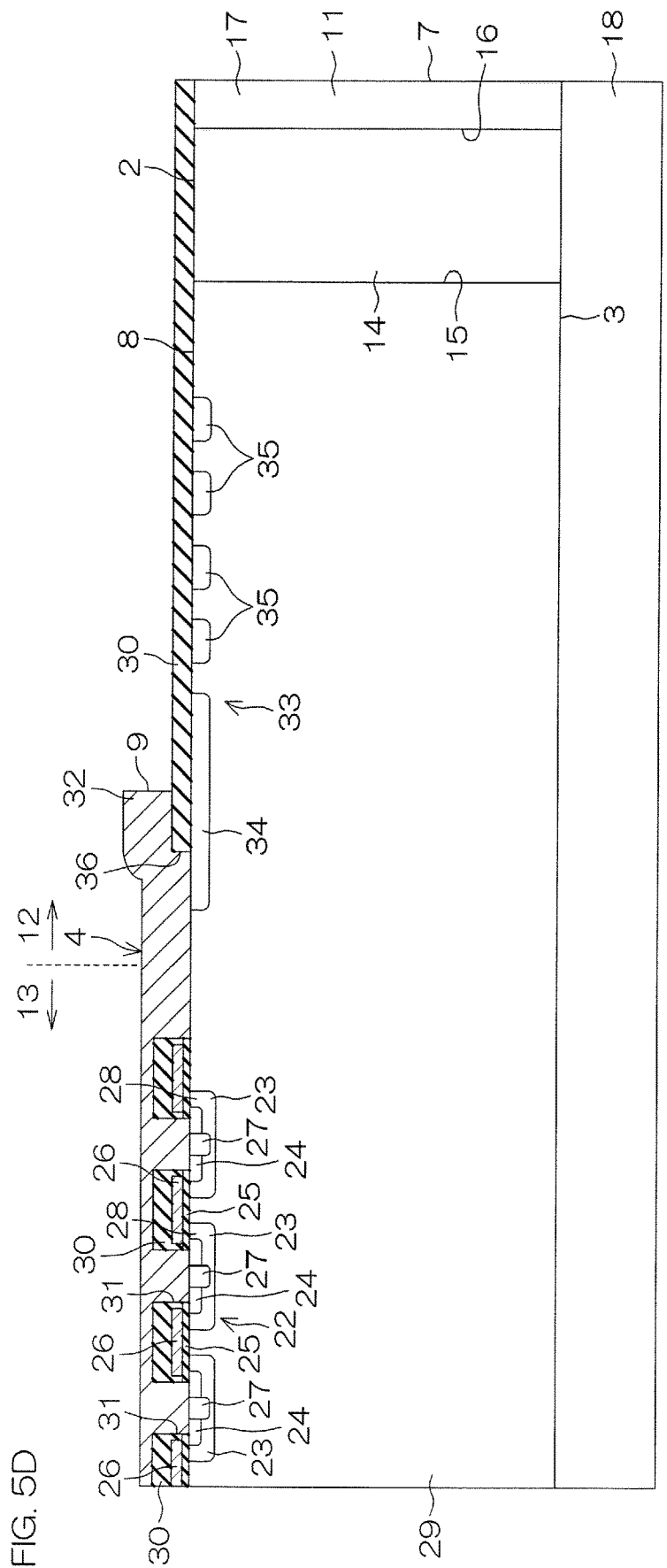

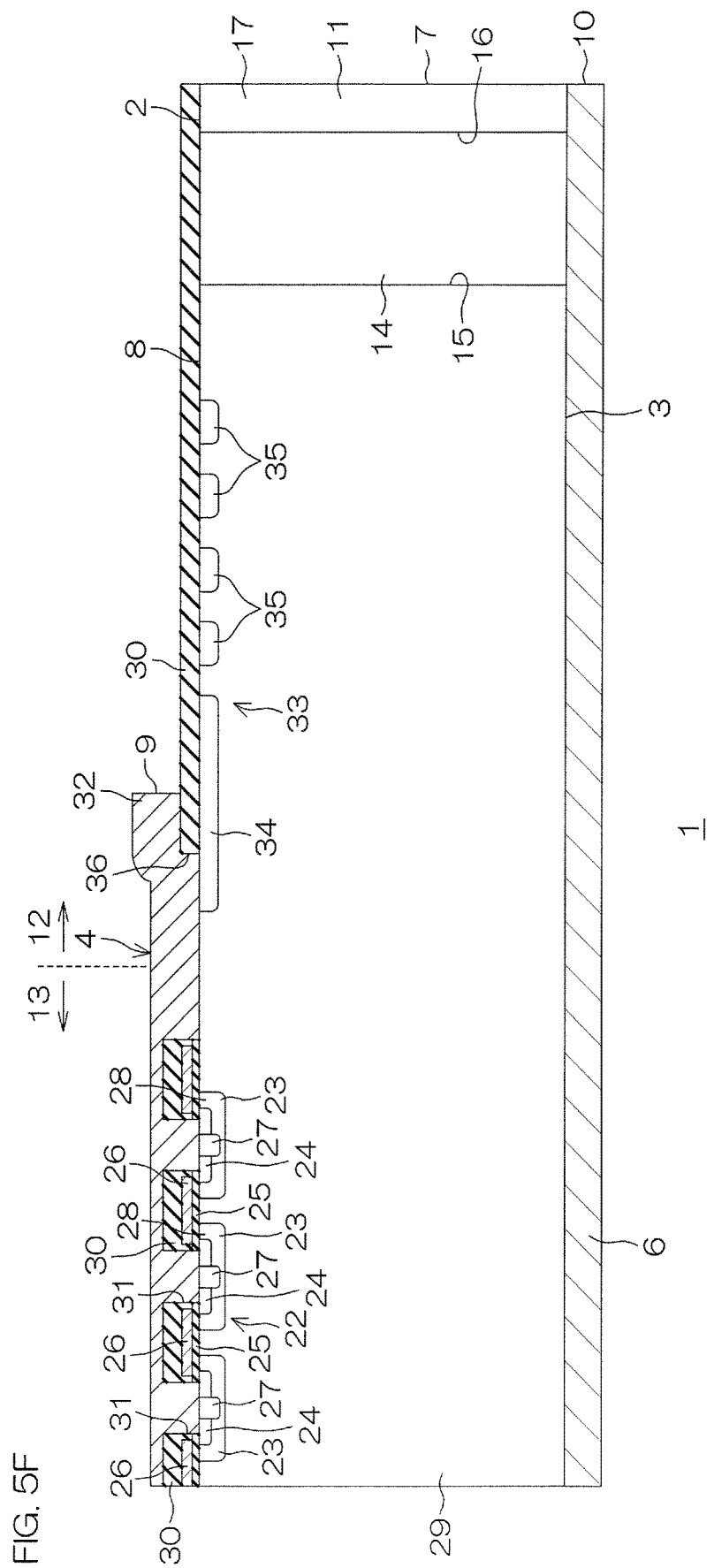

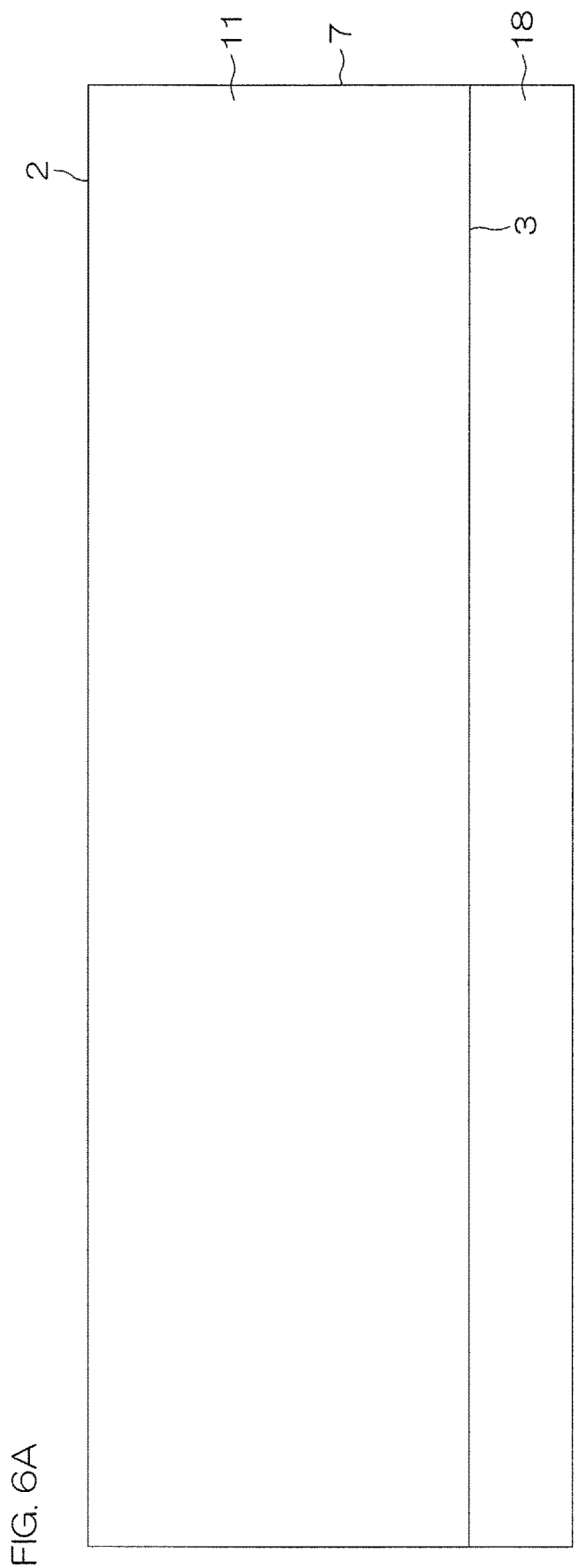

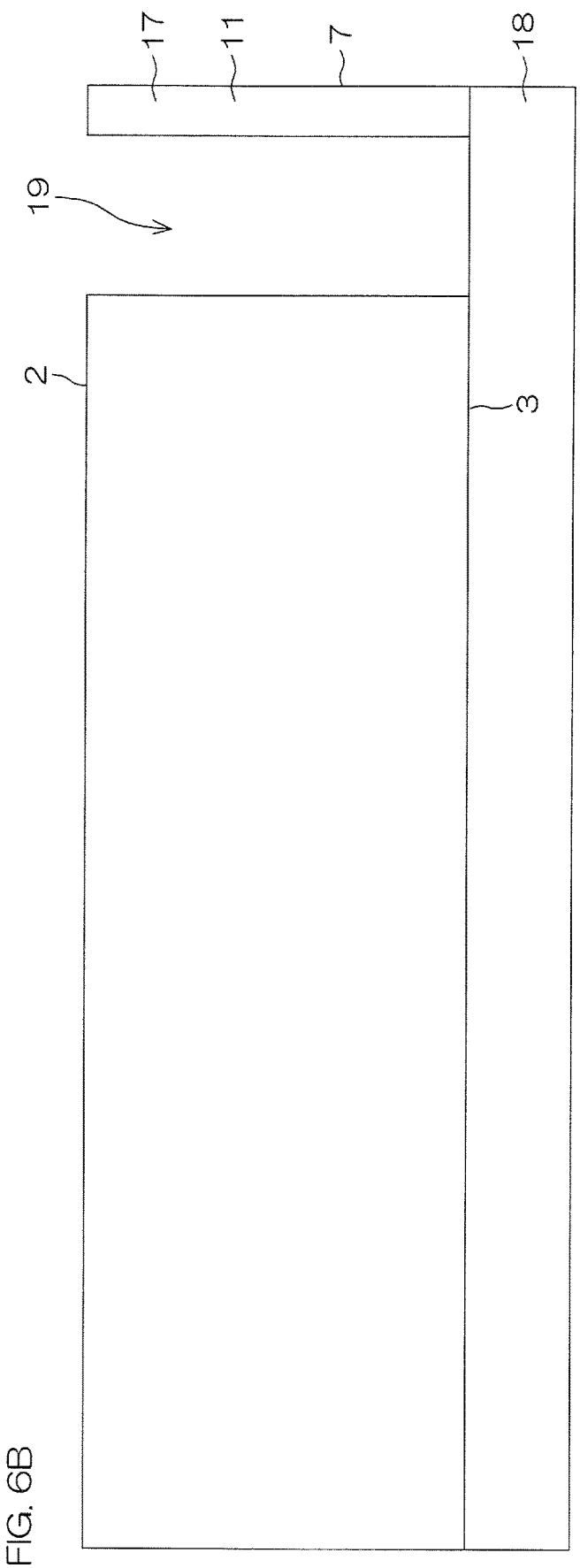

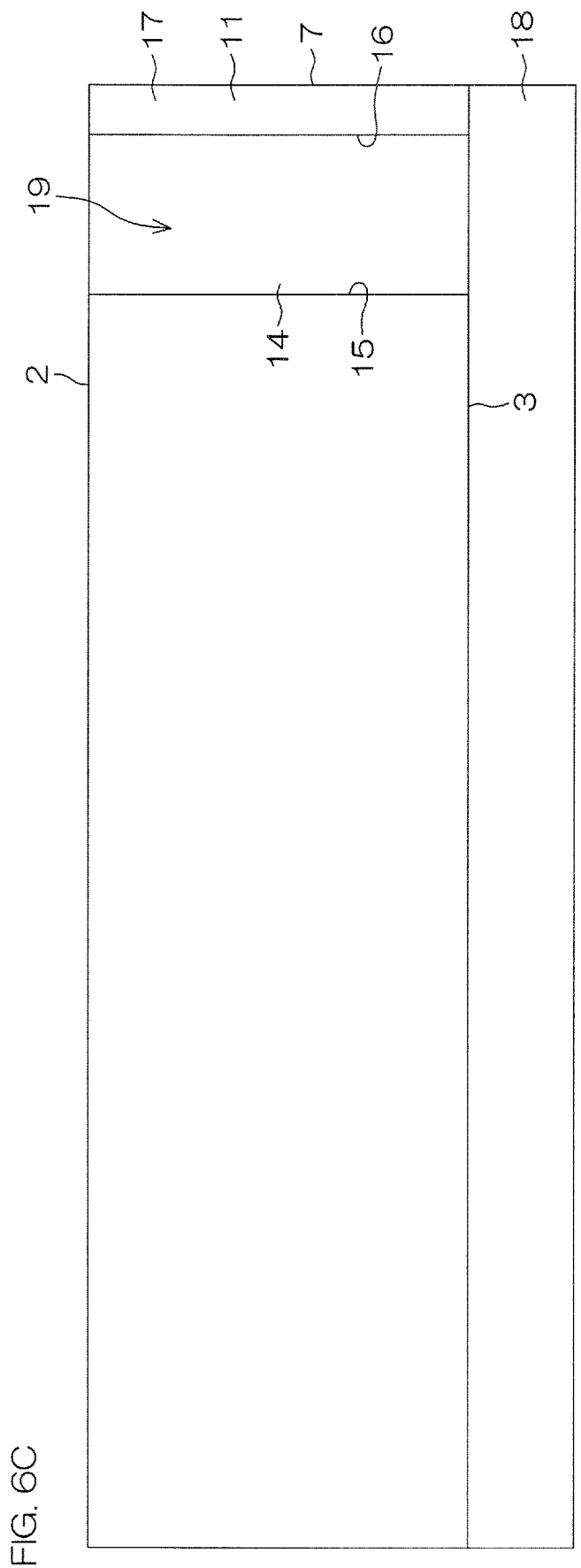

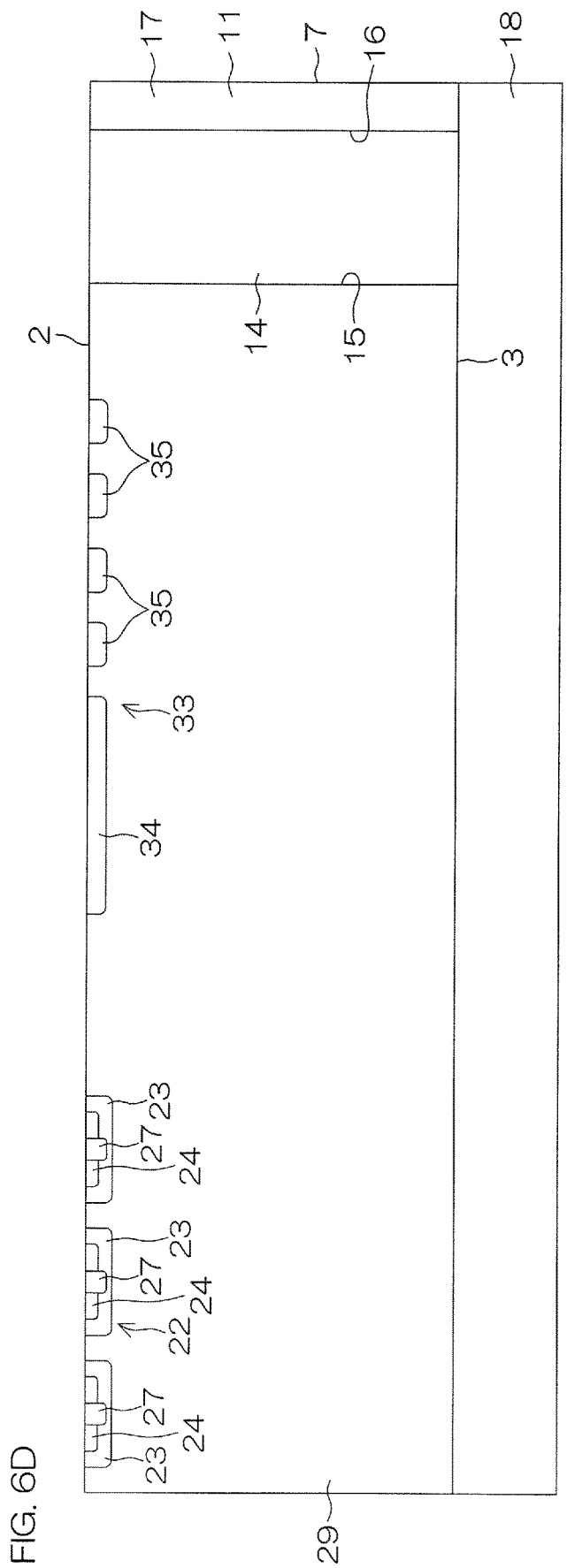

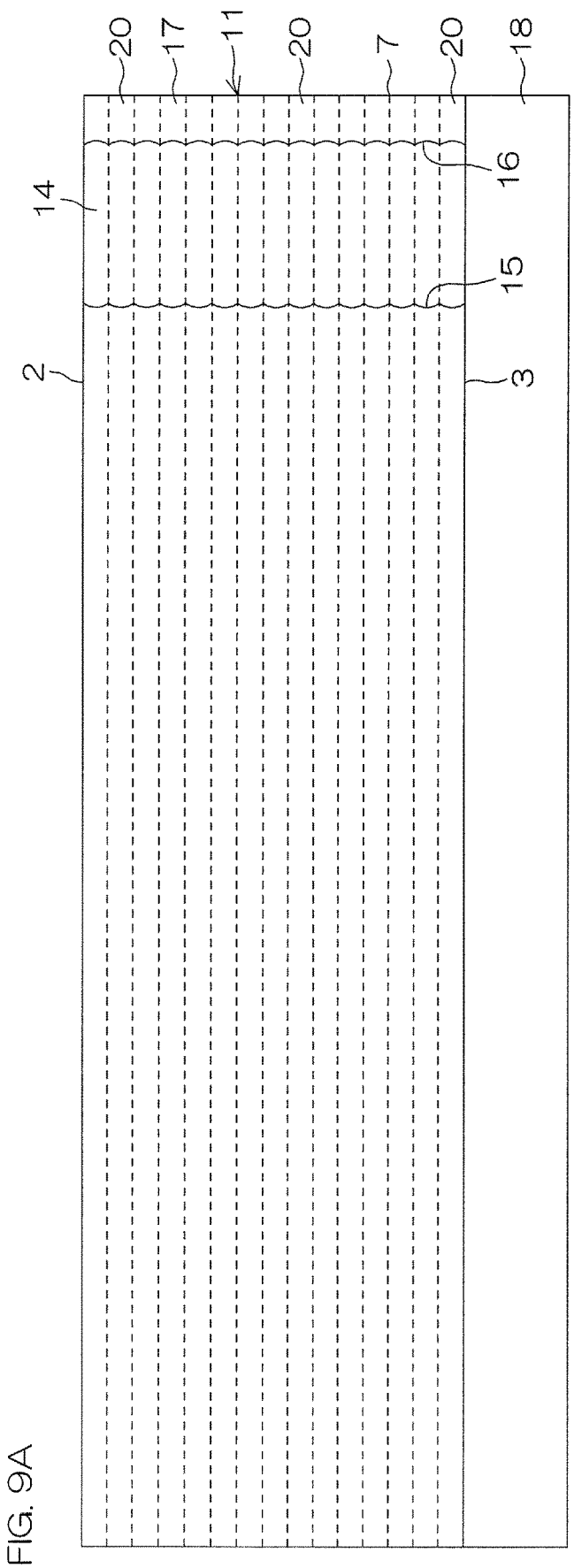

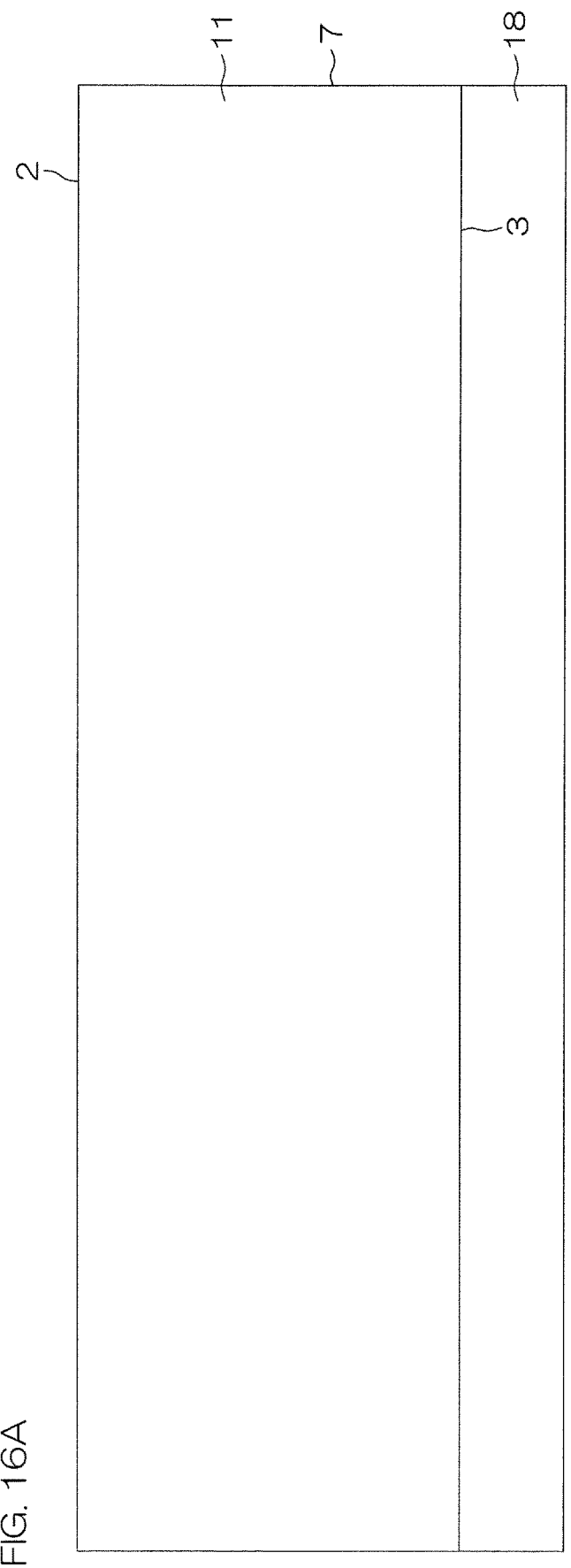

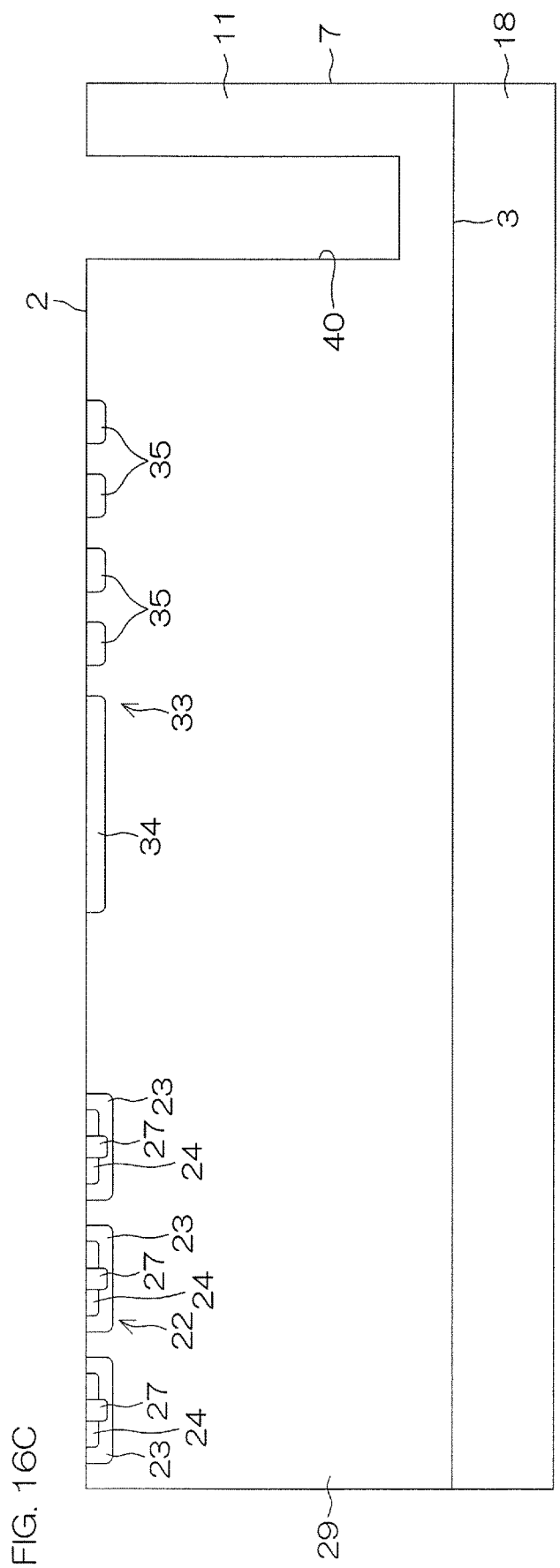

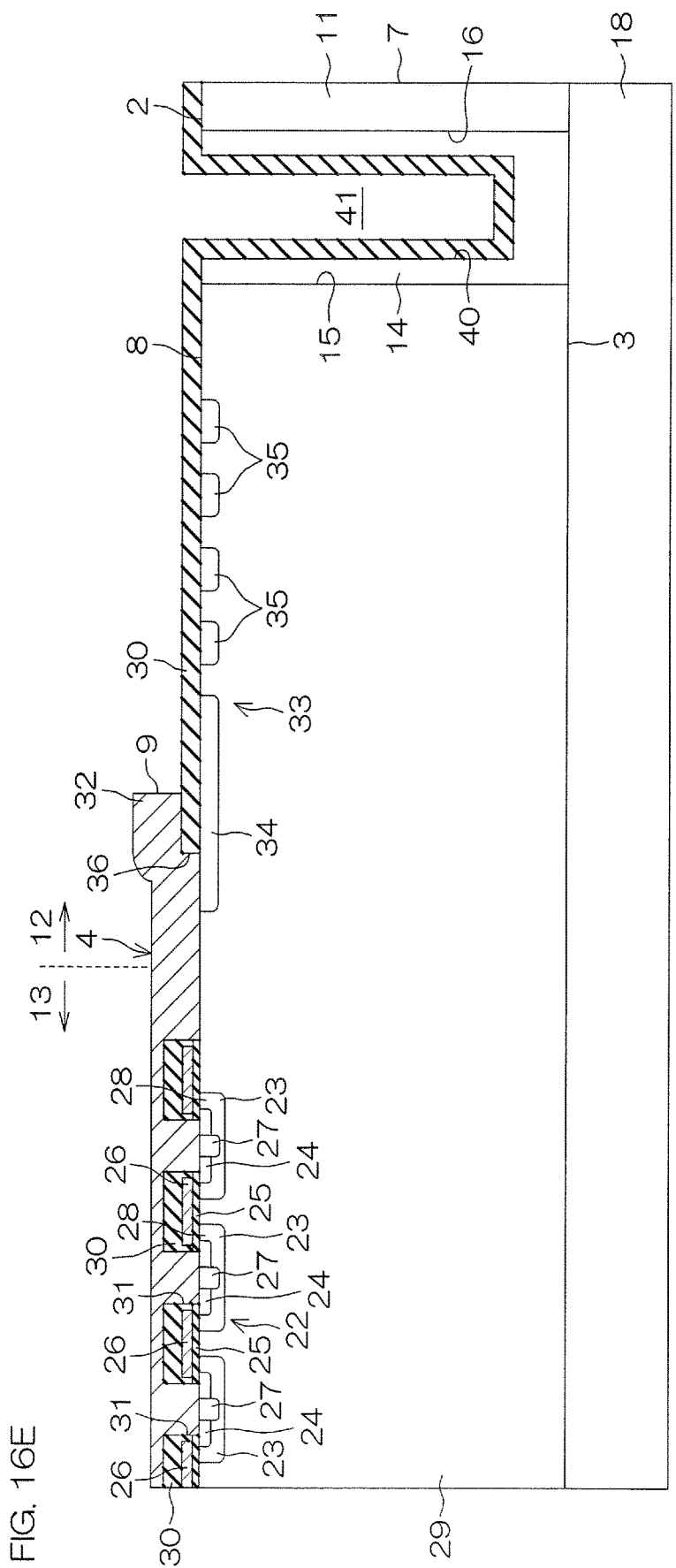

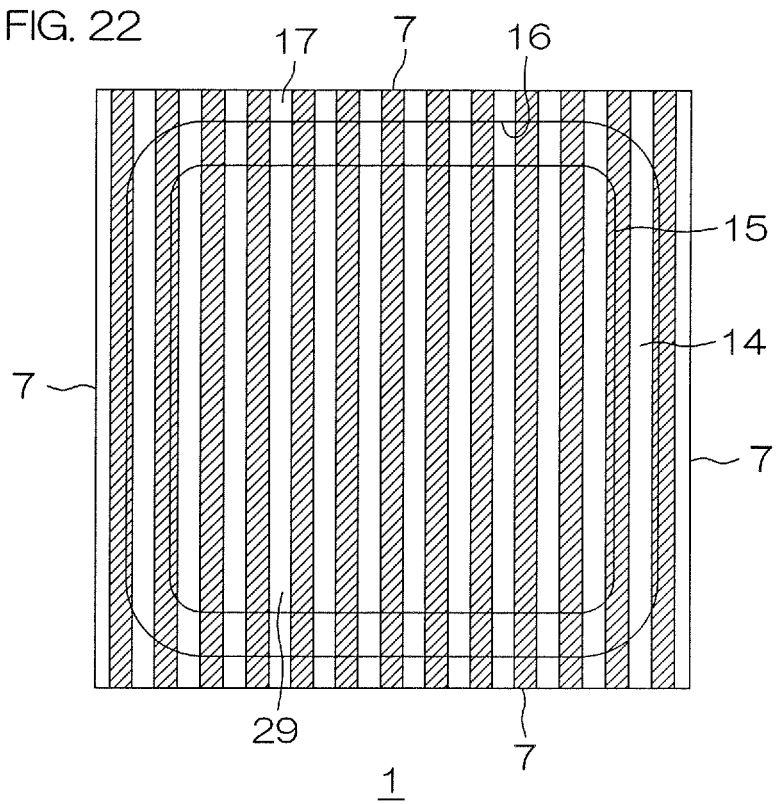

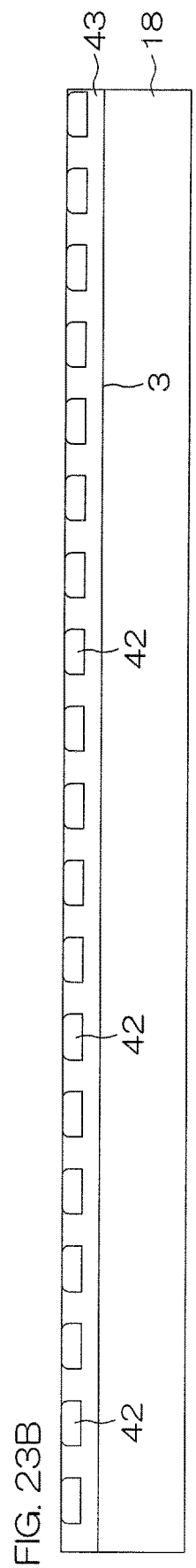

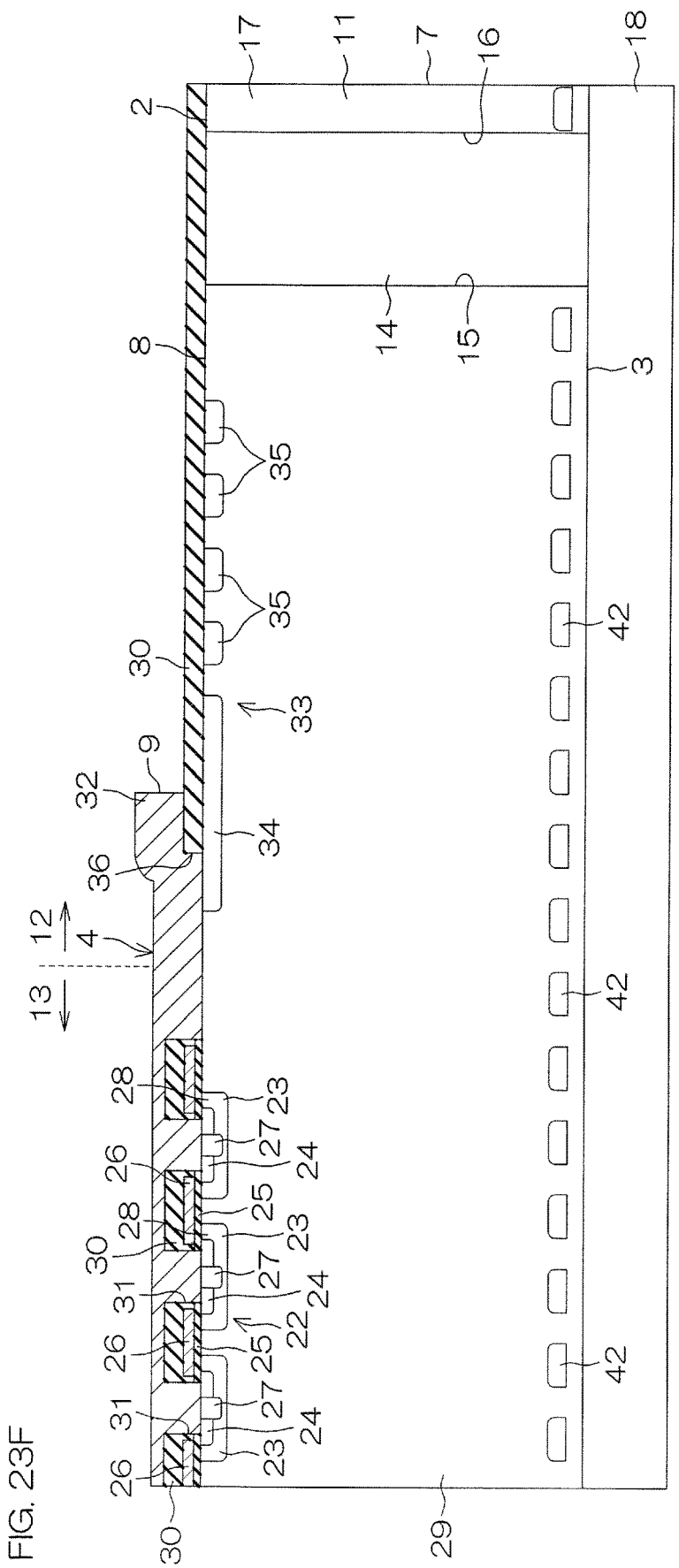

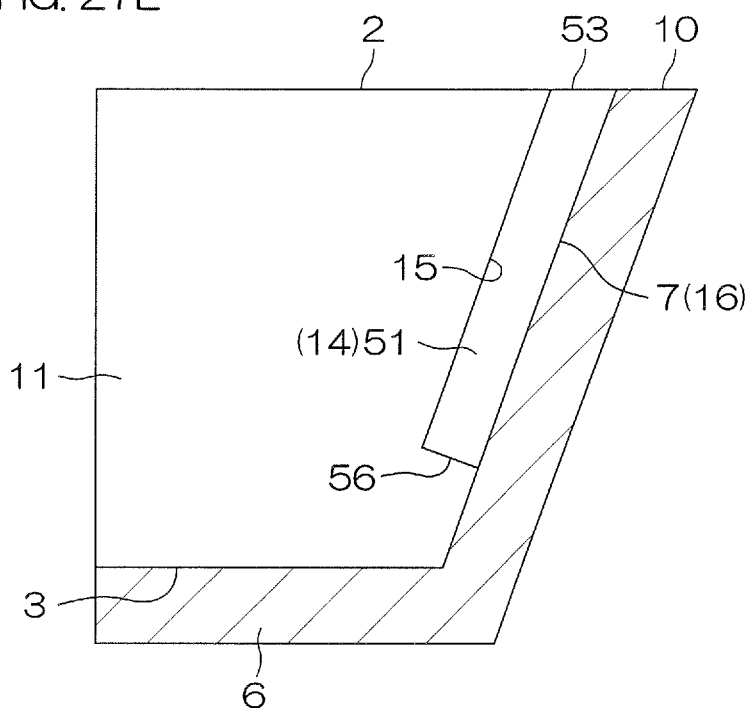

Laser radiation

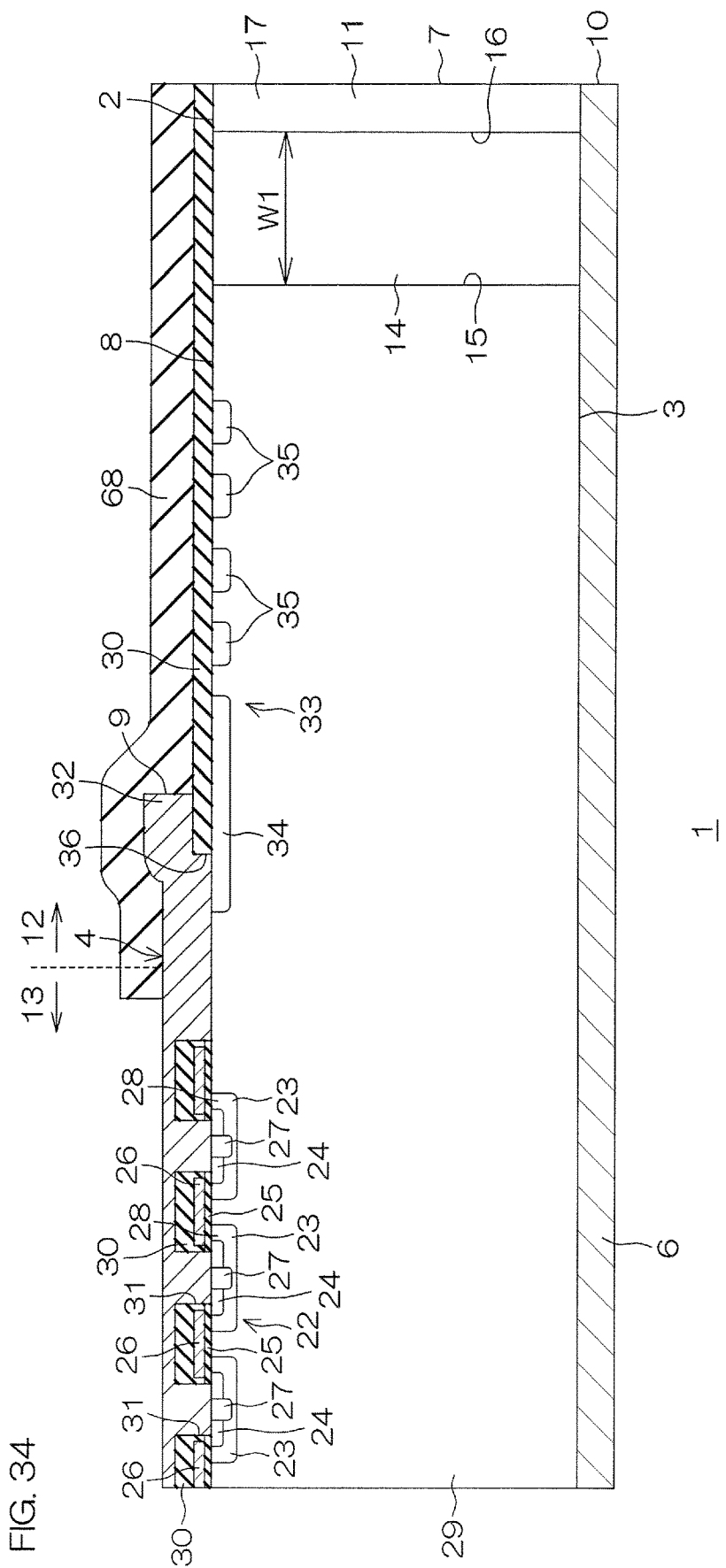

SEMICONDUCTOR DEVICE, AND METHOD FOR MANUFACTURING SEMICONDCUTOR DEVICE

CROSS-REFERENCE TO RELATED APPLICATIONS

This application is a U.S. National Phase application submitted under 35 U.S.C. § 371 of Patent Cooperation Treaty application serial no. PCT/JP2017/029204, filed Aug. 10, 2017, and entitled SEMICONDUCTOR DEVICE, AND METHOD FOR MANUFACTURING SEMICONDUCTOR DEVICE, which application claims priority to Japanese patent application serial no. 2016-161487, filed Aug. 19, 2016, and entitled 半導体装置 および半導体 装置の製造方法.

Patent Cooperation Treaty application serial no. PCT/JP2017/029204, published as WO 2018/034250 A1, and Japanese patent application serial no. 2016-161487, are incorporated herein by reference.

TECHNICAL FIELD

The present invention relates to a semiconductor device and a method for manufacturing the semiconductor device and, more particularly, relates to a reverse-blocking semiconductor device in which a Schottky junction is formed at a rear surface of a semiconductor layer and to a method for manufacturing the semiconductor device.

BACKGROUND ART

A bidirectional switch that uses a MOSFET or an IGBT has heretofore been known. The bidirectional switch is used, for example, in a matrix converter circuit or in a neutral point clamp.

For example, Patent Literature 1 discloses a reverse-blocking IGBT as a device that is used as a bidirectional switch, and the reverse-blocking IGBT includes a drift layer made of an n type semiconductor substrate, a p type base region formed on one surface side of the drift layer, an n type emitter region of a surface layer of the p type base region, a gate oxide film on a surface of the p type base region sandwiched between the n type emitter region and a surface of the drift layer, a gate electrode on the gate oxide film, a terminal region including an FLR formed at the outer periphery of an active region of the drift layer, a p type collector layer formed on the other surface side of the drift layer, and an isolation region that is placed at the outer periphery of the FLR and that is contiguous to the p type collector layer while passing through the drift layer from the one surface side of the drift layer.

Additionally, for example, Patent Literature 2 discloses a reverse-blocking MOSFET as a reverse-blocking device other than IGBTs, and the reverse-blocking MOSFET is composed of an n⁻ type drift layer made of SiC, a p⁺ type substrate formed on one principal-surface side of the n⁻ type drift layer, a plurality of rear-surface trenches that pass through the p⁺ type substrate and that reach the n⁻ type drift layer, and a titanium electrode that forms a Schottky junction with the n⁻ type drift layer in a bottom portion of each of the rear-surface trenches.

CITATION LIST

Patent Literature

Patent Literature 1: Japanese Patent Application Publication No. 2016-4930

Patent Literature 2: Japanese Patent Application Publication No. 2012-174831

SUMMARY OF INVENTION

Technical Problem

As described above, various inventions have been proposed as the reverse-blocking device. In consideration of these circumstances, the present invention provides a reverse-blocking semiconductor device that has a simple configuration, that is capable of improving a yield in a manufacturing process, and that secures a reverse withstand voltage by use of a Schottky junction, and provides a method for manufacturing the reverse-blocking semiconductor device.

Solution to the Problem

A semiconductor device according to a preferred embodiment of the present invention includes a first conductivity type semiconductor layer that has a front surface, a rear surface on an opposite side of the front surface, and an end surface, a circuit element formed at a front-surface portion of the semiconductor layer, a first electrode that is joined to the semiconductor layer in the rear surface of the semiconductor layer, and an electric-field relaxation region reaching the rear surface from the front surface of the semiconductor layer in a peripheral region surrounding an active region in which the circuit element is formed, the electric-field relaxation region being either a high-resistance region having higher resistance than the semiconductor layer or a second conductivity type impurity region.

According to this configuration, it is possible to block an electric current flowing through the inside of the semiconductor layer in a thickness direction by a Schottky barrier of a Schottky junction between the semiconductor layer and the first electrode when a reverse voltage is applied to the circuit element (for example, a MIS transistor structure). Additionally, an electric-field relaxation region is formed around the circuit element. Accordingly, even if a depletion layer spreads toward the end surface (chip end surface) of the semiconductor layer when a reverse voltage is applied, it is possible to stop the depletion layer by means of the electric-field relaxation region, and it is possible to prevent the depletion layer from reaching the end surface. As a result, it is possible to relax the electric field strength near the end surface of the semiconductor layer. Therefore, even if a defective region exists at the end surface of the semiconductor layer because of dicing, it is also possible to prevent a leakage current from flowing because of the generation of electron-hole pairs in the defective region. From these results, it is possible to allow the semiconductor device of the present invention to secure an excellent reverse withstand voltage, and therefore it is possible to excellently use it as a reverse-blocking MISFET for bidirectional switches.

The semiconductor device according to a preferred embodiment of the present invention can be manufactured by a semiconductor device manufacturing method according to a preferred embodiment of the present invention that includes, for example, a step of forming a first conductivity type semiconductor layer on a substrate, a step of forming a circuit element at a front-surface portion on a side opposite to the substrate of the semiconductor layer, a step of forming an electric-field relaxation region that is either a high-resistance region having higher resistance than the semiconductor layer or a second conductivity type impurity region so as to reach a rear surface on an opposite side of the front surface of the semiconductor layer from the front surface of the semiconductor layer in a peripheral region surrounding an active region in which the circuit element is formed, a step of exposing the rear surface of the semiconductor layer by removing the substrate, and a step of forming a first electrode that is joined to the semiconductor layer on the rear surface of the semiconductor layer.

According to this method, an electric-field relaxation region is formed in a stable state in which the semiconductor layer is mounted on the substrate. In other words, there is no need to form an electric-field relaxation region in a thin wafer state after removing the base substrate, and it is possible to prevent a wafer from being broken into pieces, for example, by making a handling mistake. Additionally, it is also possible to limit a step that is performed after removing the base substrate and thinning the wafer only to the step of forming the first electrode, and therefore it is possible to reduce the number of handling times to handle the wafer that has been thinned, and it is possible to lessen a handling-mistake probability. From these results, it is possible to lessen the probability of occurrence of defective articles, and therefore it is possible to improve a yield in the manufacturing process.

Additionally, when a circuit element is produced at the front-surface portion of the semiconductor layer, it is possible to form an electric-field relaxation region by means of processing from the front-surface side of the semiconductor layer in parallel with that production. Therefore, it is possible to make limitations on factors (temperature, chemical solution to be used, devices, etc.) that influence each element of the circuit element smaller than in a case in which an electric-field relaxation region is formed after producing the circuit element. As a result, it is possible to improve the efficiency of the manufacturing process.

In the semiconductor device according to a preferred embodiment of the present invention, the semiconductor layer may be SiC, and the electric-field relaxation region may be a high-resistance region having a crystal defect concentration of $1 \times 10^{14}$ cm$^{-3}$ to $1 \times 10"$cm$^{-3}$.

In the semiconductor device according to a preferred embodiment of the present invention, the semiconductor layer may be SiC, and the electric-field relaxation region may be a second conductivity type impurity region having an impurity concentration of $1 \times 10^{18}$ cm$^{-3}$ to $1 \times 10^{22}$ cm$^{-3}$.

In the semiconductor device according to a preferred embodiment of the present invention, the electric-field relaxation region may be formed inwardly away from the end surface of the semiconductor layer such that the electric-field relaxation region surrounds the active region.

In the semiconductor device according to a preferred embodiment of the present invention, the semiconductor layer may include a first conductivity type peripheral impurity region between the electric-field relaxation region and the end surface of the semiconductor layer, and the first electrode may be in contact with the peripheral impurity region in the rear surface of the semiconductor layer, and the semiconductor device may further include an auxiliary electrode that is in contact with the peripheral impurity region in the front surface of the semiconductor layer and that is electrically connected to the first electrode.

According to this configuration, the electric potential of the peripheral impurity region is fixed at the same electric potential from the front surface to the rear surface of the semiconductor layer. As a result, it is possible to bring about a state in which an electric field is not easily applied to the peripheral impurity region, and therefore it is possible to further relax the electric field strength near the end surface of the semiconductor layer.

In the semiconductor device according to a preferred embodiment of the present invention, the auxiliary electrode may straddle a boundary portion between the electric-field relaxation region and the peripheral impurity region, and may be in contact with both the electric-field relaxation region and the peripheral impurity region.

In the semiconductor device according to a preferred embodiment of the present invention, the electric-field relaxation region may reach the end surface of the semiconductor layer.

In the semiconductor device according to a preferred embodiment of the present invention, the first electrode may be in contact with the electric-field relaxation region in the rear surface of the semiconductor layer, and the semiconductor device may further include an auxiliary electrode that is in contact with the electric-field relaxation region in the front surface of the semiconductor layer and that is electrically connected to the first electrode.

According to this configuration, the electric potential of the electric-field relaxation region is fixed at the same electric potential from the front surface to the rear surface of the semiconductor layer. As a result, it is possible to bring about a state in which an electric field is not easily applied to the electric-field relaxation region, and therefore it is possible to further relax the electric field strength near the end surface of the semiconductor layer.

In the semiconductor device according to a preferred embodiment of the present invention, the peripheral region of the semiconductor layer may include a flat portion with which the front surface of the semiconductor layer is flat, and the electric-field relaxation region may reach the rear surface from the front surface of the semiconductor layer of the flat portion.

In the semiconductor device according to a preferred embodiment of the present invention, the semiconductor device may further include a concave portion formed from the front surface in the peripheral region of the semiconductor layer, and the electric-field relaxation region is formed along an inner surface of the concave portion, and a bottom portion of the electric-field relaxation region is exposed at the rear surface of the semiconductor layer.

In the semiconductor device according to a preferred embodiment of the present invention, the semiconductor device may further include a second electric-field relaxation region that is formed at a rear-surface portion of the semiconductor layer and that is either a high-resistance region having higher resistance than the semiconductor layer or a second conductivity type impurity region.

According to this configuration, it is possible to relax the electric field of a Schottky interface between the semiconductor layer and the first electrode. Accordingly, it is possible to reduce a reverse leakage current even if a metal that has a comparatively small work function is used as the first electrode, and therefore the use of this metal makes it possible to secure a low on-resistance.

In the semiconductor device according to a preferred embodiment of the present invention, the second electric-field relaxation region may be exposed to the rear surface of the semiconductor layer, and the first electrode may be in contact with the second electric-field relaxation region in the rear surface of the semiconductor layer.

In the semiconductor device according to a preferred embodiment of the present invention, a plurality of the second electric-field relaxation regions may be arranged in a discrete and matrix manner when the semiconductor layer is seen from a side of the rear surface.

In the semiconductor device according to a preferred embodiment of the present invention, a plurality of the second electric-field relaxation regions may be arranged in a stripe manner, or the second electric-field relaxation region may be formed in a grid pattern manner when the semiconductor layer is seen from a side of the rear surface.

In the semiconductor device according to a preferred embodiment of the present invention, the semiconductor device may further include a surface termination structure formed on a more inward side than the electric-field relaxation region in the peripheral region of the semiconductor layer.

The semiconductor device according to a preferred embodiment of the present invention may include a second electrode that is formed on the semiconductor layer and that is electrically connected to a source or an emitter of the MIS transistor structure.

A semiconductor package according to a preferred embodiment of the present invention has a semiconductor device according to a preferred embodiment of the present invention, a lead frame on which the semiconductor device is mounted, and a sealing resin that seals the semiconductor device and at least one part of the lead frame.

A power source conversion device according to a preferred embodiment of the present invention uses the semiconductor device as a bidirectional switching device, and, for example, uses the bidirectional switching device as a switching circuit of a matrix converter circuit from multiphase input to multiphase output.

In the semiconductor device manufacturing method according to a preferred embodiment of the present invention, the step of forming the electric-field relaxation region may include a step of forming the high-resistance region by radiating a first substance that includes at least one among protons, helium ions, and electron rays from a side of the front surface of the semiconductor layer after forming the semiconductor layer.

In the semiconductor device manufacturing method according to a preferred embodiment of the present invention, the step of forming the electric-field relaxation region may include a step of forming the second conductivity type impurity region by implanting second conductivity type impurity ions from a side of the front surface of the semiconductor layer after forming the semiconductor layer.

In the semiconductor device manufacturing method according to a preferred embodiment of the present invention, the step of forming the semiconductor layer may include a step of forming the semiconductor layer according to a multistage epitaxial method in which a first conductivity type layer is epitaxially grown repeatedly a plurality of times, and the step of forming the electric-field relaxation region may include a step of forming a second conductivity type region while implanting second conductivity type impurity ions into a predetermined part of the first conductivity type layer when each of the first conductivity type layers is grown and forming the second conductivity type impurity region by sequentially stacking the second conductivity type regions together in association with growth of the first conductivity type layer.

In the semiconductor device manufacturing method according to a preferred embodiment of the present invention, the step of forming the semiconductor layer may include a step of forming the semiconductor layer according to a multistage epitaxial method in which a first conductivity type layer is epitaxially grown repeatedly a plurality of times, and the step of forming the electric-field relaxation region may include a step of forming a first substance region while radiating a first substance that includes at least one among protons, helium ions, and electron rays onto a predetermined part of the first conductivity type layer when each of the first conductivity type layers is grown and forming the high-resistance region by sequentially stacking the first substance regions together in association with growth of the first conductivity type layer.

In the semiconductor device manufacturing method according to a preferred embodiment of the present invention, the step of forming the electric-field relaxation region may include a step of forming a through-hole that reaches the substrate from the front surface of the semiconductor layer after forming the semiconductor layer and a step of forming the second conductivity type impurity region by backfilling the through-hole with a second conductivity type semiconductor layer by means of epitaxial growth.

In the semiconductor device manufacturing method according to a preferred embodiment of the present invention, the step of forming the electric-field relaxation region may include a step of forming a concave portion from the front surface of the semiconductor layer after forming the semiconductor layer and a step of forming the second conductivity type impurity region that is along an inner surface of the concave portion and whose bottom portion reaches the substrate by implanting second conductivity type impurity ions into the inner surface of the concave portion.

In the semiconductor device manufacturing method according to a preferred embodiment of the present invention, the step of forming the electric-field relaxation region may include a step of forming a concave portion from the front surface of the semiconductor layer after forming the semiconductor layer and a step of forming the high-resistance region that is along an inner surface of the concave portion and whose bottom portion reaches the substrate by radiating a first substance that includes at least one among protons, helium ions, and electron rays onto the inner surface of the concave portion.

The semiconductor device manufacturing method according to a preferred embodiment of the present invention may further include a step of filling the concave portion with a conductive material.

In the semiconductor device manufacturing method according to a preferred embodiment of the present invention, the step of forming the semiconductor layer may include a step of forming a first semiconductor layer on the substrate and a step of forming a second semiconductor layer on the first semiconductor layer, and the semiconductor device manufacturing method may further include a step of forming a second electric-field relaxation region that is either a high-resistance region having higher resistance than the semiconductor layer or a second conductivity type impurity region at the first semiconductor layer before forming the second semiconductor layer.

In the semiconductor device manufacturing method according to a preferred embodiment of the present invention, the step of removing the substrate may include a step of removing a part of the semiconductor layer in addition to the substrate until the second electric-field relaxation region is exposed from the rear surface of the semiconductor layer.

A semiconductor device according to a preferred embodiment of the present invention includes a first conductivity type semiconductor layer that has a front surface, a rear surface on an opposite side of the front surface, and an end surface and that is formed so that the end surface includes a part that faces a side of the rear surface in a thickness direction of the semiconductor layer, a circuit element formed at a front-surface portion of the semiconductor layer, a first electrode that is joined to the semiconductor layer in the rear surface of the semiconductor layer, and an electric-field relaxation region that is formed at least along the end surface and that is either a high-resistance region having higher resistance than the semiconductor layer or a second conductivity type impurity region.

This semiconductor device can be manufactured according to a semiconductor device manufacturing method that includes, for example, a step of forming a first conductivity type semiconductor layer on a substrate, a step of forming a circuit element at a front-surface portion on a side opposite to the substrate of the semiconductor layer, a step of exposing the rear surface of the semiconductor layer by removing the substrate, a step of forming a groove surrounded by an end surface facing a side of the rear surface in a thickness direction of the semiconductor layer by selectively etching the semiconductor layer from the side of the rear surface, a step of forming an electric-field relaxation region along the end surface either by implanting second conductivity type impurity ions or by radiating a first substance including at least one among protons, helium ions, and electron rays onto the end surface of the groove, and a step of forming a first electrode so as to cover at least one part of both the rear surface of the semiconductor layer and the electric-field relaxation region.

According to this method, the end surface is formed so as to be allowed to face the rear-surface side of the semiconductor layer by means of etching. It is possible to form the electric-field relaxation region by means of ion implantation or the like into the end surface as above, and therefore it is possible to easily form the electric-field relaxation region with lower energy than in a case in which the electric-field relaxation region ranging from the front surface to the rear surface of the semiconductor layer is formed by ion implantation or the like.

In the semiconductor device according to a preferred embodiment of the present invention, the semiconductor layer may have an upper surface end that is an end edge on a side of the front surface in the end surface and a bottom surface end that is an end edge on a side of the rear surface in the end surface and that is placed at a more inward position than the upper surface end in a cross-sectional view, and a linear phantom line segment that connects the upper surface end and the bottom surface end together may be tilted at an angle that exceeds 90° with respect to the rear surface of the semiconductor layer.

In the semiconductor device according to a preferred embodiment of the present invention, the electric-field relaxation region may be formed with a substantially constant width in a cross-sectional view along at least one part of the end surface.

In the semiconductor device manufacturing method according to a preferred embodiment of the present invention, the step of forming the groove may include a step of forming the groove by performing etching from the rear surface to a midway point in the thickness direction of the semiconductor layer, and the semiconductor device manufacturing method may further include a step of cutting the semiconductor layer along a dicing line that is set along the groove after forming the first electrode.

BRIEF DESCRIPTION OF THE DRAWINGS

FIG. 4 is a view showing a planar pattern of an electric-field relaxation region of FIG. 3.

FIG. 5A is a view showing a part of a manufacturing process of the semiconductor device of FIG. 3.

FIG. 5D is a view showing a step subsequent to the step of FIG. 5C.

FIG. 5F is a view showing a step subsequent to the step of FIG. 5E.

FIG. 6A is a view showing a part of another manufacturing process of the semiconductor device of FIG. 3.

FIG. 6B is a view showing a step subsequent to the step of FIG. 6A.

FIG. 6C is a view showing a step subsequent to the step of FIG. 6B.

FIG. 6D is a view showing a step subsequent to the step of FIG. 6C.

FIG. 9A is a view showing a part of another manufacturing process of the semiconductor device of FIG. 8.

FIG. 16A is a view showing a part of a manufacturing process of the semiconductor device of FIG. 15.

FIG. 16C is a view showing a step subsequent to the step of FIG. 16B.

FIG. 16E is a view showing a step subsequent to the step of FIG. 16D.

FIG. 22 is a view showing a bottom pattern of the second electric-field relaxation region of FIG. 19.

FIG. 23B is a view showing a step subsequent to the step of FIG. 23A.

FIG. 23F is a view showing a step subsequent to the step of FIG. 23E.

FIG. 27E is a view to describe a positional relationship between an electric-field relaxation region and a drain electrode in the semiconductor device of FIG. 24.

FIG. 34 is a cross-sectional view showing another form of the semiconductor device.

DESCRIPTION OF EMBODIMENTS

Preferred embodiments of the present invention will be hereinafter described in detail with reference to the accompanying drawings.

Figure 1:
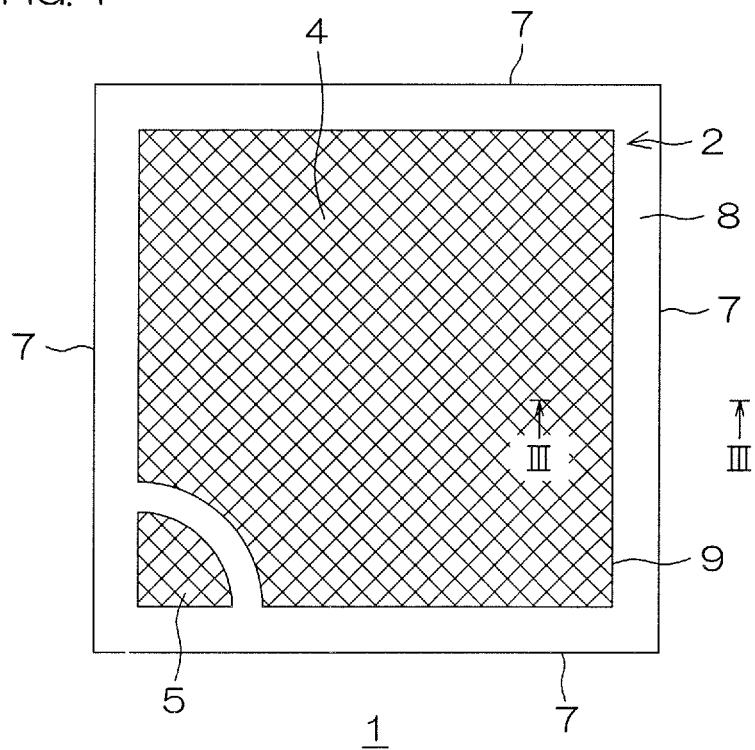
FIG. 1 is a schematic plan view of a semiconductor device according to a preferred embodiment of the present invention.
Figure 2:
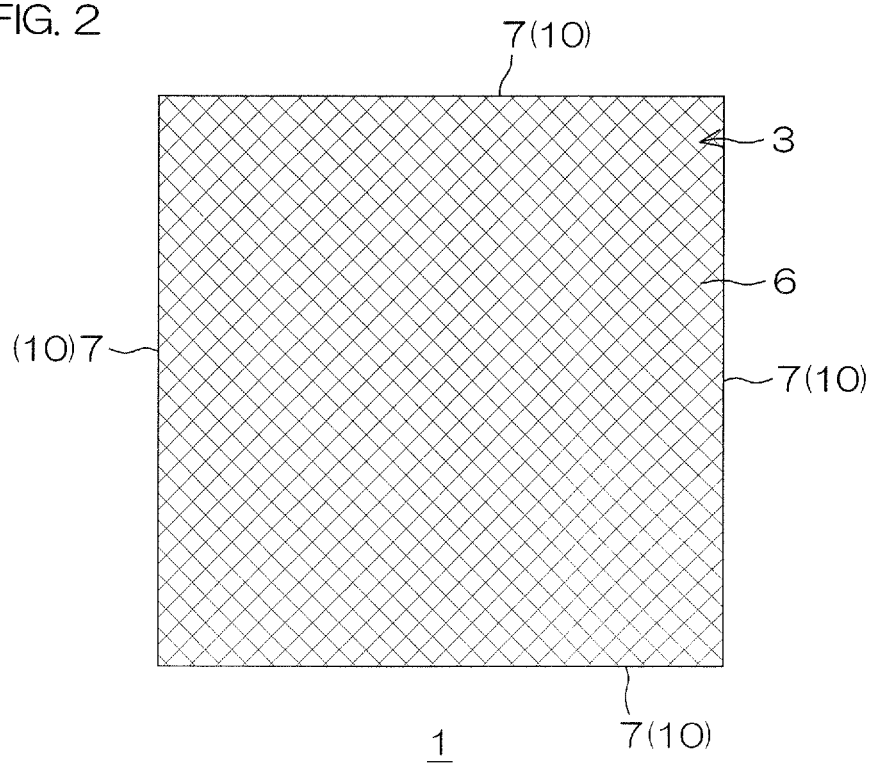
FIG. 2 is a schematic bottom view of the semiconductor device according to the preferred embodiment of the present invention.

FIG. 1 and FIG. 2 are a plan view and a bottom view, respectively, of a semiconductor device 1 according to a preferred embodiment of the present invention.

The semiconductor device 1 has a source electrode 4, which serves as an example of a second electrode of the present invention, and a gate pad 5 on its front-surface-2 side, and has a drain electrode 6, which serves as an example of a first electrode of the present invention, on its rear-surface-3 side.

The source electrode 4 is formed in a substantially quadrangular shape in a substantially whole area of a front surface 2, and has a peripheral edge 9 inwardly away from an end surface 7 of the semiconductor device 1. The peripheral edge 9 is provided with a surface termination structure, such as a guard ring, which is described later. As a result, a semiconductor region 8 is exposed to the front surface 2 of the semiconductor device 1 around the source electrode 4. In the present preferred embodiment, the semiconductor region 8 surrounding the source electrode 4 is exposed. The gate pad 5 is disposed apart from the source electrode 4 in one corner portion of the source electrode 4, and is connected to a gate electrode 26 of each MIS transistor structure 22 described later.

The drain electrode 6 is formed in a quadrangular shape in the whole area of the rear surface 3, and has a peripheral edge 10 that coincides with the end surface 7 of the semiconductor device 1 (i.e., that is continuous with the end surface 7). It should be noted that, although an electric-field relaxation region 14 is formed in the semiconductor device 1 as described later, this is not shown in FIG. 1 and FIG. 2.

Figure 3:
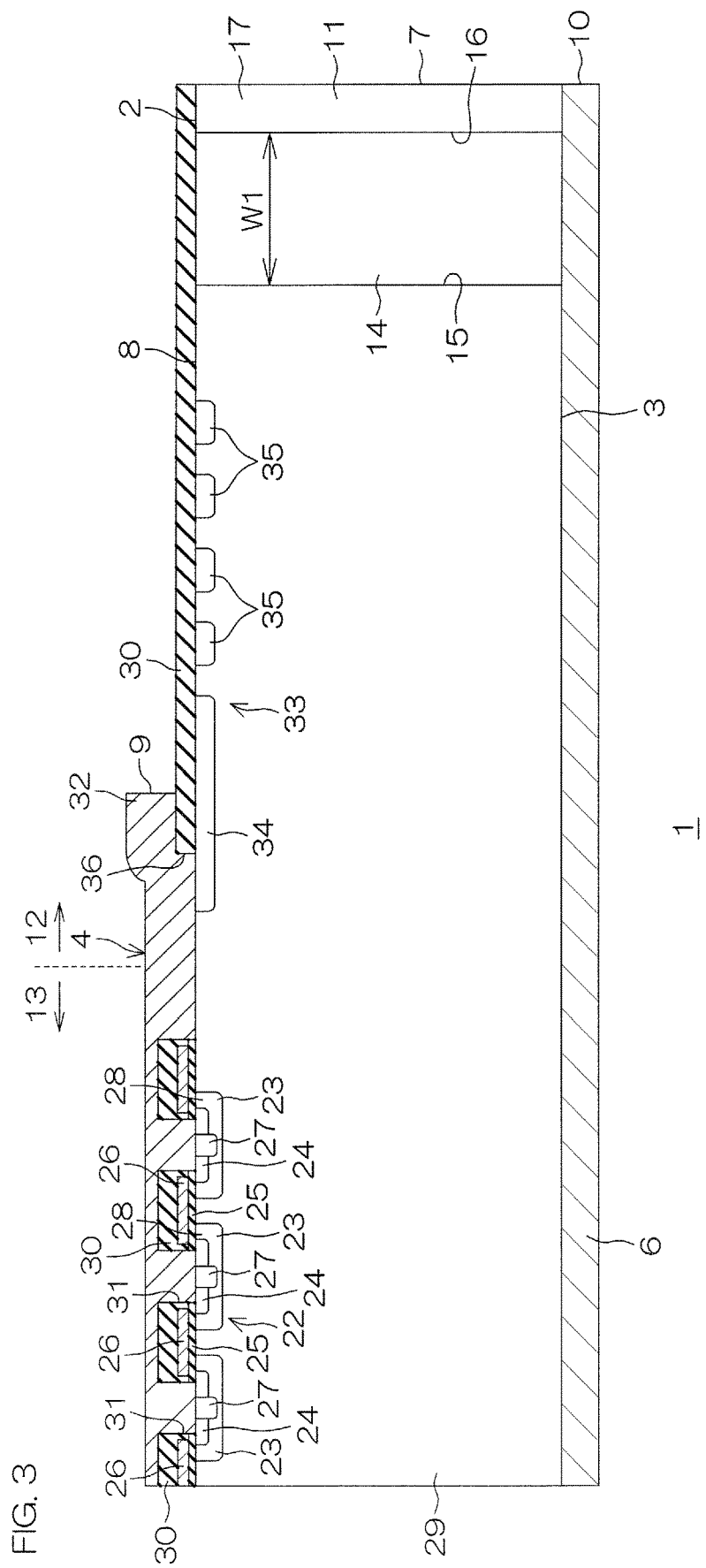
FIG. 3 is a cross-sectional view that appears when the semiconductor device is cut along line of FIG. 1.

FIG. 3 is a cross-sectional view that appears when the semiconductor device is cut along line of FIG. 1. FIG. 4 is a view showing a planar pattern of an electric-field relaxation region 14 of FIG. 3.

The semiconductor device 1 includes a semiconductor layer 11 made of n⁻ type SiC. The semiconductor layer 11 has the front surface 2 that is a Si plane of SiC, the rear surface 3 that is disposed on the side opposite to the front surface 2 and that is a C plane of SiC, and the end surface 7 that extends in a direction intersecting with the front surface 2 (i.e., that extends in a perpendicular direction in FIG. 3). The front surface 2 may be a plane except the Si plane of SiC, and the rear surface 3 may be a plane except the C plane of SiC.

The semiconductor layer 11 has a thickness of 5 μm to 300 μm in accordance with a desirable withstand voltage. Additionally, the semiconductor layer 11 has a substantially uniform impurity concentration as a whole, and has an impurity concentration of, for example, $1 \times 10^{14}$ cm⁻³ to $1 \times 10^{17}$ cm⁻³. The wording "the semiconductor layer 11 has a substantially uniform impurity concentration" mentioned here denotes that the semiconductor layer 11 does not have an n type part having a comparatively high impurity concentration (for example, an n⁺ type part) in its rear-surface portion (for example, in a region having a predetermined distance from the rear surface 3 in a thickness direction).

The semiconductor layer 11 includes an outer peripheral region 12 that is an example of a peripheral region of the present invention set at its peripheral edge portion (i.e., a part close to the end surface 7) and an active region 13 surrounded by the outer peripheral region 12.

In the active region 13, a plurality of MIS transistor structures 22 are formed at a front-surface portion of the semiconductor layer 11. The MIS transistor structure 22 includes a p type body region 23, an n⁺ type source region 24, a gate insulating film 25, a gate electrode 26, and a p⁺ type body contact region 27.

More specifically, a plurality of p type body regions 23 are formed at the front-surface portion of the semiconductor layer 11. Each p type body region 23 forms a minimum unit (unit cell) through which an electric current flows in the active region 13. The n⁺ type source region 24 is formed in an inner region of each p type body region 23 so as to be exposed to the front surface 2 of the semiconductor layer 11. In the p type body region 23, a region outside the n⁺ type source region 24 (i.e., a region surrounding the n⁺ type source region 24) defines a channel region 28. The gate electrode 26 straddles between adjoining unit cells, and faces the channel region 28 with the gate insulating film 25 therebetween. The p⁺ type body contact region 27 passes through the n⁺ type source region 24, and is electrically connected to the p type body region 23.

Each element of the MIS transistor structure 22 will be described. The impurity concentration of the p type body region 23 is, for example, $1 \times 10^{16}$ cm⁻³ to $1 \times 10^{19}$ cm⁻³, and the impurity concentration of the n⁺ type source region 24 is, for example, $1 \times 10^{19}$ cm⁻³ to $1 \times 10^{21}$ cm⁻³, and the impurity concentration of the p⁺ type body contact region 27 is, for example, $1 \times 10^{16}$ cm⁻³ to $1 \times 10^{21}$ cm⁻³. The gate insulating film 25 is made of, for example, silicon oxide (SiO₂), and its thickness is 20 nm to 100 nm. The gate electrode 26 is made of, for example, polysilicon.

An n⁻ type region on the rear-surface-3 side with respect to the MIS transistor structure 22 in the semiconductor layer 11 is provided as an n⁻ type drift region 29, and is exposed to the rear surface 3 of the semiconductor layer 11.

An interlayer insulating film 30 that straddles between the active region 13 and the outer peripheral region 12 is formed on the front-surface-2 side of the semiconductor layer 11. The interlayer insulating film 30 is made of, for example, of silicon oxide (SiO₂), and its thickness is 0.5 μm to 3.0 μm. The interlayer insulating film 30 has a contact hole 31 formed to expose the n⁺ type source region 24 and the p⁺ type body contact region 27 of each unit cell.

The source electrode 4 is formed on the interlayer insulating film 30. The source electrode 4 enters each contact hole 31, and makes ohmic contact with the n⁺ type source region 24 and with the p⁺ type body contact region 27. The source electrode 4 has an overlap portion 32 that extends from the active region 13 to the outer peripheral region 12 and that rides on the interlayer insulating film 30 in the outer peripheral region 12.

A surface termination structure 33 is formed at the front-surface portion of the semiconductor layer 11 in the outer peripheral region 12. The surface termination structure 33 may consist of a plurality of parts that include at least one part lying on a peripheral edge portion of the source electrode 4 (i.e., a peripheral edge of a junction with the semiconductor layer 11).

In FIG. 3, an innermost resurf layer 34 (RESURF: Reduced Surface Field) and a plurality of guard ring layers 35 surrounding the resurf layer 34 are included. The resurf layer 34 is formed so as to straddle between the inside and the outside of an opening 36 of the interlayer insulating film 30, and is in contact with the peripheral edge portion of the source electrode 4 inside the opening 36. The plurality of guard ring layers 35 are mutually spaced out. Although the resurf layer 34 and the guard ring layer 35 are formed by the p type impurity region, these layers may be formed by a high-resistance region. If so, the resurf layer 34 and the guard ring layer 35 may have a crystal defect concentration of $1 \times 10^{14}$ cm⁻³ to $1 \times 10"$cm⁻³.

In the outer peripheral region 12, the electric-field relaxation region 14 is formed outside the surface termination structure 33. The electric-field relaxation region 14 is a high-resistance region that has higher resistance than the semiconductor layer 11 (the n⁻ type drift region 29) or is a p type semiconductor region. For example, if the electric-field relaxation region 14 is a high-resistance region, this high-resistance region has a crystal defect concentration of $1 \times 10^{14}$ cm⁻³ to $1 \times 10^{22}$ cm⁻³. On the other hand, if the electric-field relaxation region 14 is a p type semiconductor region, this p type semiconductor region has an impurity concentration of $1 \times 10^{18}$ cm⁻³ to $1 \times 10^{22}$ cm⁻³. If the impurity concentration falls within this range, it is possible to easily keep the whole of the p type semiconductor region at the same electric potential.

The electric-field relaxation region 14 is a fixed region that reaches from the front surface 2 to the rear surface 3 of the semiconductor layer 11. In the present preferred embodiment, the electric-field relaxation region 14 is formed so that an inner surface 15 closer to the active region 13 and an outer surface 16 opposite thereto become perpendicular to the front surface 2 and to the rear surface 3 in the cross sectional view shown in FIG. 3. This enables the width W1 of the electric-field relaxation region 14 to become substantially constant from the front surface 2 to the rear surface 3 of the semiconductor layer 11.

Additionally, in the present preferred embodiment, the electric-field relaxation region 14 is formed inwardly away from the end surface 7 of the semiconductor layer 11, and, as a result, an n⁻ type peripheral region 17 that is an example of a peripheral impurity region of the present invention consisting of a part of the semiconductor layer 11 is formed outside the electric-field relaxation region 14 (i.e., between the electric-field relaxation region 14 and the end surface 7 of the semiconductor layer 11). In the present preferred embodiment, the electric-field relaxation region 14 having an annular shape in a plan view is formed so as to create an enclosed space by surrounding the n⁻ type drift region 29 as shown in FIG. 4, and an annular region reaching to the end surface 7 placed outside the electric-field relaxation region 14 is formed as the n⁻ type peripheral region 17.

The drain electrode 6 is formed on the rear surface 3 of the semiconductor layer 11. The drain electrode 6 is formed on the entirety of the rear surface 3 of the semiconductor layer 11 as an integrally-formed element. As a result, the drain electrode 6 comes into contact with the n⁻ type drift region 29, with the electric-field relaxation region 14, and with the n⁻ type peripheral region 17 in the rear surface 3 of the semiconductor layer 11. The drain electrode 6 is made of a metal (for example, a layered structure consisting of Ti/Al) that is capable of forming a Schottky junction with the n⁻ type drift region 29. In detail, it is preferable to allow a layer (for example, Ti layer) that is in contact with the n⁻ type drift region 29 in the drain electrode 6 to form a Schottky junction with the n⁻ type drift region 29. In the present preferred embodiment, the drain electrode 6 is in contact also with the n⁻ type peripheral region 17, and forms a Schottky junction with the n⁻ type peripheral regions 17.

Next, a method for manufacturing the semiconductor device 1 will be described with reference to FIG. 5A to FIG. 5F.

To manufacture the semiconductor device 1, the semiconductor layer 11 that is lower in concentration than the base substrate 18 is first formed by epitaxial growth on the base substrate 18 (wafer) made of n⁺ type SiC (whose impurity concentration is, for example, $1 \times 10^{18}$ cm⁻³ to $1 \times 10^{20}$ cm⁻³) as shown in FIG. 5A. The thickness of the base substrate 18 may be, for example, 250 μm to 450 μm.

Figure 5B:
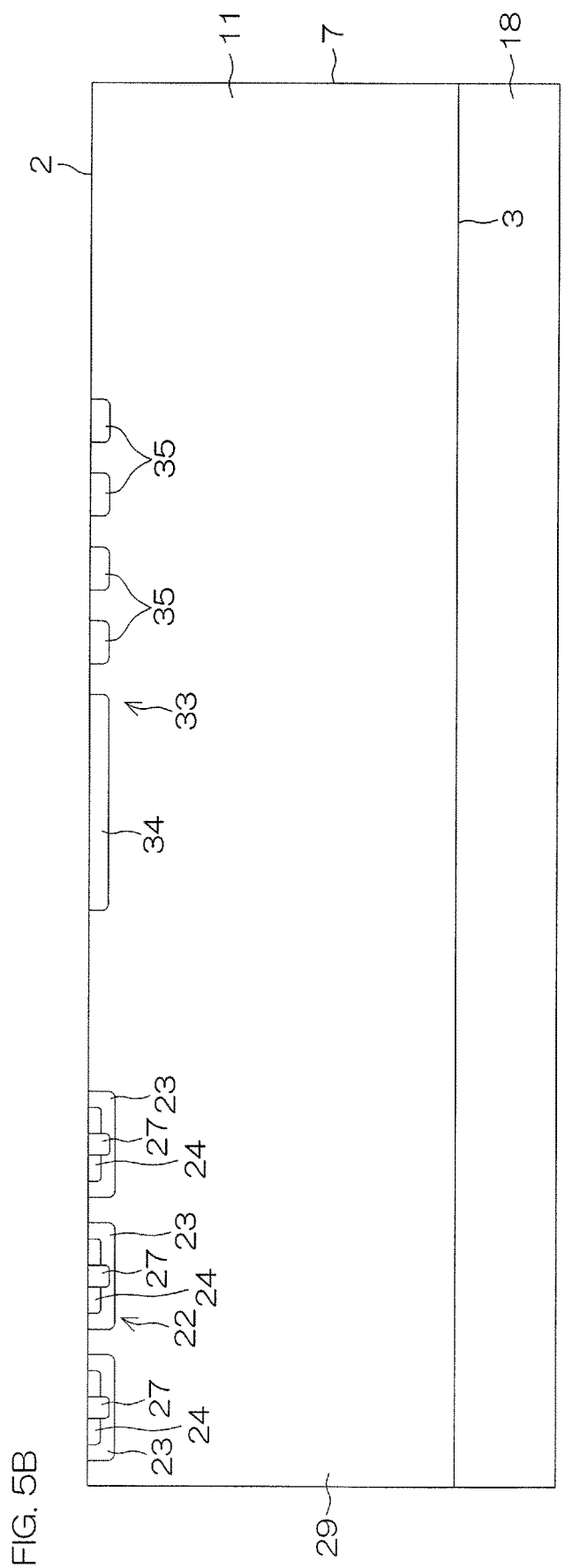
FIG. 5B is a view showing a step subsequent to the step of FIG. 5A.
Figure 5C:
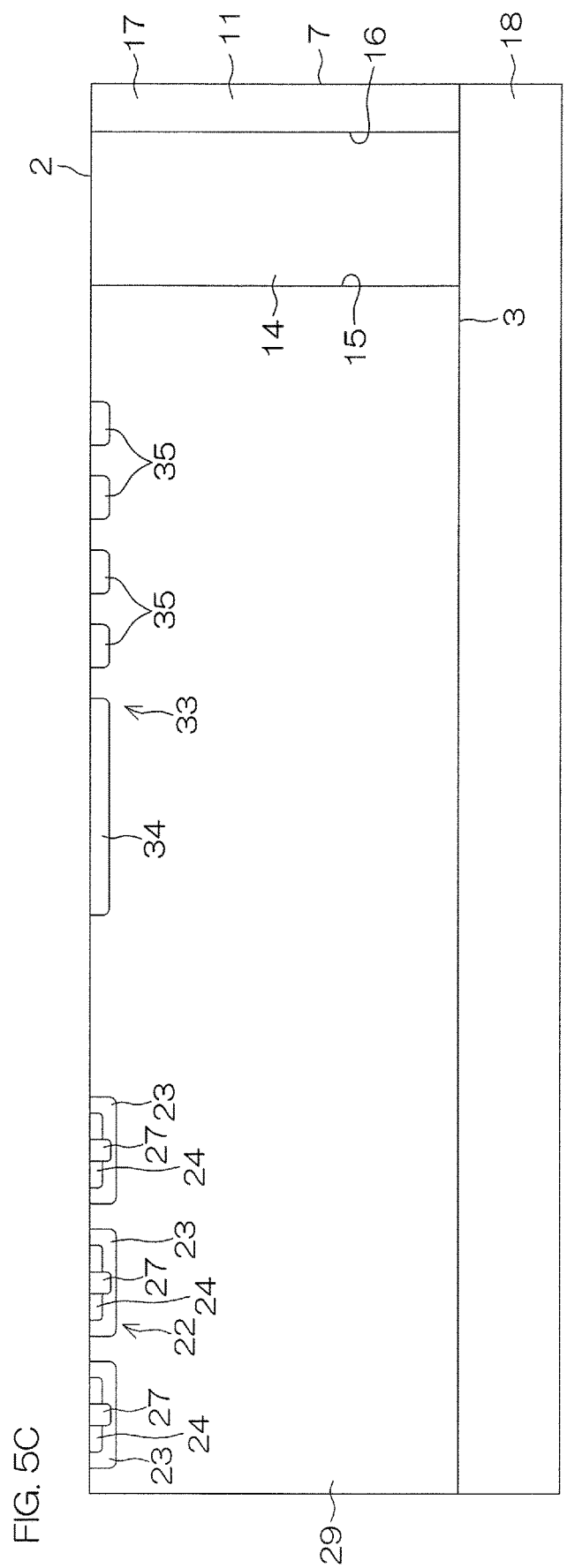
FIG. 5C is a view showing a step subsequent to the step of FIG. 5B.

Thereafter, an impurity region of the MIS transistor structure 22, the surface termination structure 33, and the electric-field relaxation region 14 are formed as shown in FIG. 5B and FIG. 5C.

Specifically, a description will be individually given according to whether the electric-field relaxation region 14 is a p type semiconductor region or is a high-resistance region.

If the electric-field relaxation region 14 is a p type semiconductor region, impurity ions are first implanted selectively from the front-surface-2 side of the semiconductor layer 11 into regions in which impurity regions of the MIS transistor structure 22 (in detail, the p type body region 23, the n⁺ type source region 24, and the p⁺ type body contact region 27) and the surface termination structure 33 (in detail, the resurf layer 34 and the guard ring layer 35) are to be formed.

Thereafter, p type impurity ions (e.g., B ions or Al ions) are implanted selectively from the front-surface-2 side of the semiconductor layer 11 into the regions in which the electric-field relaxation region 14 is to be formed. At this time, the electric-field relaxation region 14 is required to be formed so as to pass through an area from the front surface 2 of the semiconductor layer 11 to the rear surface 3 and so as to reach the base substrate 18, and therefore p type impurity ions are implanted with implantation energy of, for example, 1 MeV to 10 MeV.

After the implantation, each of the impurity ions to form the impurity regions of the MIS transistor structure 22, the surface termination structure 33, and the electric-field relaxation region 14 is simultaneously activated by performing annealing treatment (for example, 1500° C. to 1800° C.), and these regions are formed.

On the other hand, if the electric-field relaxation region 14 is a high-resistance region, impurity ions are first implanted selectively from the front-surface-2 side of the semiconductor layer 11 into regions in which impurity regions of the MIS transistor structure 22 (in detail, the p type body region 23, the n⁺ type source region 24, and the p⁺ type body contact region 27) and the surface termination structure 33 (in detail, the resurf layer 34 and the guard ring layer 35) are to be formed.

After the implantation, each of the impurity ions to form the impurity regions of the MIS transistor structure 22 and the surface termination structure 33 is activated by performing annealing treatment (for example, 1500° C. to 1800° C.), and these regions are formed.

Thereafter, a mask (not shown) is selectively formed on the semiconductor layer 11, and substances, such as protons, helium ions, electron rays each of which is an example of a first substance of the present invention and each of which is comparatively small in mass, are radiated onto the front surface 2 of the semiconductor layer 11 through the mask. After the radiation, annealing treatment (for example, 300° C. to 1200° C.) is performed, and, as a result, a crystal defect generated by the radiation particles is formed as the electric-field relaxation region 14 (high-resistance region). The annealing treatment of 300° C. to 1200° C. may be omitted.

Although there is a case in which annealing treatment is performed after implanting p type impurity ions or after radiating protons or the like even if the electric-field relaxation region 14 is either a p type semiconductor region or a high-resistance region, an element that is weak against a high temperature (for example, a metal such as the source electrode 4) has not yet been formed both on the front-surface-2 side of semiconductor layer 11 and on the rear-surface-3 side when that annealing treatment is performed, and therefore it is possible to perform annealing treatment at a comparatively high temperature. As a result, it is possible to efficiently form the electric-field relaxation region 14.

Thereafter, the gate insulating film 25 and the gate electrode 26 that are the remaining elements of the MIS transistor structure 22 are formed as shown in FIG. 5D. Thereafter, the interlayer insulating film 30 and the source electrode 4 are formed.

Figure 5E:
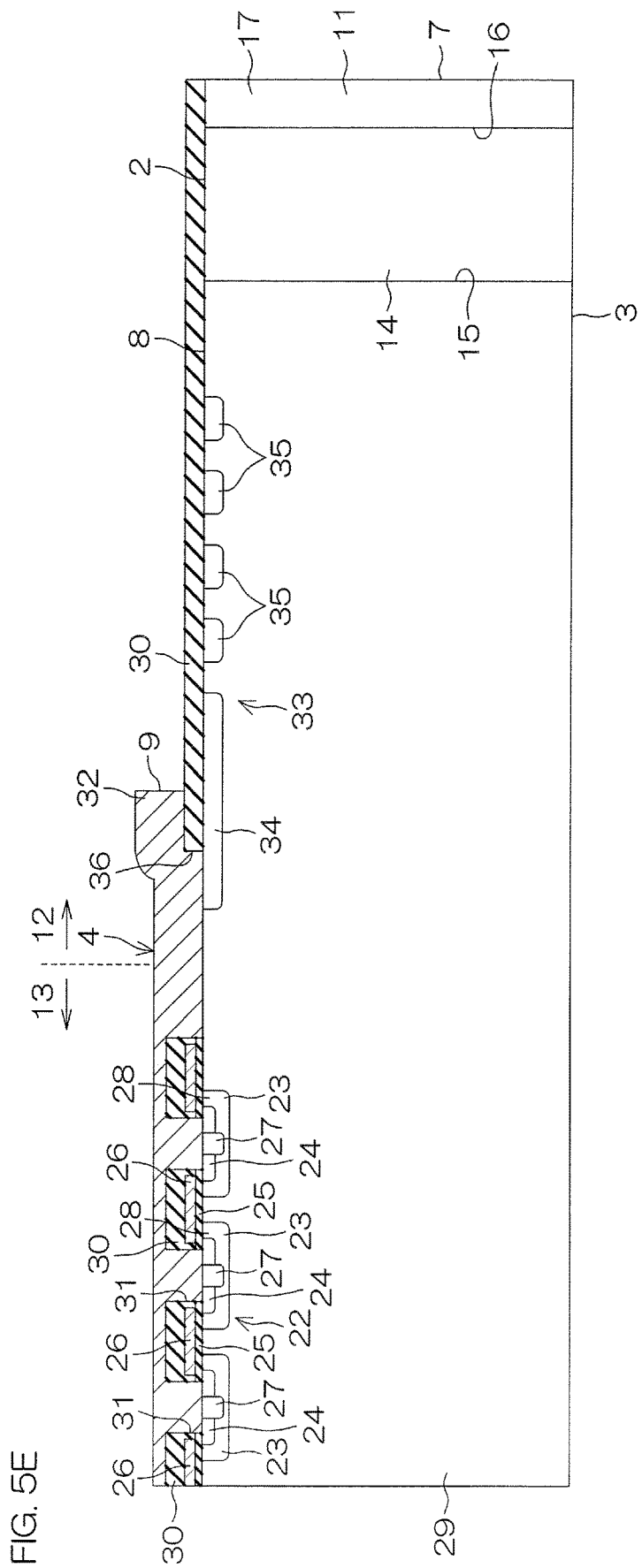
FIG. 5E is a view showing a step subsequent to the step of FIG. 5D.

Thereafter, the entirety of the rear surface 3 of the semiconductor layer 11 is exposed by removing the base substrate 18 as shown in FIG. 5E. This step may be finished, for example, by polishing (for example, CMP) after substantially completely removing the base substrate 18 by performing a grinding operation from the rear-surface-3 side. In the polishing step, the semiconductor layer 11 that has been exposed after completing the grinding operation may be further thinned. Specifically, the base substrate 18 having a thickness of 350 μm may be removed by grinding the rear surface, and then may polish the semiconductor layer 11 having a thickness of 50 μm so that the semiconductor layer 11 becomes 40 μm in thickness. The execution of the final polishing step makes it possible to smooth a surface state of the rear surface 3 of the exposed semiconductor layer 11, and therefore it is possible to allow the drain electrode 6 to excellently make a Schottky junction.

Thereafter, the drain electrode 6 (e.g., Ti/Al) is formed on the entirety of the rear surface 3 of the semiconductor layer 11 according to, for example, a sputtering method as shown in FIG. 5F. Thereafter, the semiconductor layer 11 is cut into pieces along a dicing line preset at a predetermined position. As a result, semiconductor devices 1 each of which is one of a plurality of individual pieces are obtained.

According to the aforementioned method, the electric-field relaxation region 14 is formed in a stable state in which the semiconductor layer 11 is mounted on the base substrate 18 as shown in FIG. 5C. In other words, there is no need to form the electric-field relaxation region 14 in a thin wafer state (for example, FIG. 5E) after removing the base substrate 18, and it is possible to prevent the wafer from being broken into pieces, for example, by making a handling mistake. Additionally, it is also possible to limit a step that is performed after removing the base substrate 18 and thinning the wafer only to the step of forming the drain electrode 6 shown in FIG. 5F, and therefore it is possible to reduce the number of handling times to handle the wafer that has been thinned, and it is possible to lessen a handling-mistake probability. From these results, it is possible to lessen the probability of occurrence of defective articles, and therefore it is possible to improve a yield in the manufacturing process.

Additionally, when the MIS transistor structure 22 is produced at the front-surface portion of the semiconductor layer 11 as shown in FIG. 5C, it is possible to form the electric-field relaxation region 14 by means of processing (ion implantation, proton radiation, etc.) from the front-surface-2 side of the semiconductor layer 11 in parallel with that production. Therefore, it is possible to make limitations on factors (temperature, chemical solution to be used, devices, etc.) that influence each element of the MIS transistor structure 22 smaller than in a case in which the electric-field relaxation region 14 is formed after producing the MIS transistor structure 22. As a result, it is possible to improve the efficiency of the manufacturing process.

Additionally, according to the semiconductor device 1 obtained as above, it is possible to block an electric current flowing through the inside of the semiconductor layer 11 in the thickness direction by the Schottky barrier of the Schottky junction between the semiconductor layer 11 and the drain electrode 6 when a reverse voltage is applied to the MIS transistor structure 22. Additionally, the electric-field relaxation region 14 is formed around the MIS transistor structure 22. Accordingly, even if a depletion layer spreads toward the end surface 7 (chip end surface) of the semiconductor layer 11 when a reverse voltage is applied, it is possible to stop the depletion layer by means of the electric-field relaxation region 14, and it is possible to prevent the depletion layer from reaching the end surface 7. As a result, it is possible to relax the electric field strength near the end surface 7 of the semiconductor layer 11. Therefore, even if a defective region exists at the end surface 7 of the semiconductor layer 11 because of dicing, it is also possible to prevent a leakage current from flowing because of the generation of electron-hole pairs in the defective region. From these results, it is possible to allow the semiconductor device 1 to secure an excellent reverse withstand voltage, and therefore it is possible to excellently use it as a reverse-blocking MISFET for bidirectional switches.

FIG. 6A to FIG. 6D are views, each showing a part of another manufacturing process of the semiconductor device 1. If the electric-field relaxation region 14 is a p type impurity region, it is possible to produce the electric-field relaxation region 14 also by performing the steps of FIG. 6A to FIG. 6D instead of the steps of FIG. 5A to FIG. 5C mentioned above.

For example, the semiconductor layer 11 that is lower in concentration than the base substrate 18 is first formed by epitaxial growth on the base substrate 18 (wafer) made of $n^+$ type SiC (whose impurity concentration is, for example, $1 \times 10^{18}$ cm$^{-3}$ to $1 \times 10^{20}$ cm$^{-3}$) as shown in FIG. 6A.

Thereafter, a mask (not shown) that selectively has an opening in a region in which the electric-field relaxation region 14 is to be formed is formed on the semiconductor layer 11, and the semiconductor layer 11 is selectively etched through the mask from the front-surface-2 side. This etching operation is continuously performed until it passes through the semiconductor layer 11 and reaches the base substrate 18. As a result, a through-hole 19 that reaches the base substrate 18 from the front surface 2 is formed in the semiconductor layer 11 as shown in FIG. 6B.

Thereafter, p type SiC is epitaxially grown in the through-hole 19, for example, while introducing p type impurity ions as shown in FIG. 6C. Accordingly, the through-hole 19 is backfilled with p type SiC, and, as a result, the electric-field relaxation region 14 made of this p type SiC is formed.

Thereafter, an impurity region of the MIS transistor structure 22 and the surface termination structure 33 are formed by selectively implanting impurity ions from the front-surface-2 side of the semiconductor layer 11 as shown in FIG. 6D. In detail, the p type body region 23, the $n^+$ type source region 24, the $p^+$ type body contact region 27, the resurf layer 34, and the guard ring layer 35 are formed.

Thereafter, the steps of FIG. 5D to FIG. 5F are performed, and, as a result, the aforementioned semiconductor device 1 (note that the electric-field relaxation region 14 is a p type impurity region) is obtained.

Next, another embodiment of the semiconductor device 1 according to the present preferred embodiment will be described with reference to the drawings.

Figure 7:
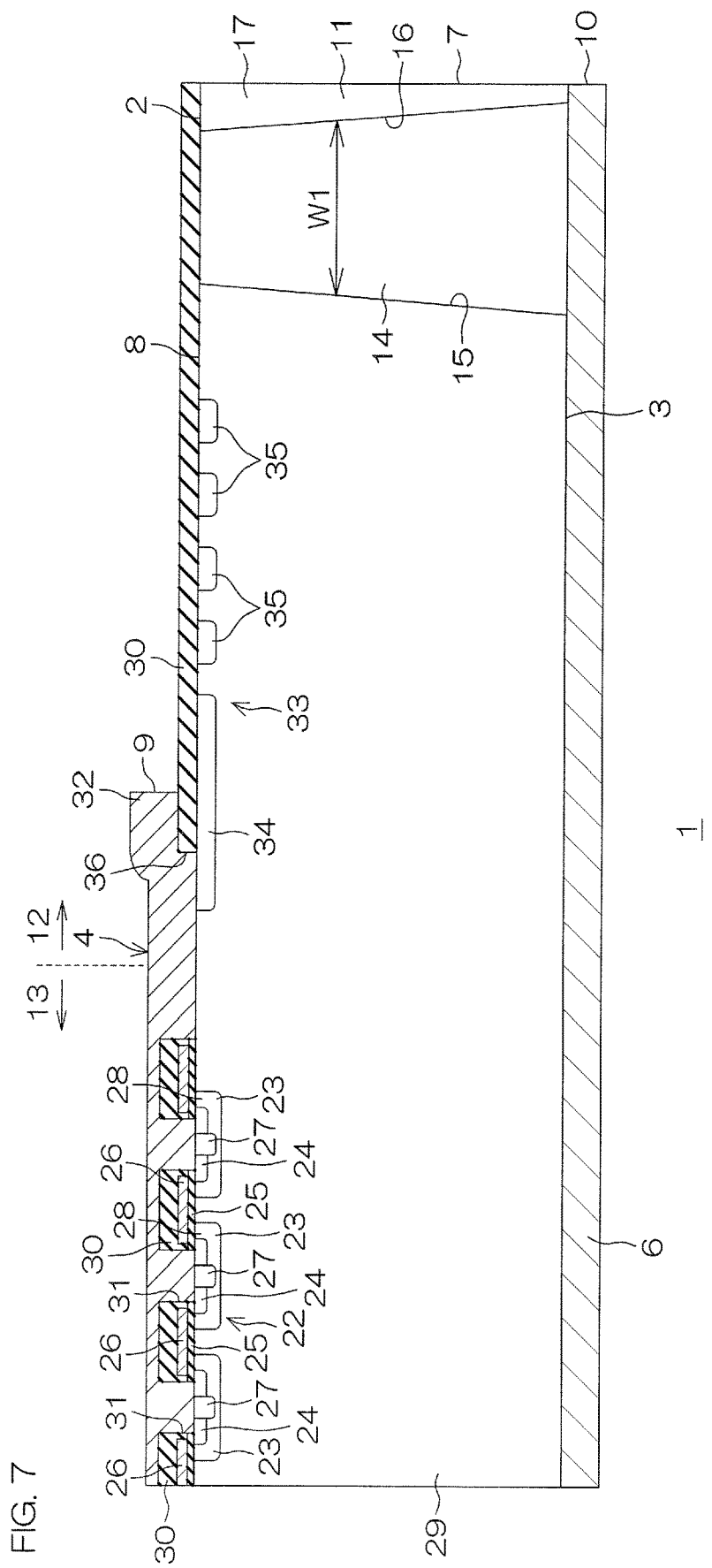
FIG. 7 is a schematic cross-sectional view of a semiconductor device according to another preferred embodiment of the present invention.

In FIG. 3, the electric-field relaxation region 14 was formed so that the inner surface 15 and the outer surface 16 become perpendicular to the front surface 2 and to the rear surface 3, and its width W1 was substantially constant from the front surface 2 to the rear surface 3 of the semiconductor layer 11. However, as shown in FIG. 7, the electric-field relaxation region 14 may be formed so that the inner surface 15 and the outer surface 16 is tilted with respect to the front surface 2 and the rear surface 3, and, as a result, may have a tapered shape in which its width W1 gradually becomes narrower from the rear surface 3 toward the front surface 2 in a cross sectional view.

Figure 8:
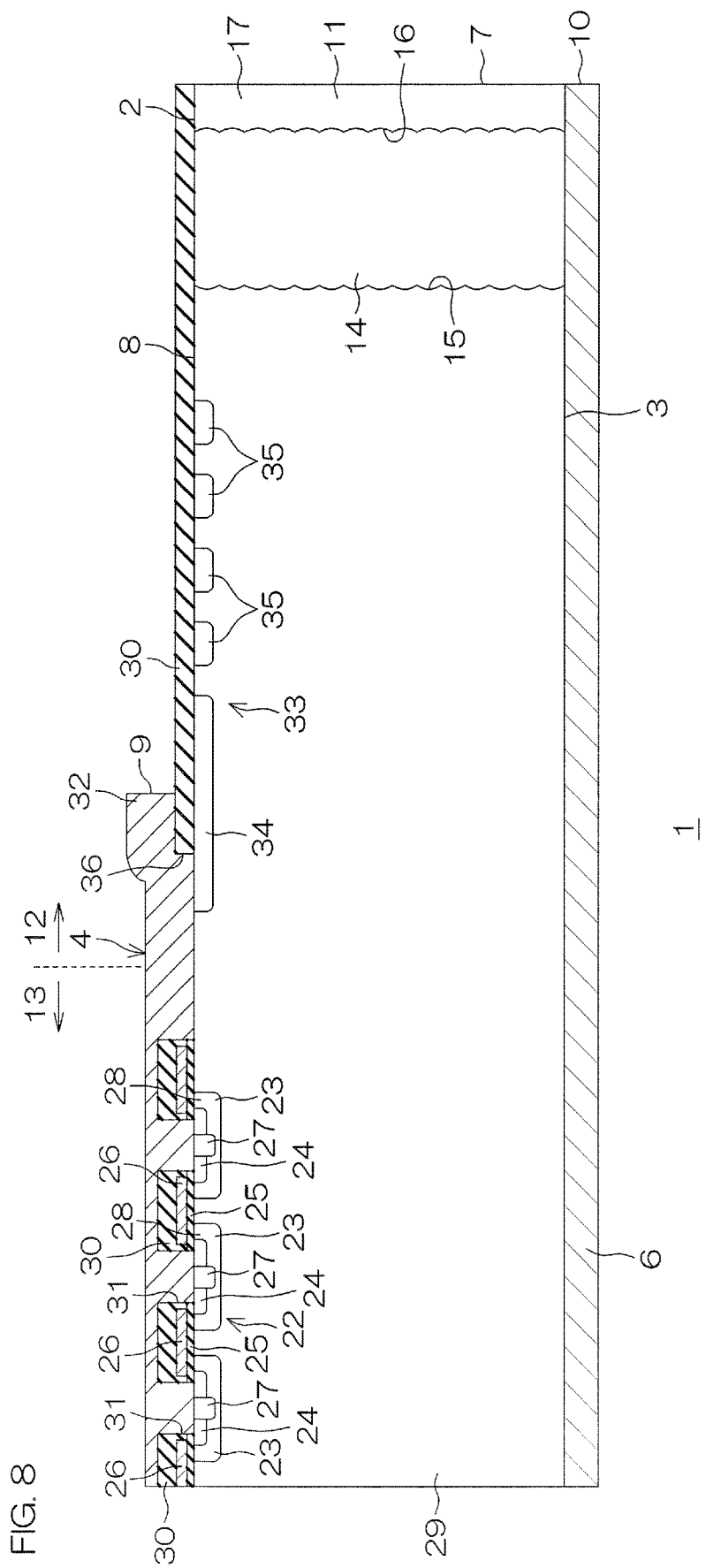
FIG. 8 is a schematic cross-sectional view of a semiconductor device according to another preferred embodiment of the present invention.

Additionally, the electric-field relaxation region 14 of FIG. 3 was formed by the implantation of ions, by the radiation of protons or the like, or by the backfill of the through-hole 19, and therefore the inner surface 15 and the outer surface 16 were substantially flatly formed in a cross sectional view. However, as shown in FIG. 8, the inner surface 15 and the outer surface 16 of the electric-field relaxation region 14 may be concave-convex surfaces, respectively, that regularly corrugate in the thickness direction of the semiconductor layer 11. A method for forming this configuration can be described with reference to FIG. 9A and FIG. 9B.

For example, the semiconductor layer 11 is first formed according to a multistage epitaxial method in which an $n^-$ type layer 20 is allowed to undergo epitaxial growth repeatedly a plurality of times on the base substrate 18 as shown in FIG. 9A. In this step, when each $n^-$ type layer 20 is grown, p type impurity ions, or protons, or the like are implanted into a predetermined part of the n⁻ type layer 20. Thereafter, a p type impurity region or a high-resistance region made of protons or the like is sequentially piled up in association with the fact that the n⁻ type layers 20 are stacked up together so as to reach a multilayered state. As a result, p type impurity regions or high-resistance regions of the adjoining n⁻ type layers 20 are mutually ranged, and the electric-field relaxation region 14 that has the inner surface 15 and the outer surface 16 that are concave-convex surfaces is formed. When the electric-field relaxation region 14 (high-resistance region) is formed by use of the multistage epitaxial method, there is no need to form the electric-field relaxation region 14 that reaches the rear surface 3 from the front surface 2 of the semiconductor layer 11 by emitting radiation once as described above, and it is merely necessary for protons or the like to spread through the entirety in the thickness direction of each n⁻ type layer 20, which is comparatively thin, in the individual implantation step. Therefore, it is possible to form the electric-field relaxation region 14 also by implanting boron (B) or argon (Ar) without being limited to light chemical elements, such as protons. If boron is implanted, whether the electric-field relaxation region 14 becomes a high-resistance region or a p type region depends on an anneal temperature. For example, the electric-field relaxation region 14 does not become a p type region by means of the annealing treatment of As-impla and 1200° C. or less, and the electric-field relaxation region 14 works as a high-resistance region. On the other hand, if the annealing treatment is performed at 1200° C. or more, boron atoms are activated, and the electric-field relaxation region 14 can work as a p type region. In order to further raise the activation rate as a p type, the annealing treatment is required to be performed at an even higher temperature (1500° C. or more).

Figure 9B:
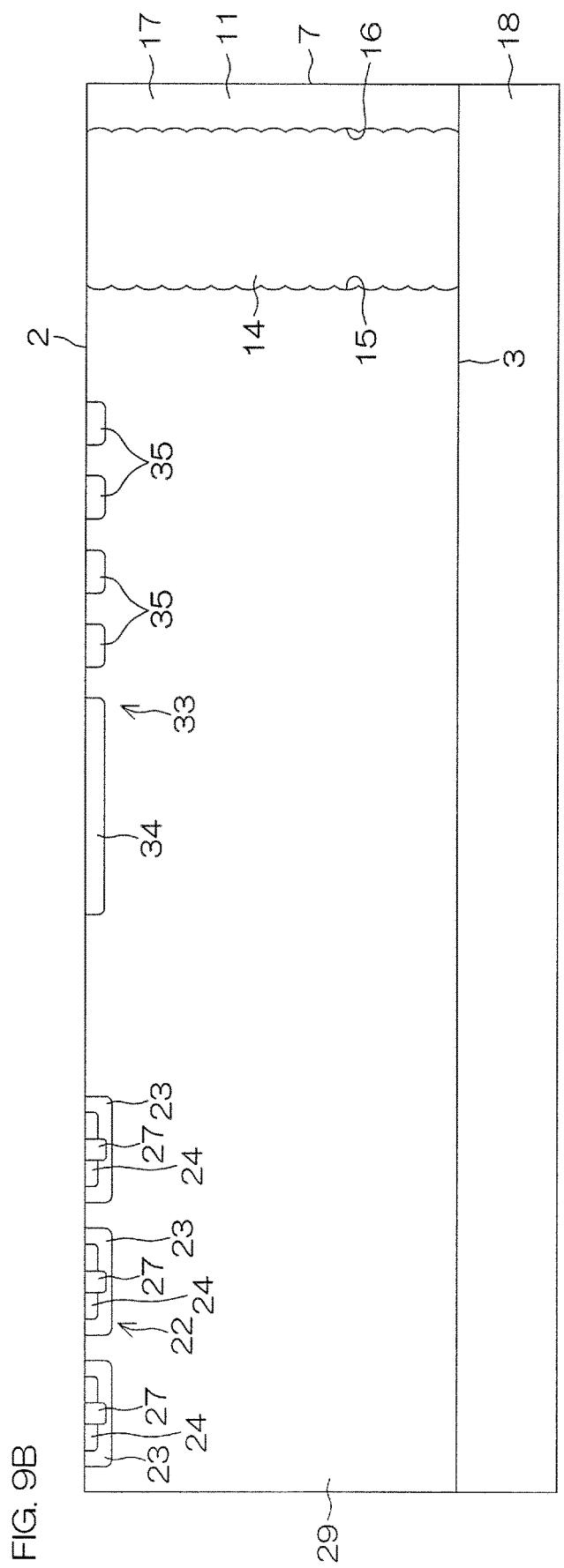
FIG. 9B is a view showing a step subsequent to the step of FIG. 9A.

Thereafter, an impurity region of the MIS transistor structure 22 and the surface termination structure 33 are formed by selectively implanting impurity ions from the front-surface-2 side of the semiconductor layer 11 as shown in FIG. 9B. In detail, the p type body region 23, the n⁺ type source region 24, the p⁺ type body contact region 27, the resurf layer 34, and the guard ring layer 35 are formed.

Thereafter, the steps of FIG. 5D to FIG. 5F are performed, and, as a result, the aforementioned semiconductor device 1 (note that the electric-field relaxation region 14 is a p type impurity region) is obtained.

Figure 10:
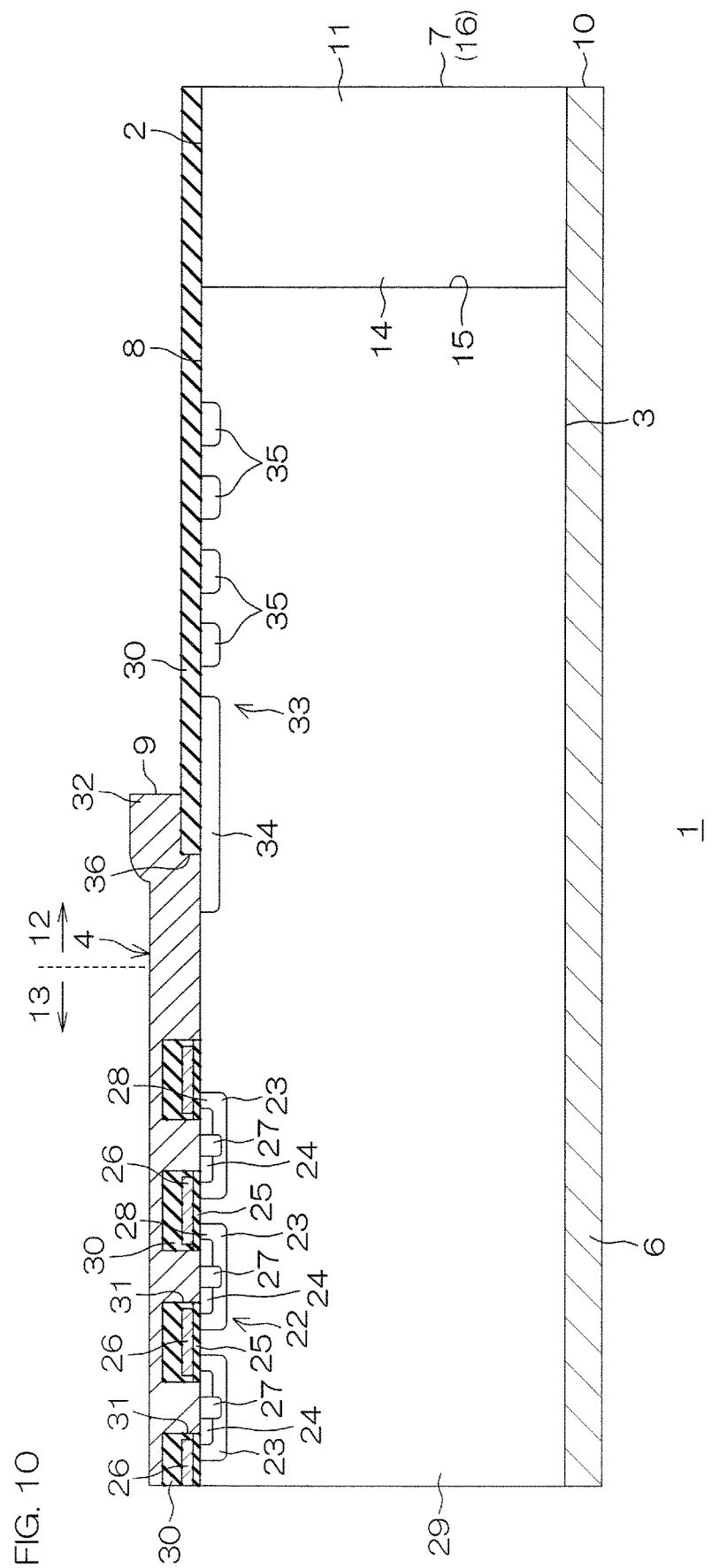
FIG. 10 is a schematic cross-sectional view of a semiconductor device according to another preferred embodiment of the present invention.
Figure 11:
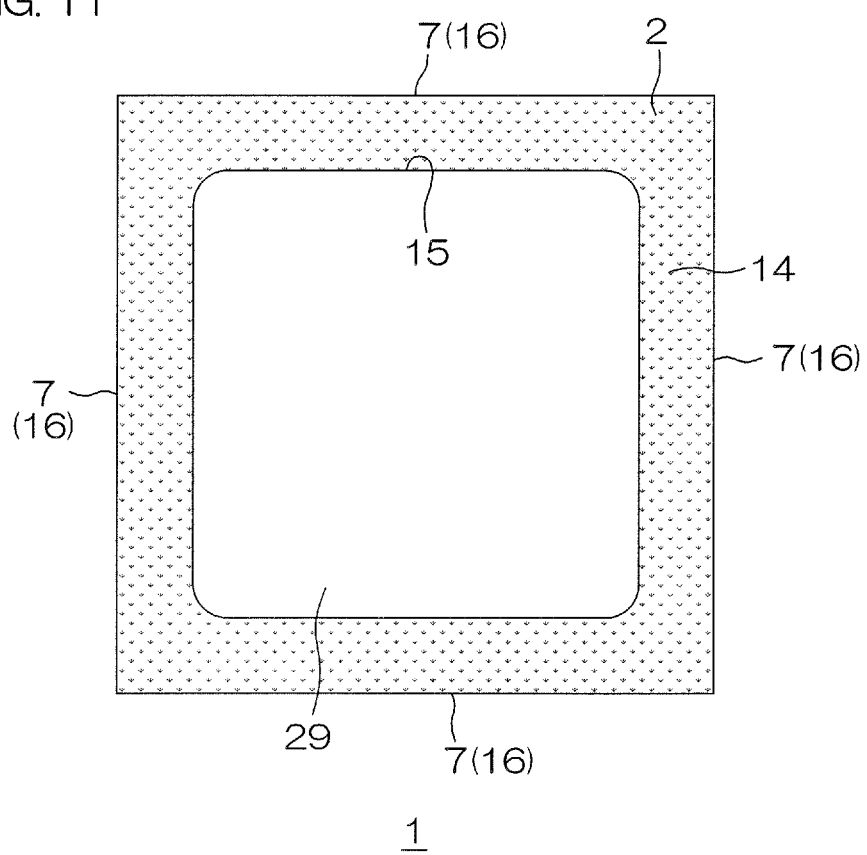
FIG. 11 is a view showing a planar pattern of an electric-field relaxation region of FIG. 10.

Additionally, although the electric-field relaxation region 14 of FIG. 3 was formed inwardly away from the end surface 7 of the semiconductor layer 11, the electric-field relaxation region 14 may be formed so as to reach the end surface 7 of the semiconductor layer 11 as shown in FIG. 10 and FIG. 11. As a result, the outer surface 16 of the electric-field relaxation region 14 becomes a surface that coincides with the end surface 7 of the semiconductor layer 11.

Figure 12:
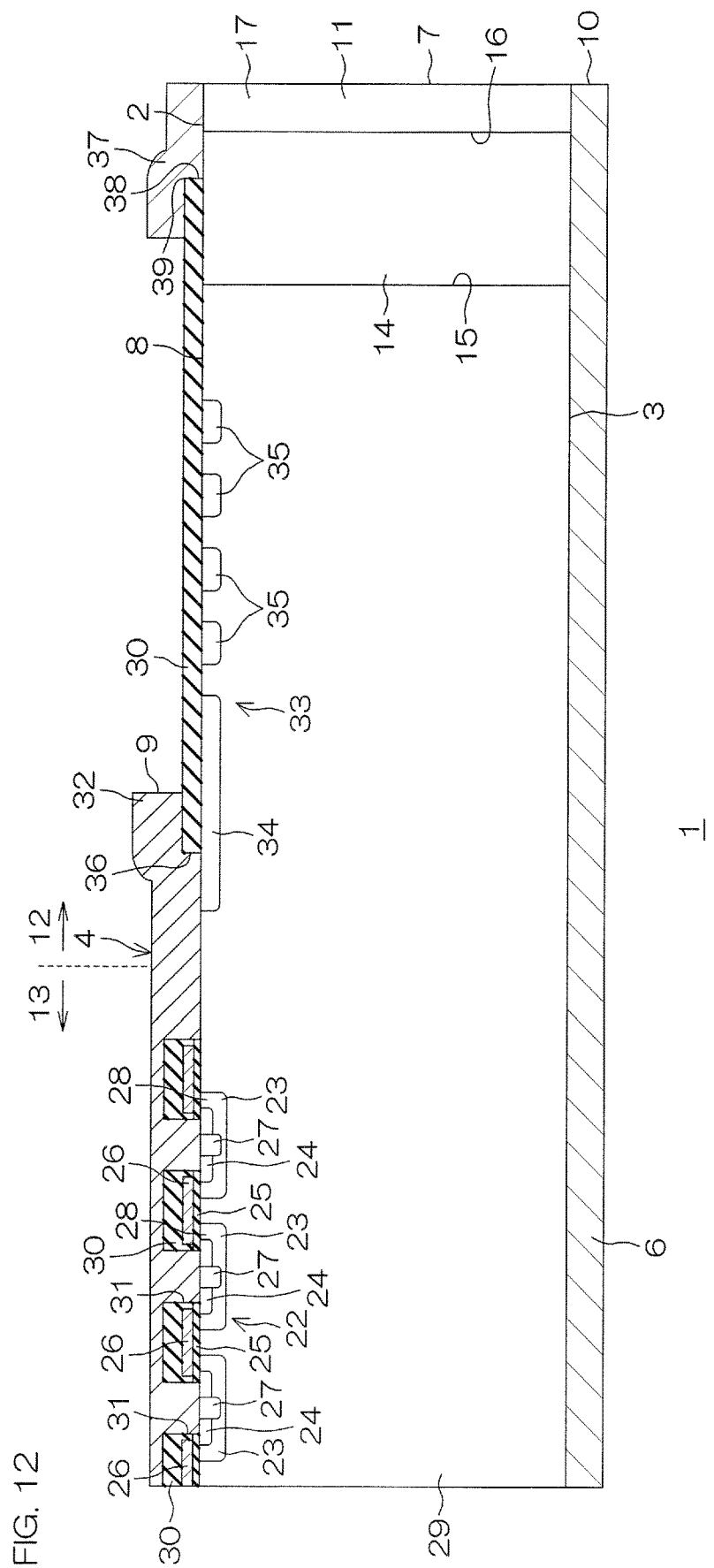
FIG. 12 is a schematic cross-sectional view of a semiconductor device according to another preferred embodiment of the present invention.
Figure 13:
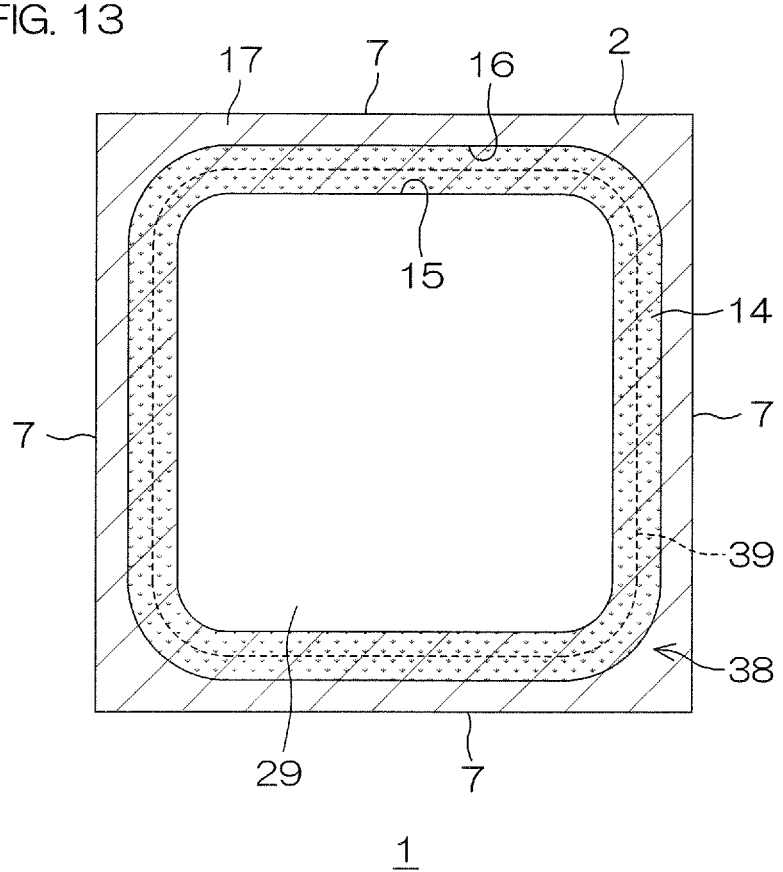
FIG. 13 is a view showing a planar pattern of both an electric-field relaxation region and a second drain electrode of FIG. 12.

Additionally, the semiconductor device 1 may include a second drain electrode 37 that is formed on the front-surface-2 side of the semiconductor layer 11 as shown in FIG. 12 and FIG. 13 and that is an example of an auxiliary electrode of the present invention disposed so as to be equal in electric potential to the drain electrode 6.

More specifically, in the semiconductor device 1 of FIGS. 12 and 13, a contact hole 38 by which the n⁻ type peripheral region 17 and the electric-field relaxation region 14 are exposed in an end of the semiconductor layer 11 is formed in the interlayer insulating film 30. The contact hole 38 has an annular inner peripheral edge 39 that surrounds the n⁻ type drift region 29 as shown in FIG. 13. Although the contact hole 38 is formed up to the end surface 7 of the semiconductor layer 11 so that the interlayer insulating film 30 does not remain near the end surface 7 of the semiconductor layer 11 in FIG. 12 and FIG. 13, the contact hole 38 may have an outer peripheral edge at a position inwardly distant from the end surface 7 so that a part of the interlayer insulating film 30 remains near the end surface 7.

The second drain electrode 37 enters the contact hole 38, and straddles a boundary between the n⁻ type peripheral region 17 and the electric-field relaxation region 14 in the contact hole 38, and is contiguous to both of the regions 14 and 17. Additionally, if the electric-field relaxation region 14 is formed up to the end surface 7 of the semiconductor layer 11 as described with reference to FIG. 10, the second drain electrode 37 may be in contact only with the electric-field relaxation region 14 in the contact hole 38 as shown in FIG. 14.

Figure 14:
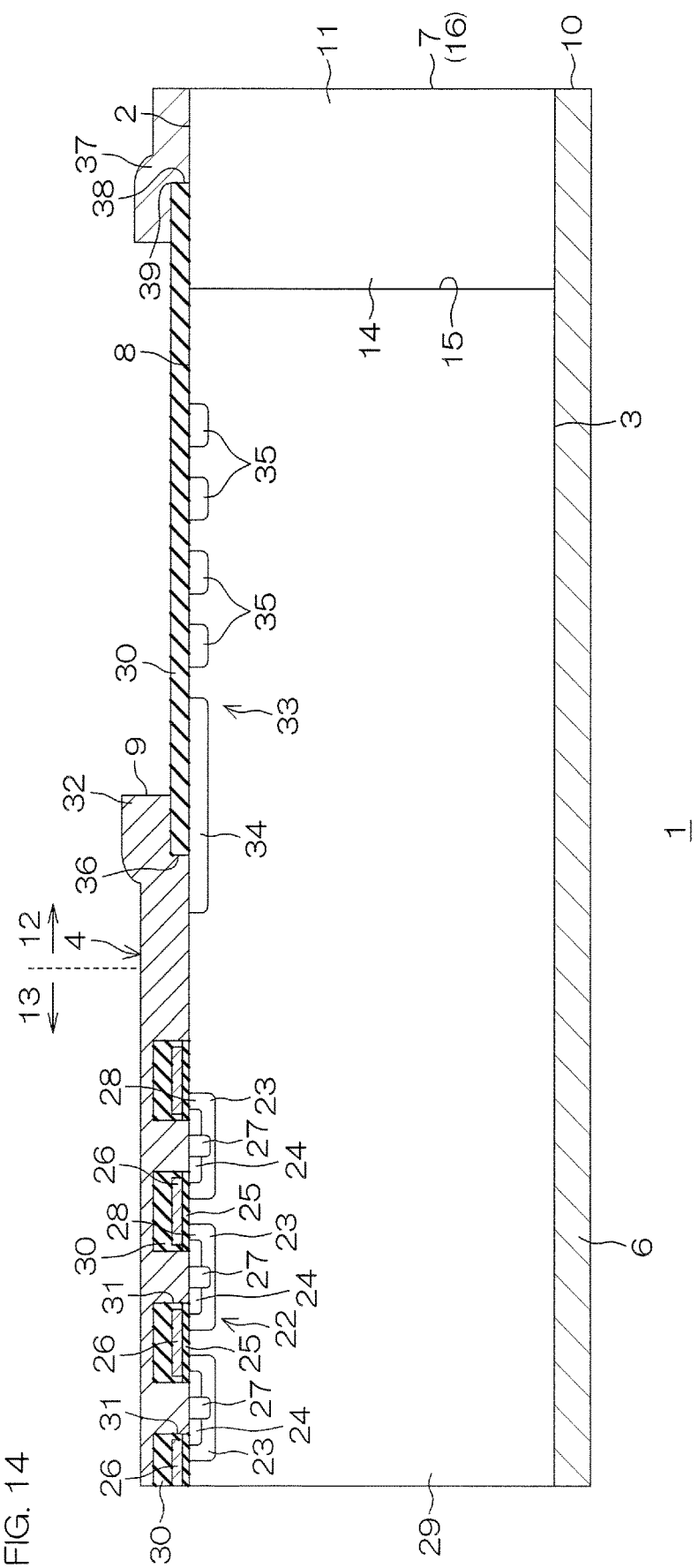
FIG. 14 is a schematic cross-sectional view of a semiconductor device according to another preferred embodiment of the present invention.

The second drain electrode 37 is electrically connected to the drain electrode 6, not shown in FIG. 12 to FIG. 14 (see FIG. 38 with respect to a connection mode between the drain electrode 6 and the second drain electrode 37). Accordingly, the electric potentials of the n⁻ type peripheral region 17 (FIG. 12) and the electric-field relaxation region 14 (FIG. 14) are fixed at the same electric potential from the front surface 2 of the semiconductor layer 11 with which the second drain electrode 37 is in contact to the rear surface 3 with which the drain electrode 6 is in contact. As a result, it is possible to bring about a state in which an electric field is not easily applied to the n⁻ type peripheral region 17 (FIG. 12) and to the electric-field relaxation region 14 (FIG. 14), and therefore it is possible to further relax the electric field strength near the end surface 7 of the semiconductor layer 11.

Additionally, in FIG. 1 to FIG. 14 mentioned above, every electric-field relaxation region 14 was formed so as to reach the rear surface 3 from a flat part of the front surface 2 of the semiconductor layer 11 (i.e., a part in which a concave portion, such as a trench, is not formed intentionally and in which the state of the front surface 2 that has been epitaxially grown is maintained). However, the electric-field relaxation region 14 may be formed with a structure shown in FIG. 15.

Specifically, in the outer peripheral region 12 of the semiconductor layer 11, a trench 40, which is an example of the concave portion of the present invention that has a bottom portion at the rear-surface portion of the semiconductor layer 11 from the front surface 2 of the semiconductor layer 11, is formed outside the surface termination structure 33. The trench 40 is annularly formed so as to surround the n⁻ type drift region 29, not shown, in the same way as the electric-field relaxation region 14 of FIG. 4.

Additionally, the electric-field relaxation region 14 is formed at the entirety of a side portion and a bottom portion of the trench 40 along the inner surface of the trench 40, and the bottom portion is exposed at the rear surface 3 of the semiconductor layer 11. In other words, the electric-field relaxation region 14 formed at the side portion of the trench 40 in an opening end of the trench 40 is exposed to the front surface 2, and the electric-field relaxation region 14 formed at a portion downward from a bottom surface of the trench 40 is exposed to the rear surface 3. Accordingly, the electric-field relaxation region 14 is formed in such a manner as to pass through the semiconductor layer 11 from the front surface 2 to the rear surface 3 as a whole.

The interlayer insulating film 30 is formed along the inner surface of the trench 40, and forms a fixed hollow space 41 inside the trench 40.

A method for forming this configuration can be described with reference to FIG. 16A to FIG. 16E.

For example, the semiconductor layer 11 that is lower in concentration than the base substrate 18 is first formed by epitaxial growth on the base substrate 18 (wafer) made of n⁺ type SiC (whose impurity concentration is, for example, $1 \times 10^{18}$ cm$^{-3}$ to $1 \times 10^{20}$ cm$^{-3}$ as shown in FIG. 16A.

Figure 16B:
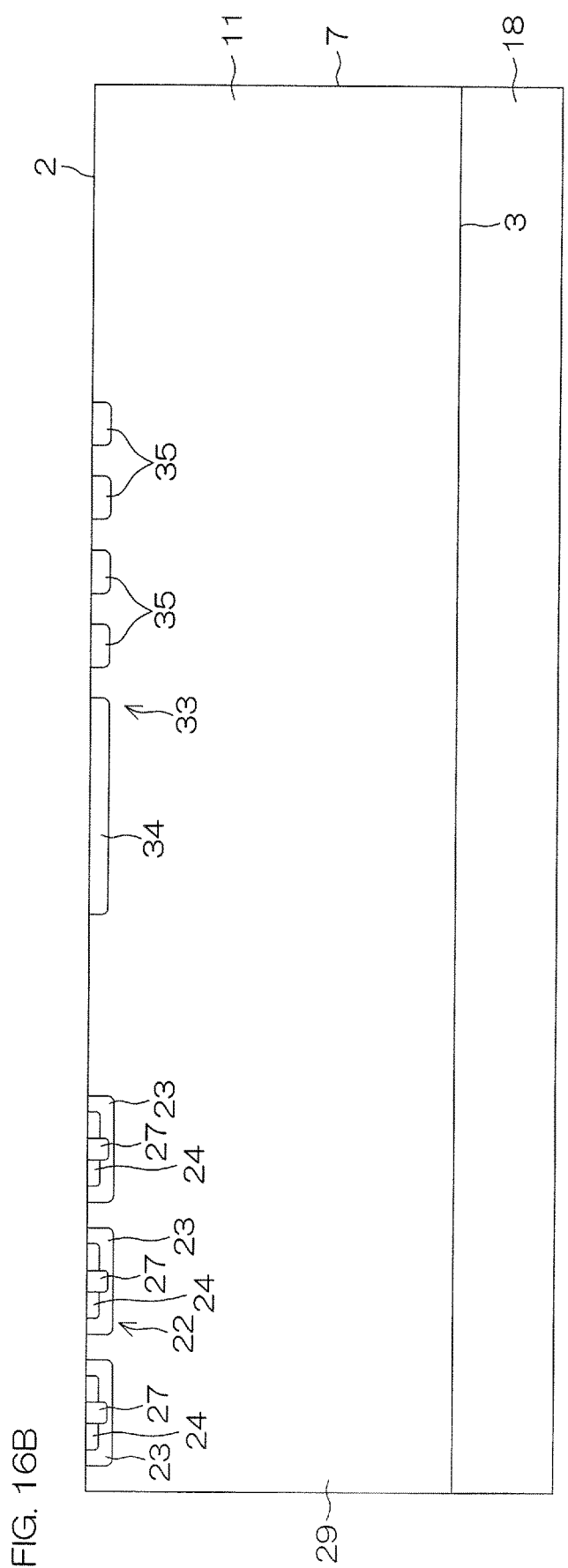
FIG. 16B is a view showing a step subsequent to the step of FIG. 16A.

Thereafter, an impurity region of the MIS transistor structure 22 and the surface termination structure 33 are formed by selectively implanting impurity ions from the front-surface-2 side of the semiconductor layer 11 as shown in FIG. 16B. In detail, the p type body region 23, the n⁺ type source region 24, the p⁺ type body contact region 27, the resurf layer 34, and the guard ring layer 35 are formed.

Thereafter, a mask (not shown) that selectively has an opening in a region in which the electric-field relaxation region 14 is to be formed is formed on the semiconductor layer 11, and the semiconductor layer 11 is selectively etched through the mask from the front-surface-2 side. As a result, the trench 40 is formed in the semiconductor layer 11 as shown in FIG. 16C.

Figure 16D:
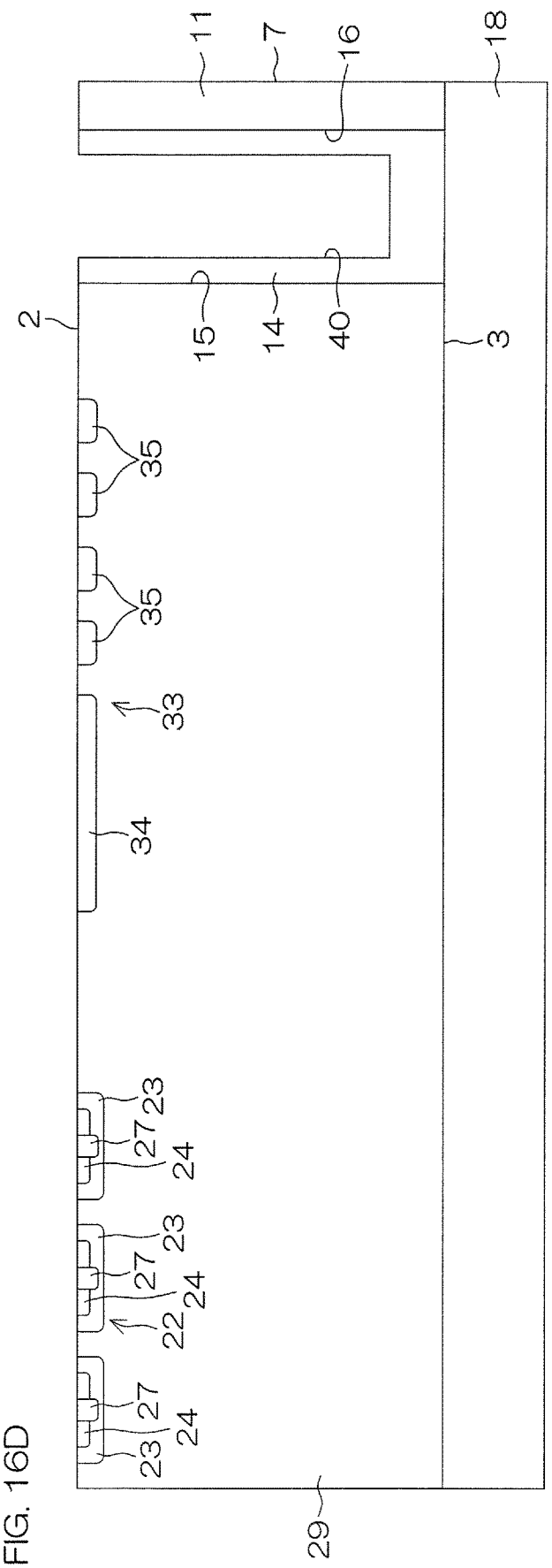
FIG. 16D is a view showing a step subsequent to the step of FIG. 16C.

Thereafter, p type impurity ions are selectively implanted into the inner surface of the trench 40, and then annealing treatment is performed, or, alternatively, substances, such as protons, for high-resistance regions are implanted as shown in FIG. 16D. Accordingly, the electric-field relaxation region 14 along the inner surface of the trench 40 is formed. Likewise, in this step, the depth of the region in which the electric-field relaxation region 14 is to be formed is lessened by forming the trench 40 in the same way as in a case in which the multistage epitaxial method is used as described above, and therefore it is possible to form the electric-field relaxation region 14 also by implanting boron (B) or argon (Ar) without being limited to light chemical elements, such as protons.

Thereafter, the gate insulating film 25 and the gate electrode 26 that are the remaining elements of the MIS transistor structure 22 are formed as shown in FIG. 16E. Thereafter, the interlayer insulating film 30 and the source electrode 4 are formed.

Thereafter, the steps of FIGS. 5E and 5F are performed, and, as a result, the aforementioned semiconductor device 1 (note that the electric-field relaxation region 14 is a p type impurity region) is obtained.

Figure 15:
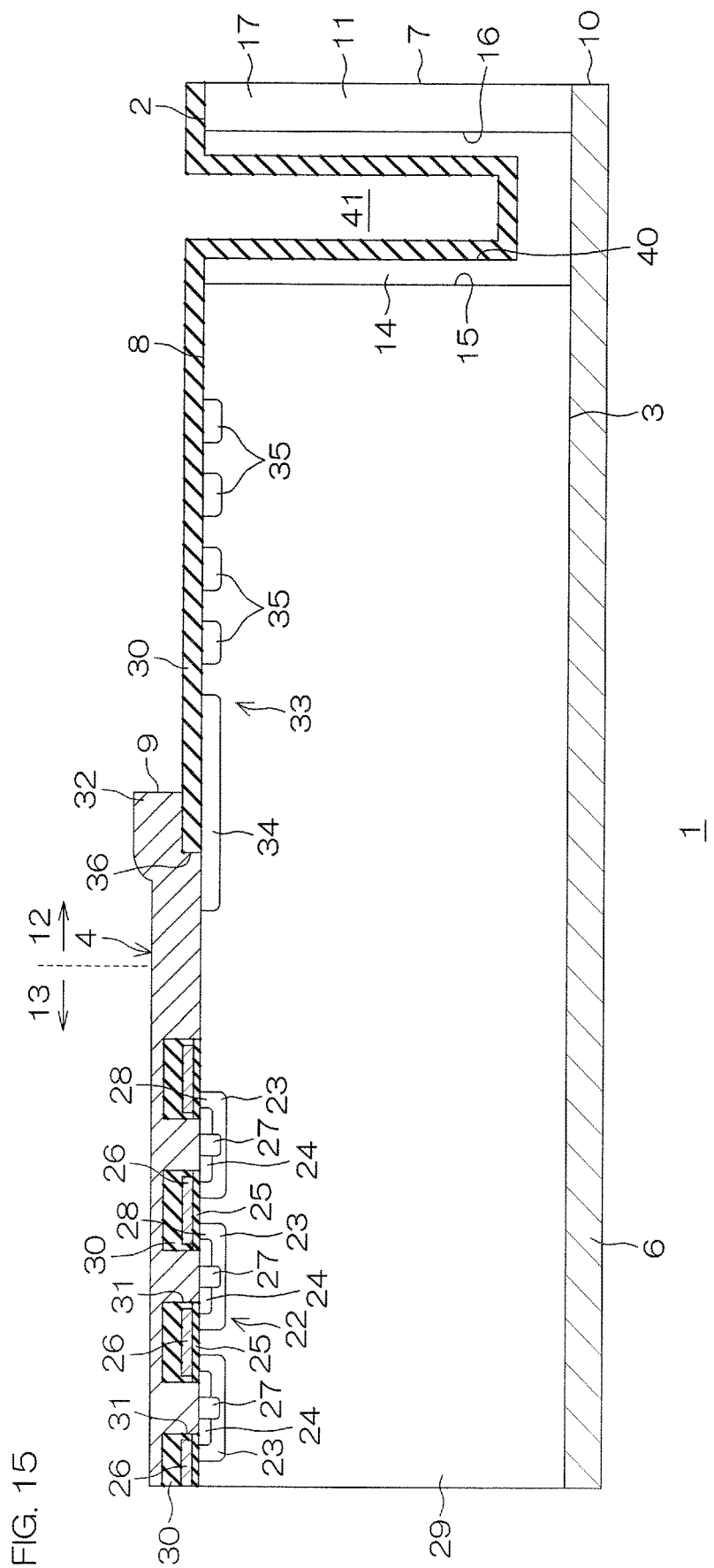
FIG. 15 is a schematic cross-sectional view of a semiconductor device according to another preferred embodiment of the present invention.
Figure 17:
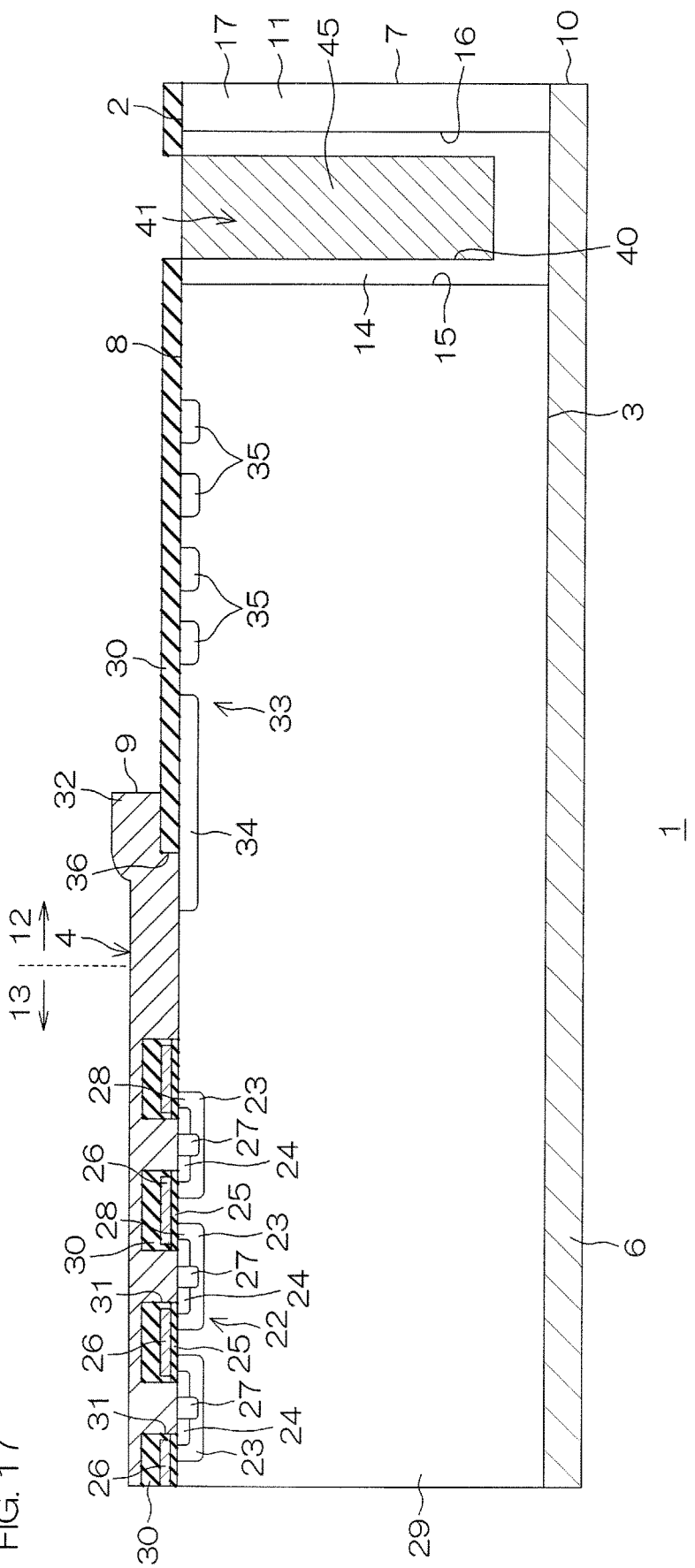
FIG. 17 is a schematic cross-sectional view of a semiconductor device according to another preferred embodiment of the present invention.

Additionally, in the semiconductor device 1 of FIG. 15, a conductive material 45 may be embedded in the hollow space 41 as shown in FIG. 16 and FIG. 17. If the conductive material 45 is embedded in the hollow space 41, the internal interlayer insulating film 30 in the trench 40 is removed, and the conductive material 45 is in contact with the electric-field relaxation region 14 in the inner surface of the trench 40.

Figure 18:
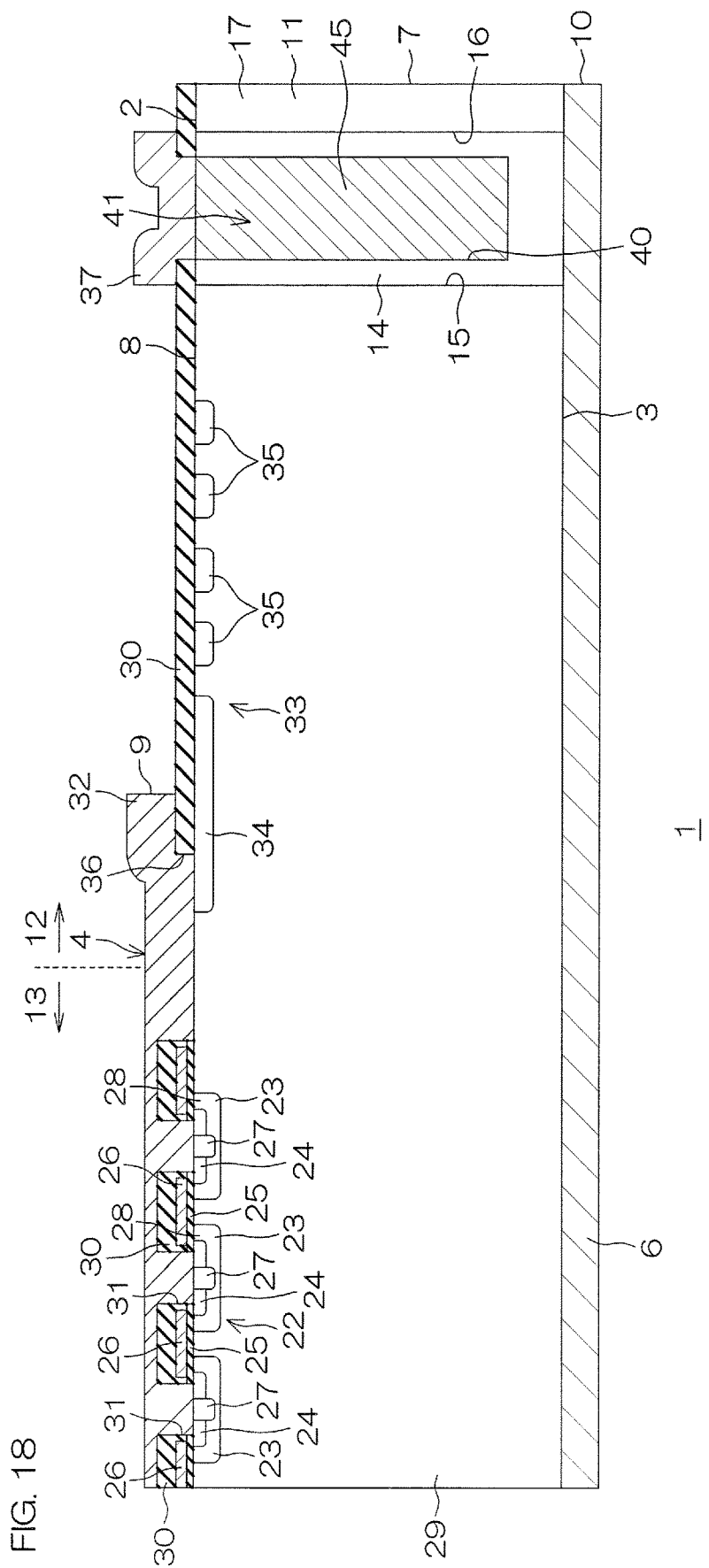
FIG. 18 is a schematic cross-sectional view of a semiconductor device according to another preferred embodiment of the present invention.
Figure 19:
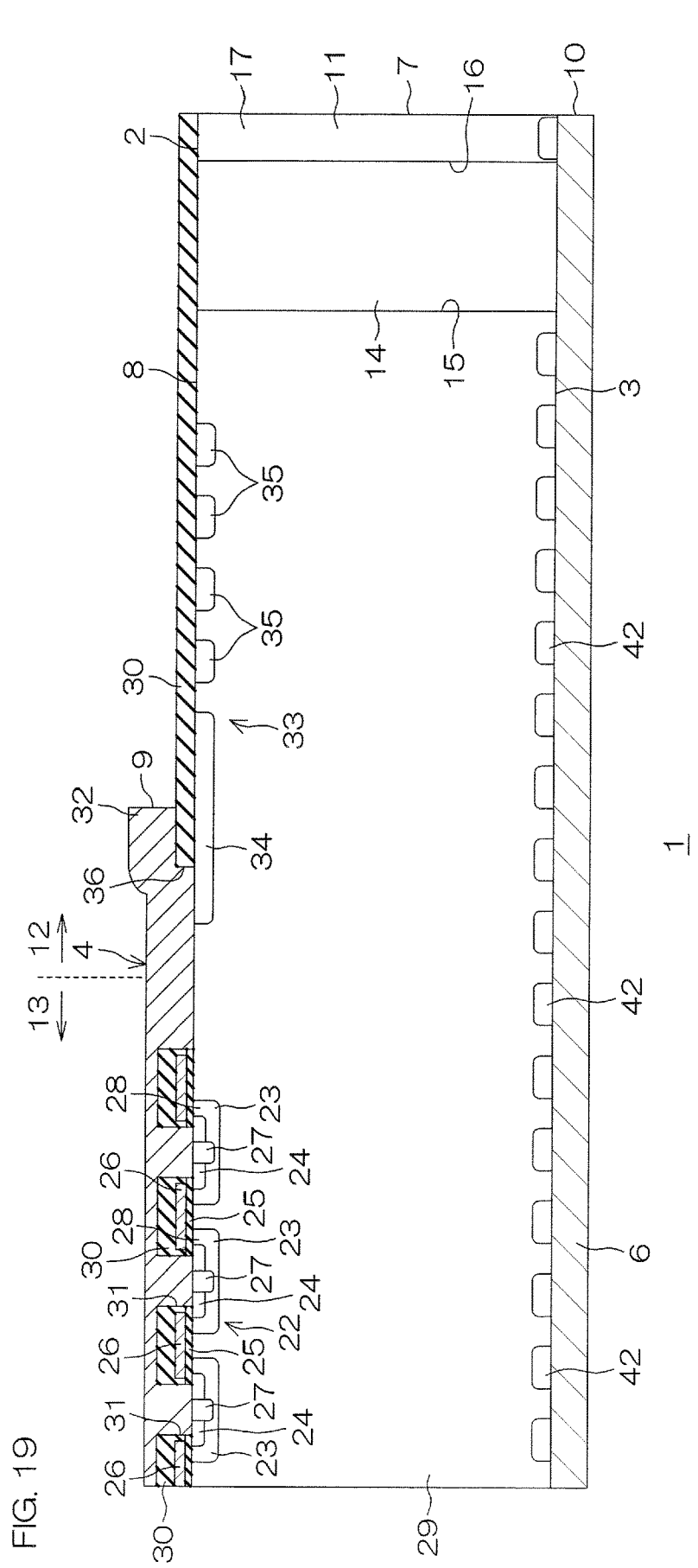
FIG. 19 is a schematic cross-sectional view of a semiconductor device according to another preferred embodiment of the present invention.

The conductive material 45 is metal (for example, W), polysilicon, or the like. If the conductive material 45 is metal, the conductive material 45 can be used as an embedded electrode in the same way as the aforementioned second drain electrode 37 (see FIG. 12 and FIG. 14) as shown in FIG. 17. In other words, the conductive material 45 is electrically connected to the drain electrode 6, and, as a result, the electric potential of the electric-field relaxation region 14 is fixed at the same electric potential from the inner surface of the trench 40 with which the conductive material 45 is in contact to the rear surface 3 with which the drain electrode 6 is in contact. As a result, it is possible to bring about a state in which an electric field is not easily applied to the electric-field relaxation region 14, and therefore it is possible to further relax the electric field strength near the end surface 7 of the semiconductor layer 11. On the other hand, if the conductive material 45 is polysilicon, the second drain electrode 37 may be formed so as to come into contact with the conductive material 45 as shown in FIG. 18.

Additionally, the semiconductor device 1 may include a second electric-field relaxation region 42 at the rear-surface portion of the semiconductor layer 11 as shown in FIG. 19 to FIG. 22.

The second electric-field relaxation region 42 is formed so as to be exposed to a Schottky interface (rear surface 3) of the drain electrode 6 in the semiconductor layer 11, and the drain electrode 6 is in contact with the second electric-field relaxation region 42 exposed thereto. The second electric-field relaxation region 42 is a high-resistance region that has higher resistance than the semiconductor layer 11 (n⁻ type drift region 29) or is a p type semiconductor region in the same way as the electric-field relaxation region 14. For example, if the second electric-field relaxation region 42 is a high-resistance region, this high-resistance region has a crystal defect concentration of $1 \times 10^{14}$ cm$^{-3}$ to $1 \times 10^{22}$ cm$^{-3}$. On the other hand, if the second electric-field relaxation region 42 is a p type semiconductor region, this p type semiconductor region has an impurity concentration of $1 \times 10^{16}$ cm$^{-3}$ to $1 \times 10^{19}$ cm$^{-3}$.

The formation of the second electric-field relaxation region 42 makes it possible to relax the electric field of the Schottky interface between the semiconductor layer 11 and the drain electrode 6. Accordingly, it is possible to reduce a reverse leakage current even if a metal that has a comparatively small work function is used as the drain electrode 6, and therefore the use of this metal makes it possible to secure a low on-resistance.

Figure 20:
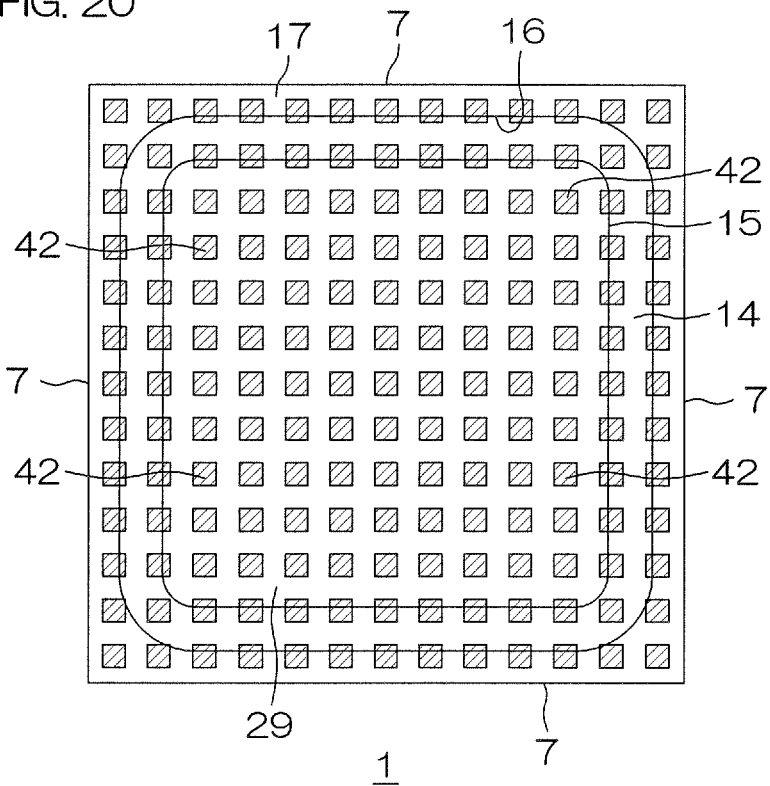
FIG. 20 is a view showing a bottom pattern of a second electric-field relaxation region of FIG. 19.
Figure 21:
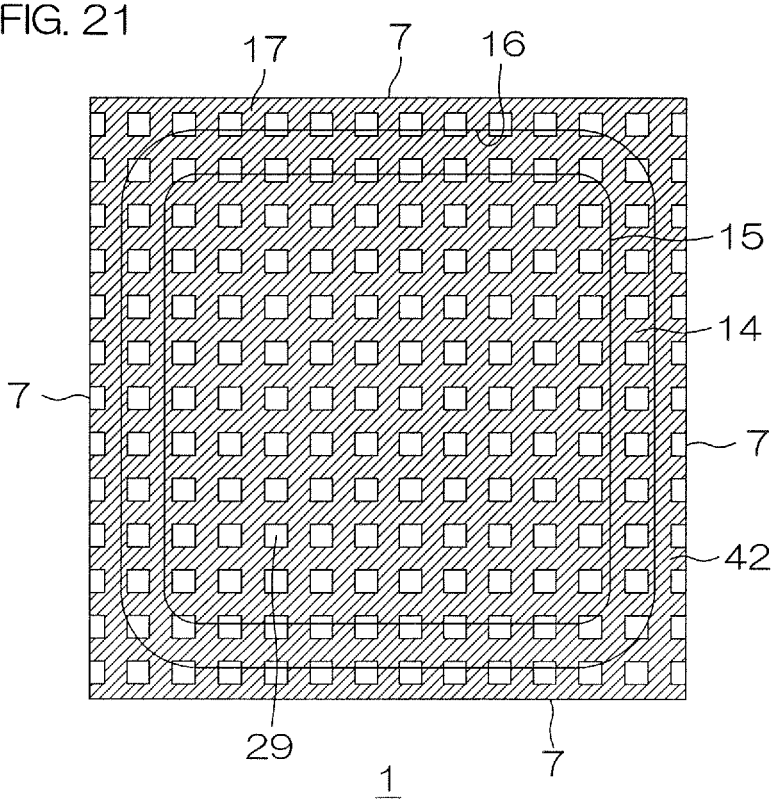
FIG. 21 is a view showing a bottom pattern of the second electric-field relaxation region of FIG. 19.

In a bottom view in which the semiconductor layer 11 is viewed from the rear surface 3, the pattern of the second electric-field relaxation region 42 (bottom pattern) may be a matrix pattern as shown in FIG. 20, or may be a grid pattern as shown in FIG. 21, or may be a stripe pattern as shown in FIG. 22. The patterns shown in FIG. 20 to FIG. 22 are merely examples of the pattern of the second electric-field relaxation region 42, and, for example, other patterns (stagger pattern or the like) in which a plurality of second electric-field relaxation regions 42 are regularly arranged in a discrete manner may be employed, or a pattern in which a single second electric-field relaxation region 42 is disposed below the MIS transistor structure 22 may be employed. Although the second electric-field relaxation region 42 straddles the electric-field relaxation region 14, and is formed on the entirety of the rear surface 3 of the semiconductor layer 11 in FIG. 20 to FIG. 22, the second electric-field relaxation region 42 may be formed only in a region surrounded by the electric-field relaxation region 14.

A method for forming the second electric-field relaxation region 42 can be described with reference to FIG. 23A to FIG. 23H.

Figure 23A:
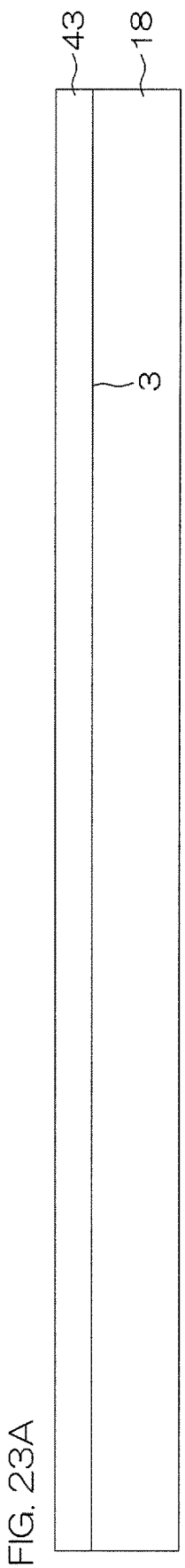
FIG. 23A is a view showing a part of a manufacturing process of the semiconductor device of FIG. 19.

For example, an n⁻ type first semiconductor layer 43 that is lower in concentration than the base substrate 18 is first formed by epitaxial growth on the base substrate 18 (wafer) made of n⁺ type SiC (whose impurity concentration is, for example, $1 \times 10^{18}$ cm$^{-3}$ to $1 \times 10^{20}$ cm$^{-3}$) as shown in FIG. 23A. The thickness of the first semiconductor layer 43 is, for example, 0.5 μm to 5 μm.

Thereafter, the second electric-field relaxation region 42 is formed at the first semiconductor layer 43 as shown in FIG. 23B. The second electric-field relaxation region 42 may be formed according to the same formation method as the aforementioned electric-field relaxation region 14.

In other words, p type impurity ions are selectively implanted into the front surface of the first semiconductor layer 43, and then the first semiconductor layer 43 undergoes annealing treatment (for example, 1500° C. to 1800° C.), or, alternatively, boron or the like is selectively radiated onto the front surface of the first semiconductor layer 43, and then the first semiconductor layer 43 undergoes annealing treatment (for example, 300° C. to 1200° C.). In either case, the annealing treatment may be performed in a later step (for example, simultaneously with a step in which the impurity region of the MIS transistor structure 22 is activated), or if the second electric-field relaxation region 42 is a high-resistance region, the annealing treatment is merely performed when needed, or can also be omitted. Accordingly, in both cases, the second electric-field relaxation region 42 that is a p type impurity region or a high-resistance region is formed. At this time, although the second electric-field relaxation region 42 is formed at the front-surface portion of the first semiconductor layer 43 so as not to pass through the first semiconductor layer 43 in FIG. 23B, each of the second electric-field relaxation regions 42 may pass through the first semiconductor layer 43, and may reach the base substrate 18, for example. Although there is a case in which annealing treatment is performed after implanting p type impurity ions or after radiating boron or the like also when the second electric-field relaxation region 42 is formed, an element that is weak against a high temperature has not yet been formed both in the base substrate 18 and in the first semiconductor layer 43 when the annealing treatment is performed, and therefore it is possible to perform the annealing treatment at a comparatively high temperature.

Figure 23C:
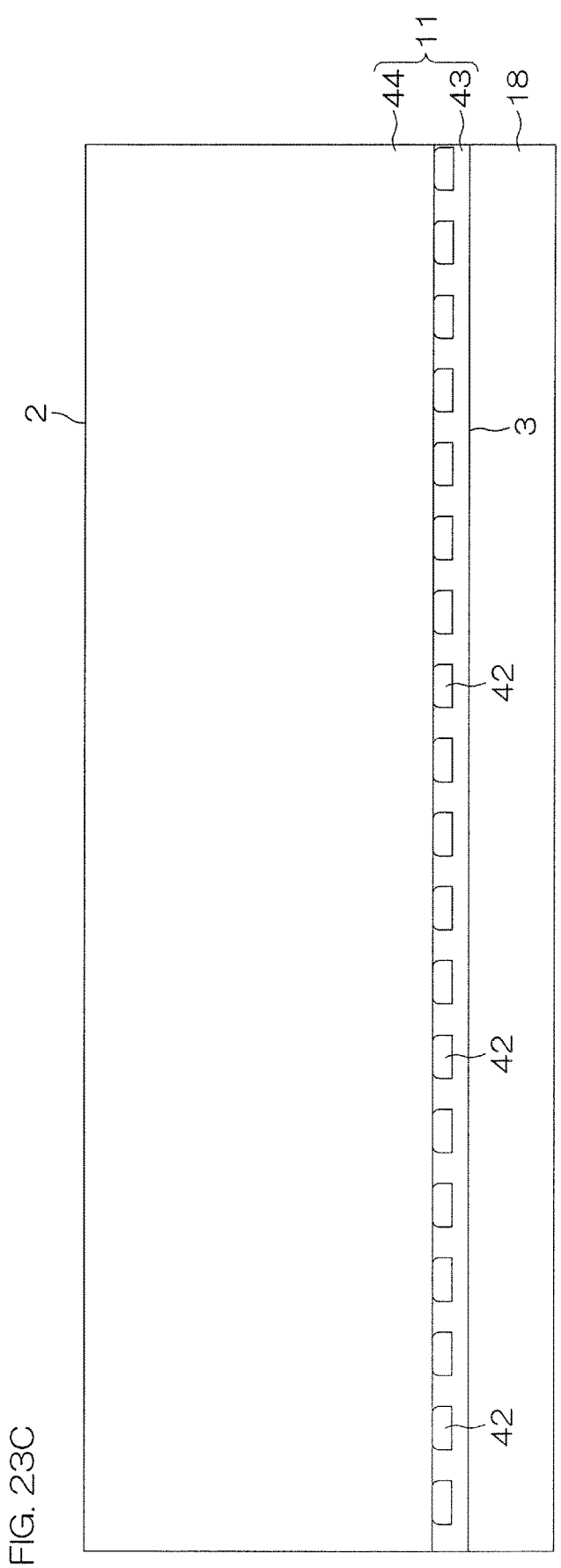
FIG. 23C is a view showing a step subsequent to the step of FIG. 23B.

Thereafter, an n⁻ type second semiconductor layer 44 is formed by further epitaxial growth on the first semiconductor layer 43 as shown in FIG. 23C. The thickness of the second semiconductor layer 44 is, for example, 5 μm to 300 μm. Accordingly, the semiconductor layer 11 consisting of the first semiconductor layer 43 and the second semiconductor layer 44 is formed. The second electric-field relaxation region 42 formed at the front-surface portion of the first semiconductor layer 43 reaches a state of having been embedded in the bottom portion of the semiconductor layer 11.

Figure 23D:
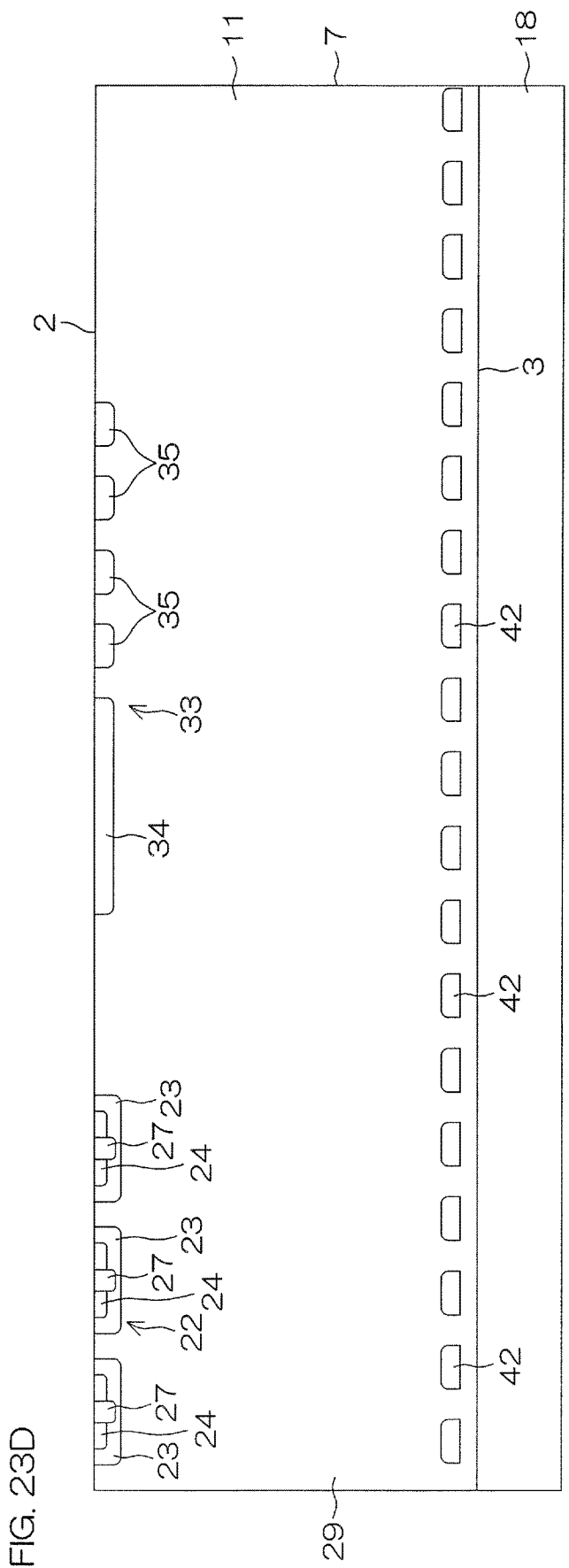
FIG. 23D is a view showing a step subsequent to the step of FIG. 23C.

Thereafter, an impurity region of the MIS transistor structure 22 and the surface termination structure 33 are formed by selectively implanting impurity ions from the front-surface-2 side of the semiconductor layer 11 as shown in FIG. 23D. In detail, the p type body region 23, the n⁺ type source region 24, the p⁺ type body contact region 27, the resurf layer 34, and the guard ring layer 35 are formed.

Figure 23E:
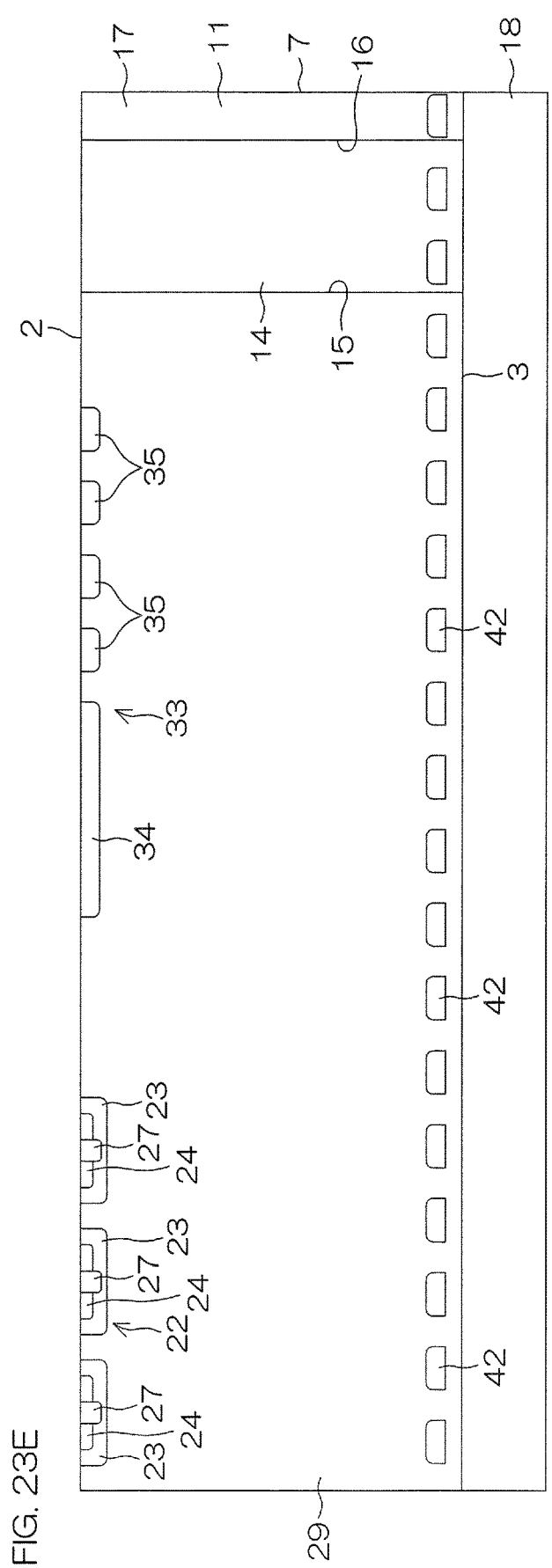
FIG. 23E is a view showing a step subsequent to the step of FIG. 23D.

Thereafter, the electric-field relaxation region 14 is formed in the semiconductor layer 11 as shown in FIG. 23E. The electric-field relaxation region 14 is formed according to the same method as described in FIG. 5C.

Thereafter, the gate insulating film 25 and the gate electrode 26 that are the remaining elements of the MIS transistor structure 22 are formed as shown in FIG. 23F. Thereafter, the interlayer insulating film 30 and the source electrode 4 are formed.

Figure 23G:
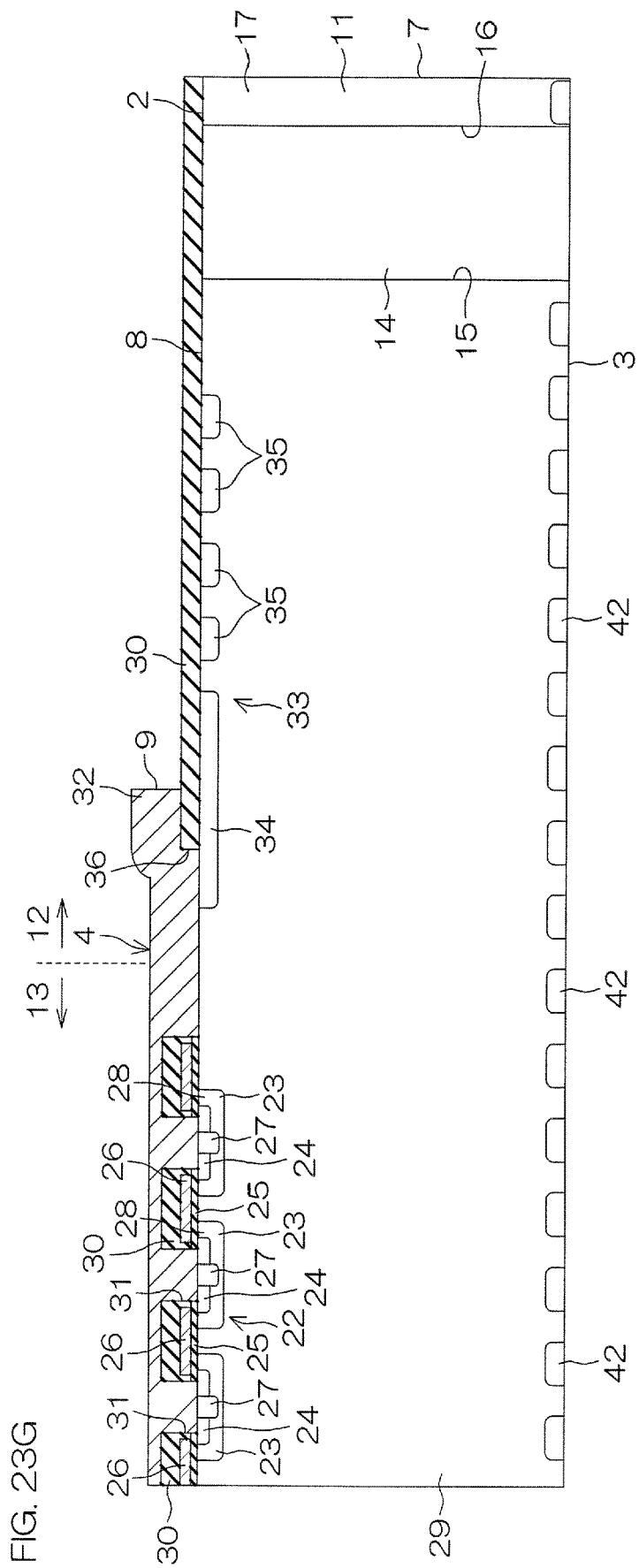
FIG. 23G is a view showing a step subsequent to the step of FIG. 23F.

Thereafter, the entirety of the rear surface 3 of the semiconductor layer 11 is exposed by removing the base substrate 18 as shown in FIG. 23G. Although this step is continued until the second electric-field relaxation region 42 is exposed from the rear surface 3, this step may be stopped before the second electric-field relaxation region 42 appears on a removal surface (a ground surface). This makes it possible to obtain a configuration in which the second electric-field relaxation region 42 is embedded without being exposed from the rear surface 3 of the semiconductor layer 11.

Figure 23H:
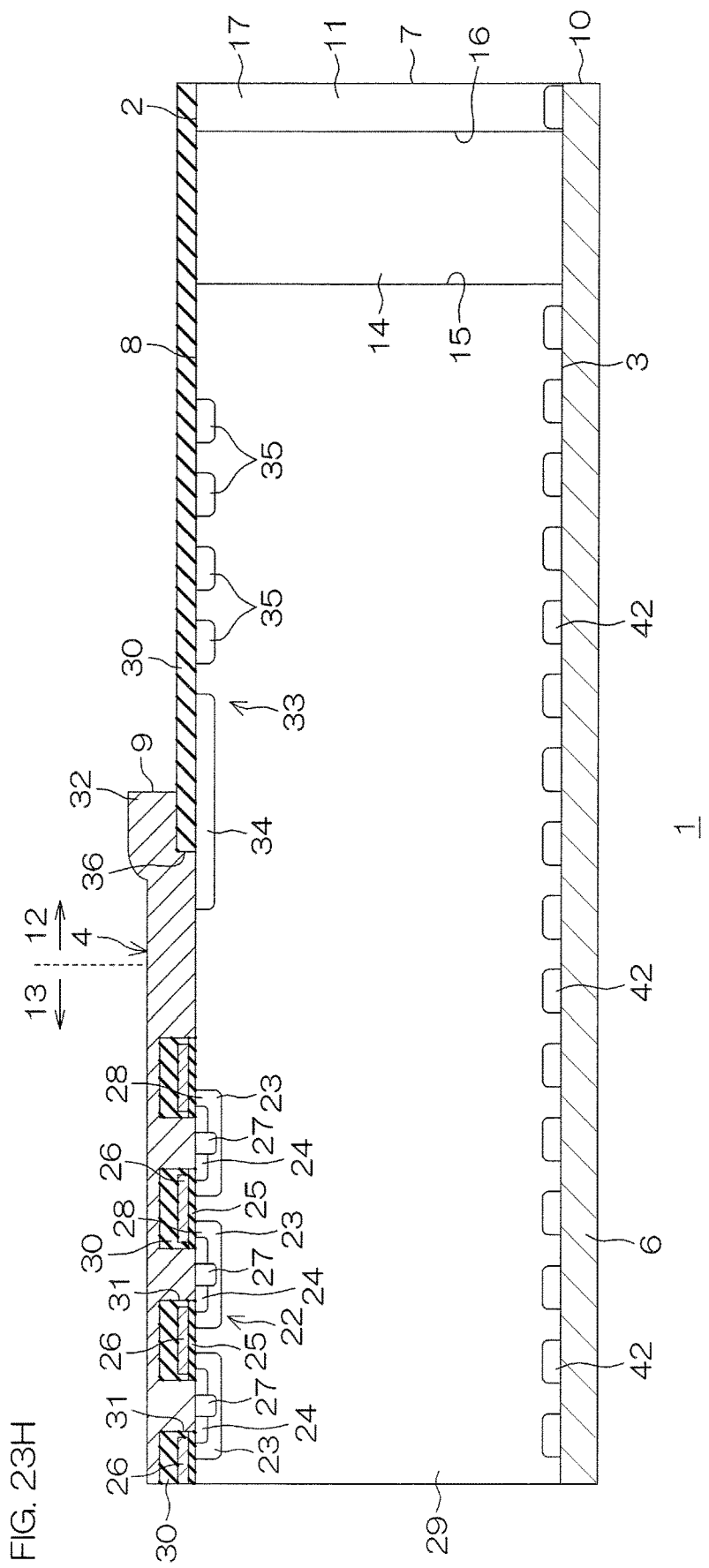
FIG. 23H is a view showing a step subsequent to the step of FIG. 23G.

Thereafter, the drain electrode 6 (e.g., Ti/Al) is formed on the entirety of the rear surface 3 of the semiconductor layer 11 according to, for example, a sputtering method as shown in FIG. 23H. Thereafter, the semiconductor layer 11 is cut into pieces along a dicing line preset at a predetermined position. As a result, semiconductor devices 1 each of which is one of a plurality of individual pieces are obtained.

Figure 24:
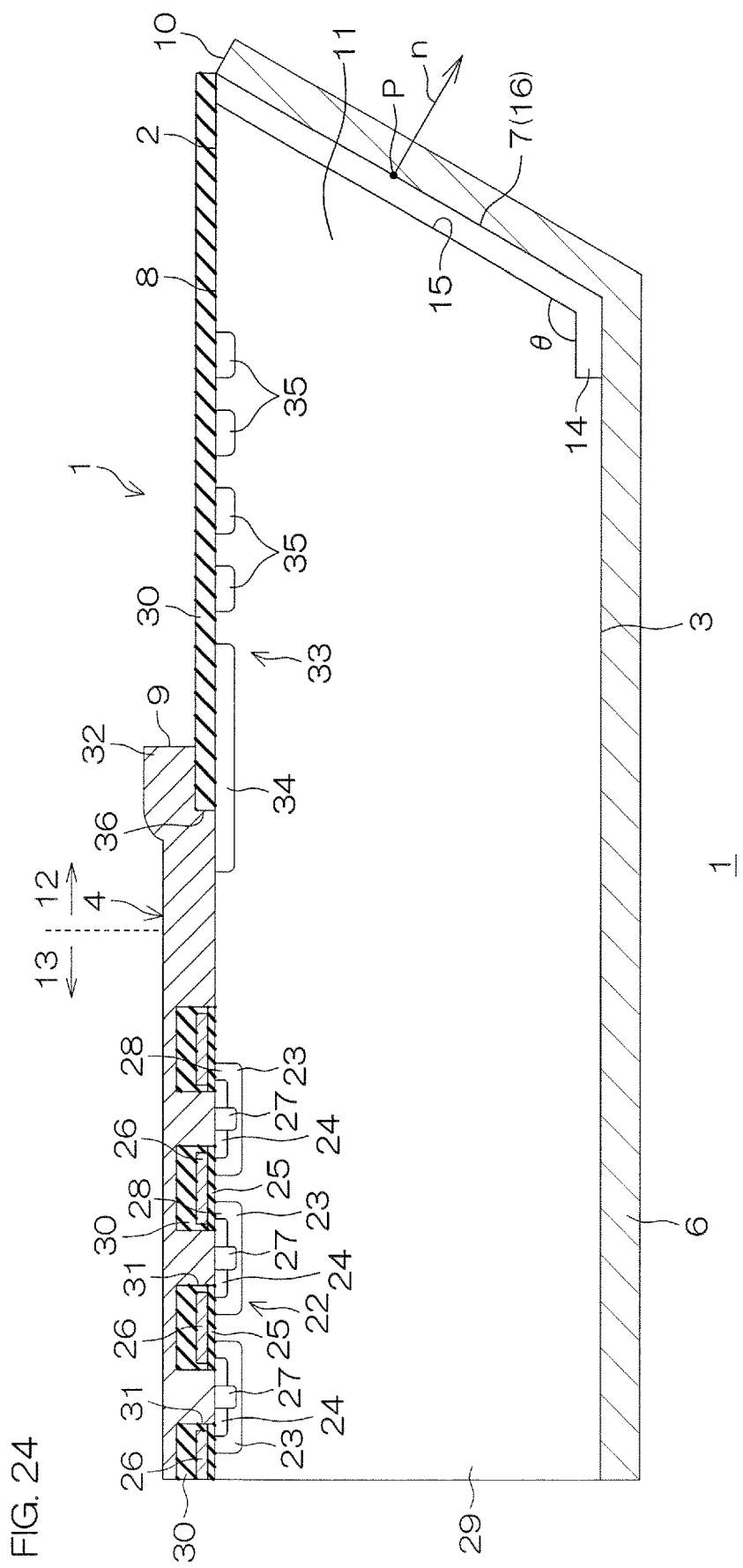
FIG. 24 is a schematic cross-sectional view of a semiconductor device according to another preferred embodiment of the present invention.

FIG. 24 is a schematic cross-sectional view of the semiconductor device 1 according to another preferred embodiment of the present invention.

In the semiconductor device 1 shown in FIG. 24, the end surface 7 of the semiconductor layer 11 includes a part that faces the rear-surface-3 side in the thickness direction of the semiconductor layer 11. In FIG. 24, the linearly-shown flat end surface 7 is tilted at an angle that exceeds 90° (internal angle θ between the end surface 7 and the rear surface 3>90°) with respect to the rear surface 3 of the semiconductor layer 11 in a cross-sectional view, and, as a result, the entirety of the flat end surface 7 faces the rear-surface-3 side in the thickness direction of the semiconductor layer 11. In other words, the normal direction n of a part of the end surface 7 (for example, point P in the end surface 7) is not parallel to the rear surface 3 of the semiconductor layer 11, but is tilted in a direction that approaches the rear surface 3.

The electric-field relaxation region 14 is formed at least at the end surface 7 of the semiconductor layer 11, and is exposed in the end surface 7.

The drain electrode 6 is formed in the whole area of the rear surface 3 of the semiconductor layer 11, and is further formed on the end surface 7. The drain electrode 6 is in contact with the electric-field relaxation region 14 in the end surface 7 of the semiconductor layer 11. Other configurations are formed in the same way as in the other preferred embodiments.

Figure 25:
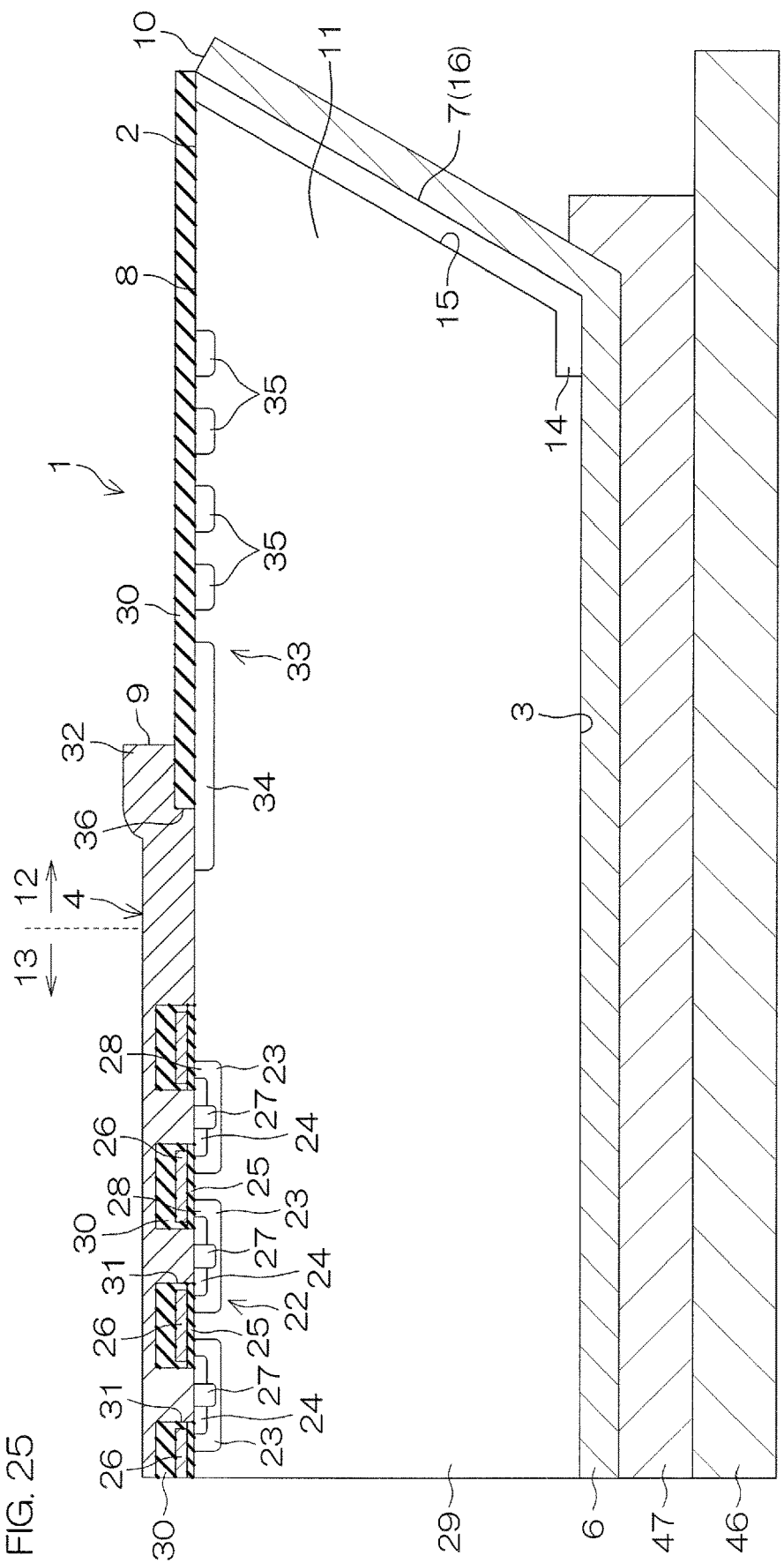
FIG. 25 is a view to describe an effect brought about by a structure of the semiconductor device of FIG. 24.

According to this configuration, it is possible to form the drain electrode 6 in the whole area of the rear surface 3, and therefore, when this is joined to a frame 46 (for example, an island portion of a lead frame) through a joining material 47 (for example, solder) as shown in FIG. 25, it is possible to easily perform die bonding. Additionally, the end surface 7 of the semiconductor layer 11 is covered with the drain electrode 6 that continuously extends from the rear surface 3, and therefore, even if a surplus joining material 47 rises along the end surface 7 of the semiconductor layer 11, the surplus joining material 47 merely comes into contact with the drain electrode 6, and therefore it does not become a specific problem.

Figure 26A:
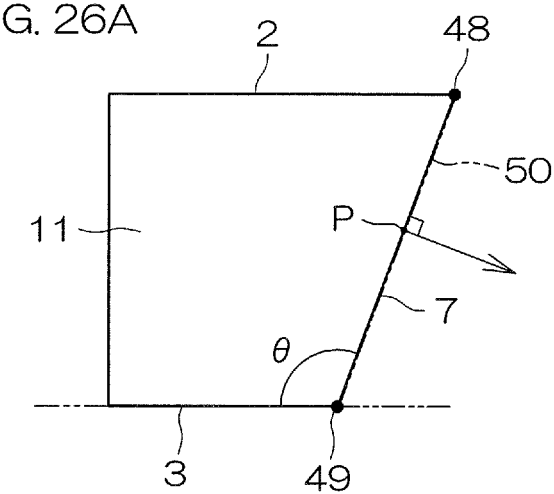
FIG. 26A is a view to describe a variation of an end surface shape of a semiconductor layer.
Figure 26B:
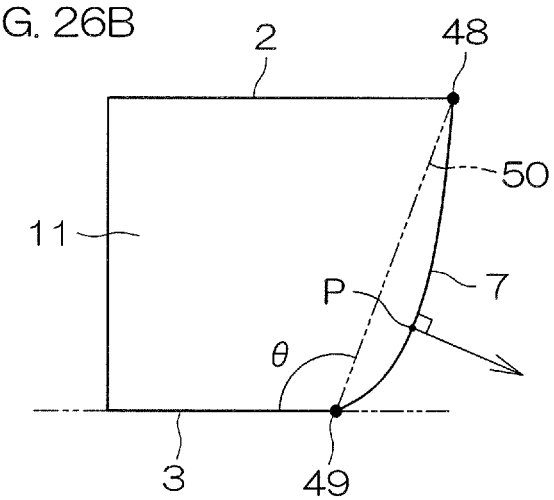
FIG. 26B is a view to describe a variation of the end surface shape of the semiconductor layer.
Figure 26C:
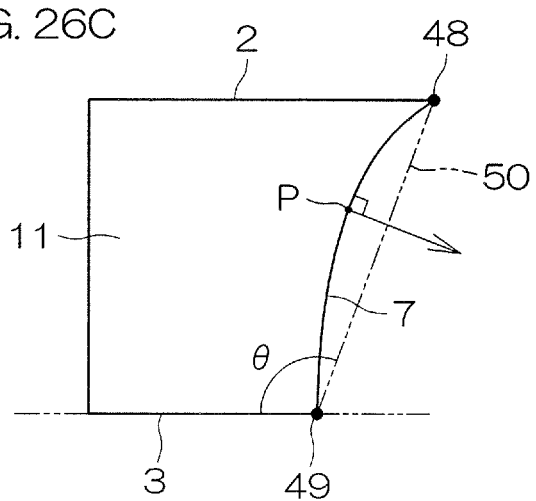
FIG. 26C is a view to describe a variation of the end surface shape of the semiconductor layer.

Next, the shape of the end surface 7 of the semiconductor layer 11 in the present preferred embodiment will be described with reference to FIG. 26A to FIG. 26C. In FIG. 26A to FIG. 26C, only the configuration necessary to describe the shape of the end surface 7 is shown among the configurations shown in FIG. 24, and the other configurations are omitted.

First, the semiconductor layer 11 has an upper surface end 48 that is an end edge on the front-surface-2 side of the end surface 7 and a bottom surface end 49 that is an end edge on the rear-surface-3 side of the end surface 7 in a cross-sectional view, which is common to FIG. 26A to FIG. 26C. The bottom surface end 49 is disposed at a more inward position than the upper surface end 48.

As thus described, the end surface 7 connects the bottom surface end 49, which is disposed at a relatively inner position, and the upper surface end 48, which is disposed at a relatively outer position, together, and, as a result, the end surface 7 includes a part that faces the rear-surface-3 side in the thickness direction of the semiconductor layer 11 as described above.

In other words, in the present preferred embodiment, a linear phantom line segment 50 by which the upper surface end 48 and the bottom surface end 49 are connected together is merely required to be tilted at an angle that exceeds 90° with respect to the rear surface 3 of the semiconductor layer 11 as shown in FIG. 26A to FIG. 26C. In this case, the end surface 7 may be a flat surface (which is identical in configuration with that of FIG. 24) that coincides with the phantom line segment 50 in a cross-sectional view as shown in FIG. 26A, or the end surface 7 may be a convex surface that expands outwardly with respect to the phantom line segment 50 as shown in FIG. 26B, or the end surface 7 may be a concave surface that becomes hollow inwardly with respect to the phantom line segment 50 as shown in FIG. 26C.

Additionally, it is permissible to employ a shape (perpendicular shape) in which a part that faces the rear-surface-3 side in the thickness direction of the semiconductor layer 11 is from the bottom surface end 49 to a midway point in the thickness direction of the semiconductor layer 11 and in which the part does not face the rear-surface-3 side from there to the upper surface end 48 as described later (as described with reference to FIG. 29A to FIG. 29E).

Next, a positional relationship between the electric-field relaxation region 14 and the drain electrode 6 in the present preferred embodiment will be described with reference to FIG. 27A to FIG. 27E. In FIG. 27A to FIG. 27E, only the configuration necessary to describe a positional relationship between the electric-field relaxation region 14 and the drain electrode 6 among the configurations shown in FIG. 24 is shown, and the other configurations are omitted.

Figure 27A:
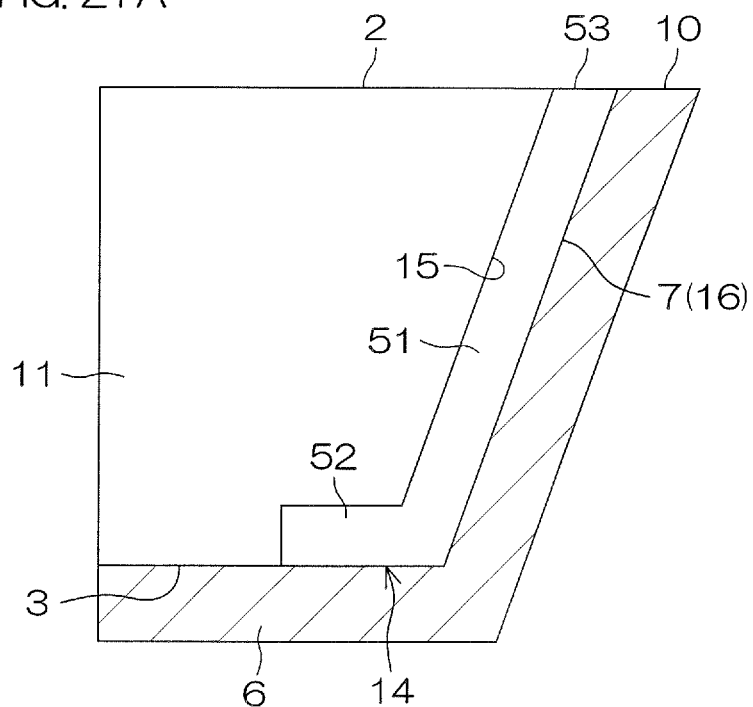
FIG. 27A is a view to describe a positional relationship between an electric-field relaxation region and a drain electrode in the semiconductor device of FIG. 24.

First, the electric-field relaxation region 14 may be formed so as to reach from the rear surface 3 of the semiconductor layer 11 to the front surface 2 as shown in FIG. 27A. More specifically, the electric-field relaxation region 14 integrally has a main portion 51 that is formed along the end surface 7 and that has the inner surface 15 at a position of a substantially constant width from the end surface 7 and a bottom-surface-side draw portion 52 that is drawn out inwardly from a lower end of the main portion 51 (an end on the rear-surface-3 side of the semiconductor layer 11). The bottom-surface-side draw portion 52 has the inner surface 15 at a position of a substantially constant width from the rear surface 3. In other words, the electric-field relaxation region 14 is formed with a substantially constant width along the rear surface 3 and along the end surface 7 so as to straddle between the rear surface 3 and the end surface 7. If it is expressed in another way, the width of the electric-field relaxation region 14 may be defined as the thickness of the electric-field relaxation region 14 in a cross-sectional view or as the depth from the rear surface 3 and from the end surface 7. Additionally, the electric-field relaxation region 14 is exposed in the rear surface 3 and in the end surface 7. The drain electrode 6 is formed from the rear surface 3 of the semiconductor layer 11 to the front surface 2, and has the peripheral edge 10 at the position of the front surface 2 of the semiconductor layer 11. According to this configuration, it is possible to omit a patterning step of the drain electrode 6 in a manufacturing process shown in FIG. 28A to FIG. 28L, and therefore it is possible to simplify the manufacturing process.

Figure 27B:
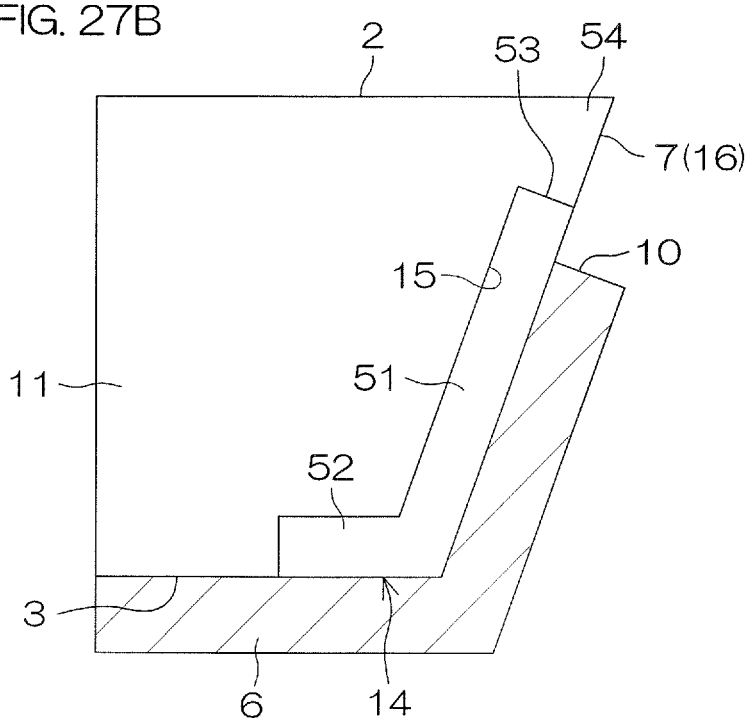
FIG. 27B is a view to describe a positional relationship between an electric-field relaxation region and a drain electrode in the semiconductor device of FIG. 24.

Thereafter, as shown in FIG. 27B, the electric-field relaxation region 14 has the main portion 51 formed from the rear surface 3 of the semiconductor layer 11 to a midway portion in the thickness direction of the end surface 7, and an n⁻ type region 54 that is a part of the n⁻ type drift region 29 may be interposed between the front surface 2 and an upper end 53 of the electric-field relaxation region 14. In this case, preferably, the drain electrode 6 is also formed away from the front surface 2 of the semiconductor layer 11 in the same way as the electric-field relaxation region 14, and the peripheral edge 10 of the drain electrode 6 is disposed on the rear-surface-3 side in the thickness direction with respect to the end 53 of the electric-field relaxation region 14 in FIG. 27B. This prevents the drain electrode 6 and the n⁻ type region 54 from coming into contact with each other in the end surface 7 of the semiconductor layer 11.

Figure 27C:
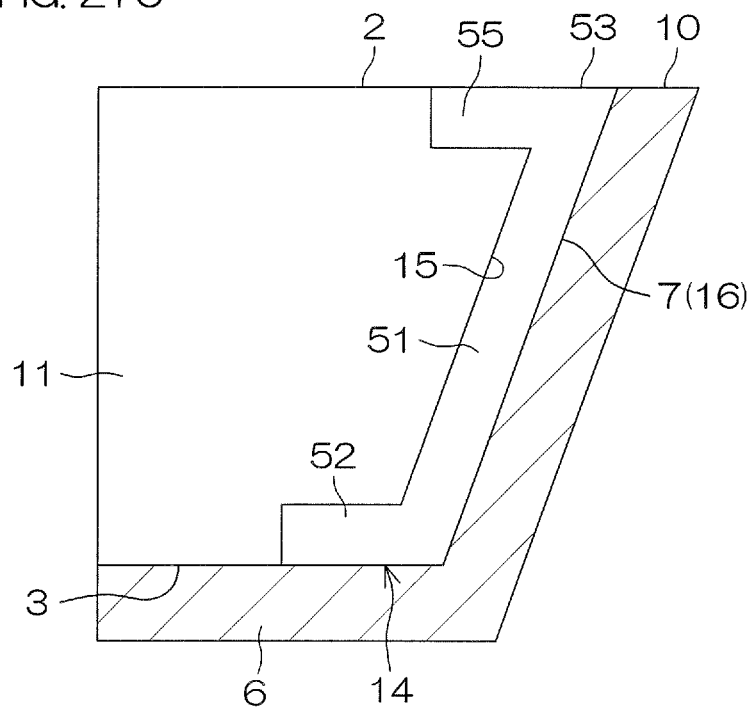
FIG. 27C is a view to describe a positional relationship between an electric-field relaxation region and a drain electrode in the semiconductor device of FIG. 24.

Thereafter, in a configuration in which the main portion 51 is formed from the rear surface 3 to the front surface 2 in the same way as in FIG. 27A, the electric-field relaxation region 14 may additionally and integrally have an upper-surface-side draw portion 55 drawn out inwardly from the upper end of the main portion 51 (an end on the front-surface-2 side of the semiconductor layer 11) as shown in FIG. 27C. According to this configuration, a part of the electric-field relaxation region 14 is configured to extend from the peripheral edge 10 of the drain electrode 6, and therefore it is possible to further improve a withstand voltage.

Figure 27D:
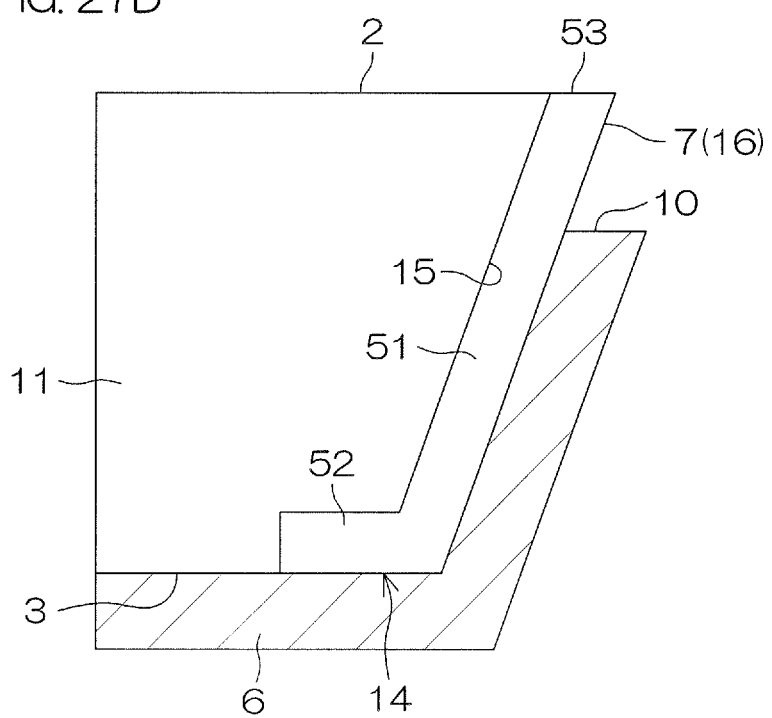
FIG. 27D is a view to describe a positional relationship between an electric-field relaxation region and a drain electrode in the semiconductor device of FIG. 24.

Thereafter, in a case in which the electric-field relaxation region 14 has the configuration of FIG. 27A, the peripheral edge 10 of the drain electrode 6 may be disposed on the rear-surface-3 side in the thickness direction with respect to the end 53 of the electric-field relaxation region 14 (the front surface 2 of the semiconductor layer 11) as shown in FIG. 27D. According to this configuration, a part of the electric-field relaxation region 14 is configured to extend from the peripheral edge 10 of the drain electrode 6, and therefore it is possible to further improve a withstand voltage.

Thereafter, the electric-field relaxation region 14 is selectively formed as the main portion 51 only at the end surface 7 of the semiconductor layer 11 as shown in FIG. 27E, and is not necessarily required to be formed at the rear surface 3. More specifically, the electric-field relaxation region 14 is formed from the front surface 2 of the semiconductor layer 11 to a midway portion in the thickness direction of the end surface 7, and an n⁻ type region 57 that is a part of the n⁻ type drift region 29 may be interposed between the rear surface 3 and the lower end 56 of the electric-field relaxation region 14. In this case, the drain electrode 6 may be in contact with the electric-field relaxation region 14 in the end surface 7, and may make a Schottky junction with the n⁻ type regions 57 by coming into contact with the n⁻ type region 57. It is possible to further reduce a leakage current if the barrier height of the Schottky junction in the end surface 7 is higher than the barrier height of the Schottky junction in the rear surface 3.

Next, a method for manufacturing the semiconductor device 1 in the present preferred embodiment will be described with reference to FIG. 28A to FIG. 28L. In FIG. 28A to FIG. 28L, only the configuration of a characterized part of the manufacturing process of the present preferred embodiment is shown among the configurations shown in FIG. 24, and the other configurations are omitted. In FIG. 28A to FIG. 28L, the same reference numeral is given to a component identical with that of FIGS. 5A to 5F.

Figure 28A:
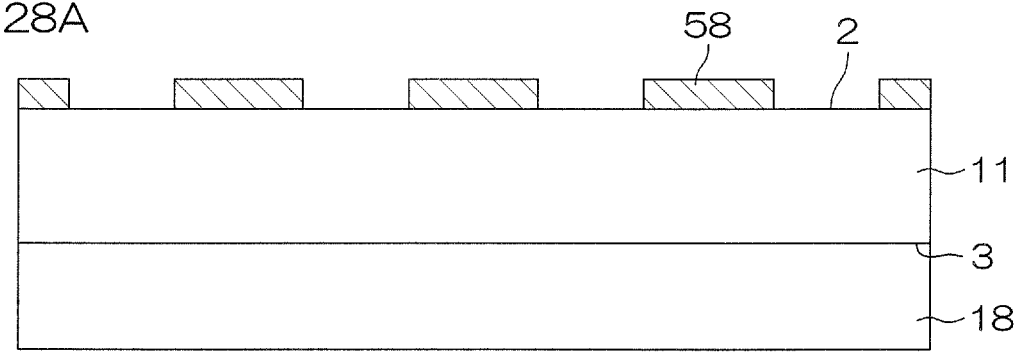
FIG. 28A is a view showing a part of a manufacturing process of the semiconductor device of FIG. 24.

First, the semiconductor layer 11 is formed by epitaxial growth on the base substrate 18 (wafer) as shown in FIG. 28A. Thereafter, the MIS transistor structure 22 (not shown) is formed at the front-surface portion of the semiconductor layer 11, and a surface metal 58 is formed. The surface metal 58 may include the source electrode 4 of FIG. 24, a gate pad that is connected to the gate electrode 26, and the like.

Figure 28B:
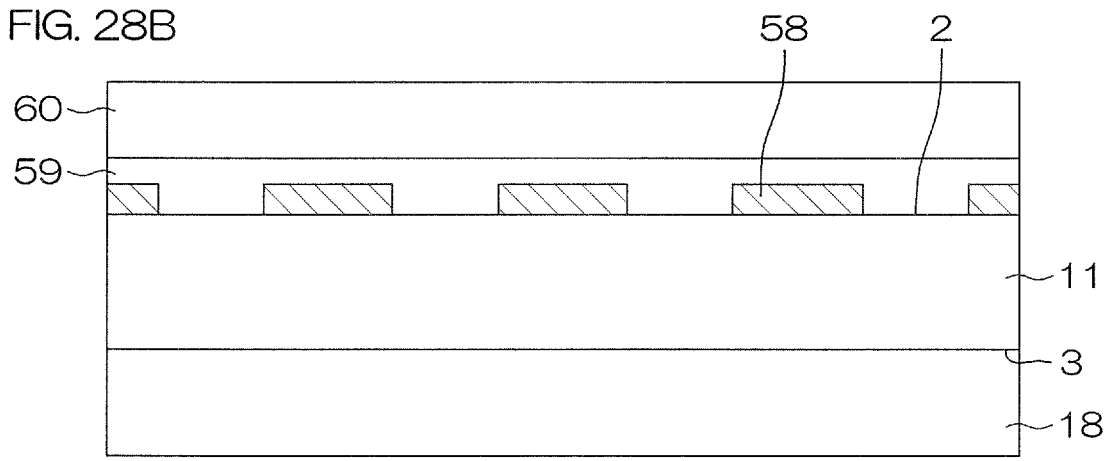
FIG. 28B is a view showing a step subsequent to the step of FIG. 28A.

Thereafter, a support substrate 60 is allowed to adhere to the front-surface side of the semiconductor layer 11 through an adhesive member 59 (adhesive agent, tape, etc.) as shown in FIG. 28B.

Figure 28C:
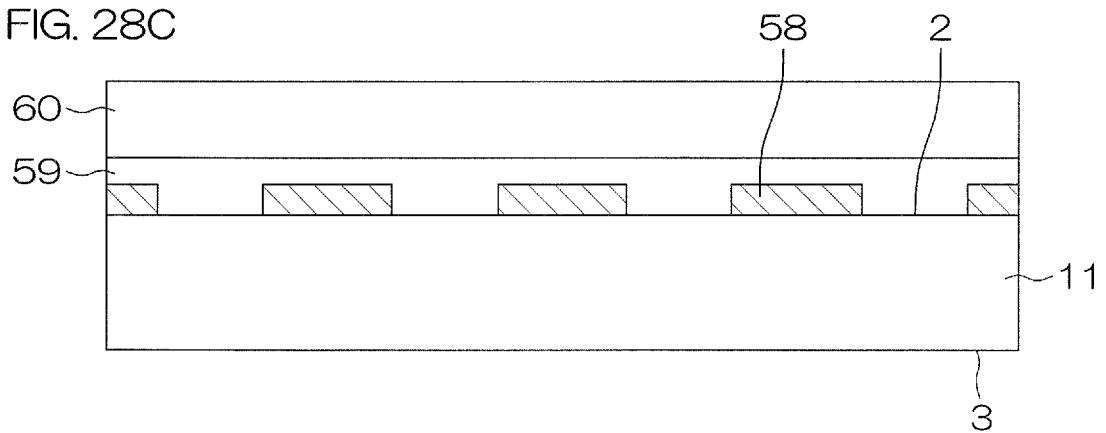
FIG. 28C is a view showing a step subsequent to the step of FIG. 28B.

Thereafter, the rear surface 3 of the semiconductor layer 11 is exposed by grinding the base substrate 18 from the rear-surface side as shown in FIG. 28C.

Figure 28D:
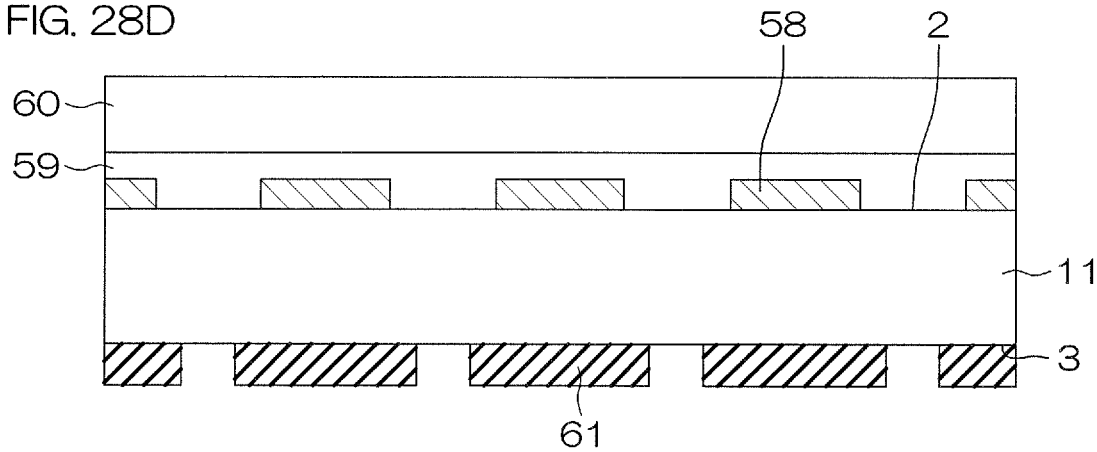
FIG. 28D is a view showing a step subsequent to the step of FIG. 28C.

Thereafter, a mask 61 that has an opening is selectively formed on the rear surface 3 of the semiconductor layer 11 as shown in FIG. 28D. For example, a metal film, an insulating film, a photoresist, etc., can be used as the mask 61.

Figure 28E:
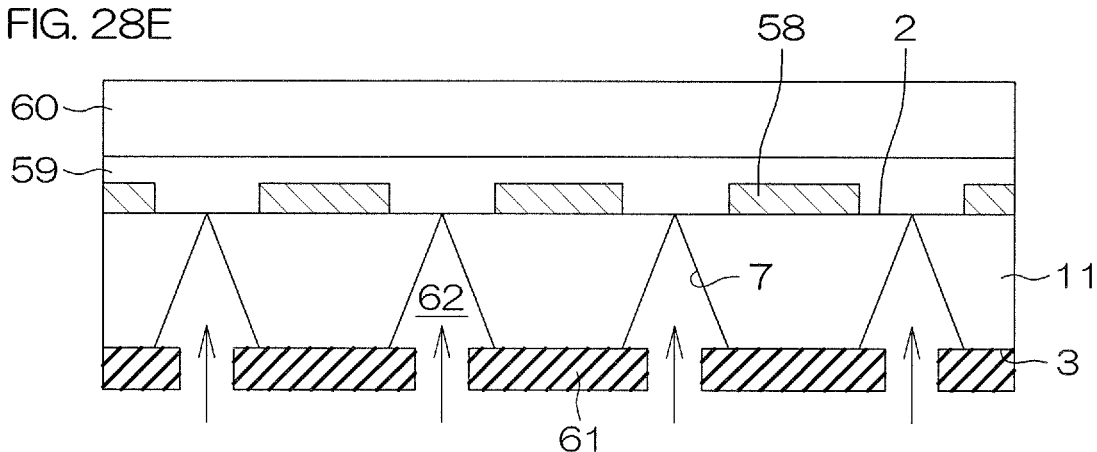
FIG. 28E is a view showing a step subsequent to the step of FIG. 28D.

Thereafter, the semiconductor layer 11 is selectively etched from the rear-surface-3 side through the mask 61 as shown in FIG. 28E. More specifically, an etching agent is supplied to the semiconductor layer 11, and, as a result, the semiconductor layer 11 is etched from the rear-surface-3 side. For example, dry etching with a fluorine-based gas, such as $SF_6$, may be employed as the etching operation. Additionally, the etching operation may be performed from the rear surface 3 of the semiconductor layer 11 to the front surface 2, or may be performed from the rear surface 3 to a midway point in the thickness direction of the semiconductor layer 11. A groove 62 surrounded by the end surface 7 facing the rear-surface-3 side in the thickness direction of the semiconductor layer 11 is formed by the etching operation. Thereafter, the mask 61 used for the etching operation is removed.

Figure 28F:
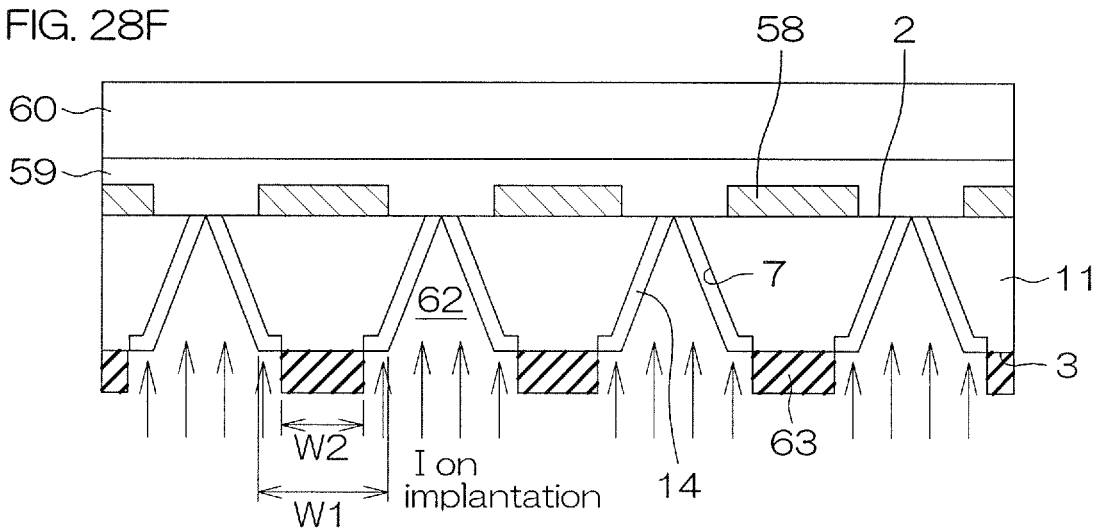
FIG. 28F is a view showing a step subsequent to the step of FIG. 28E.

Thereafter, a mask 63 that has an opening is selectively formed on the rear surface 3 of the semiconductor layer 11 as shown in FIG. 28F. For example, a metal film, an insulating film, a photoresist, etc., can be used as the mask 63. Thereafter, substances comparatively small in mass, such as p type impurity ions, protons, helium ions, electron rays, are implanted from the rear-surface-3 side of the semiconductor layer 11 through the mask 63. Accordingly, the electric-field relaxation region 14 that has a substantially constant width is formed along the end surface 7. At this time, the use of the mask 63 having a width W2 narrower than a width W1 between mutually-adjoining grooves 62 makes it possible to expose a part of the rear surface 3 of the semiconductor layer 11, and hence makes it possible to implant ions or the like into the exposed part. This makes it possible to form the bottom-surface-side draw portion 52 of the electric-field relaxation region 14 (see FIG. 27A and the like).

Figure 28G:
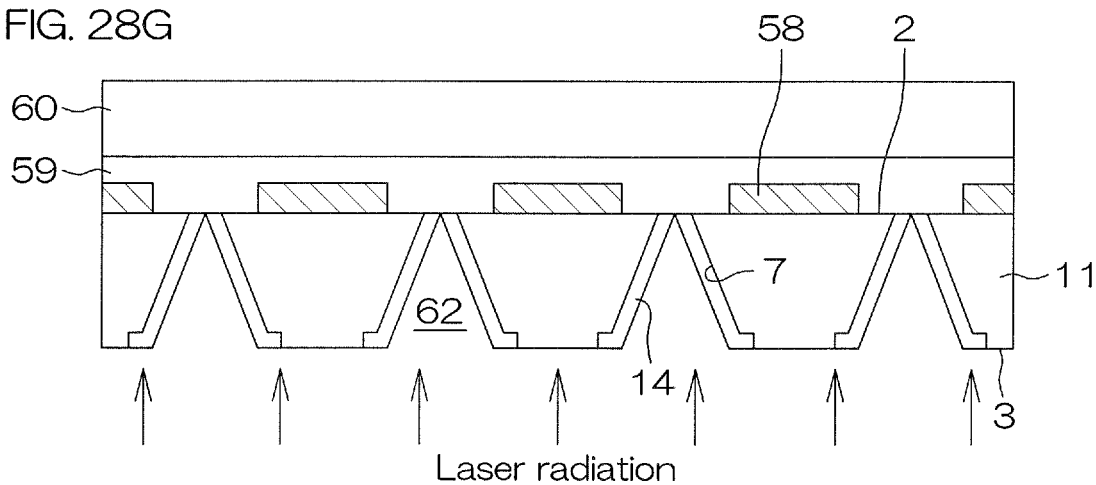
FIG. 28G is a view showing a step subsequent to the step of FIG. 28F.

Thereafter, if necessary, laser annealing treatment is performed in order to restore crystal damage that the semiconductor layer 11 has received because of the operation of etching or the operation of ion implantation as shown in FIG. 28G.

Figure 28H:
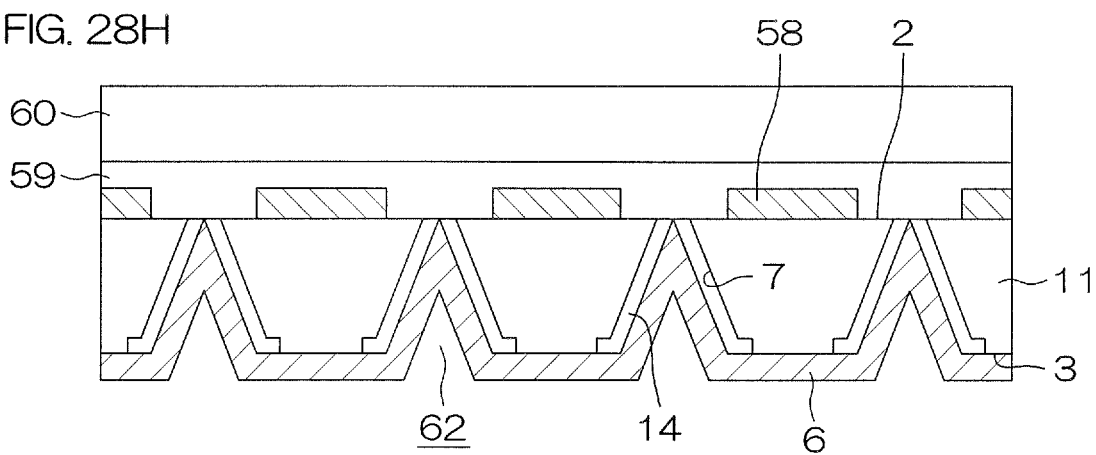
FIG. 28H is a view showing a step subsequent to the step of FIG. 28G.

Thereafter, the drain electrode 6 is formed so as to integrally cover the rear surface 3 and the end surface 7 of the semiconductor layer 11 according to, for example, the sputtering method as shown in FIG. 28H.

Figure 28I:
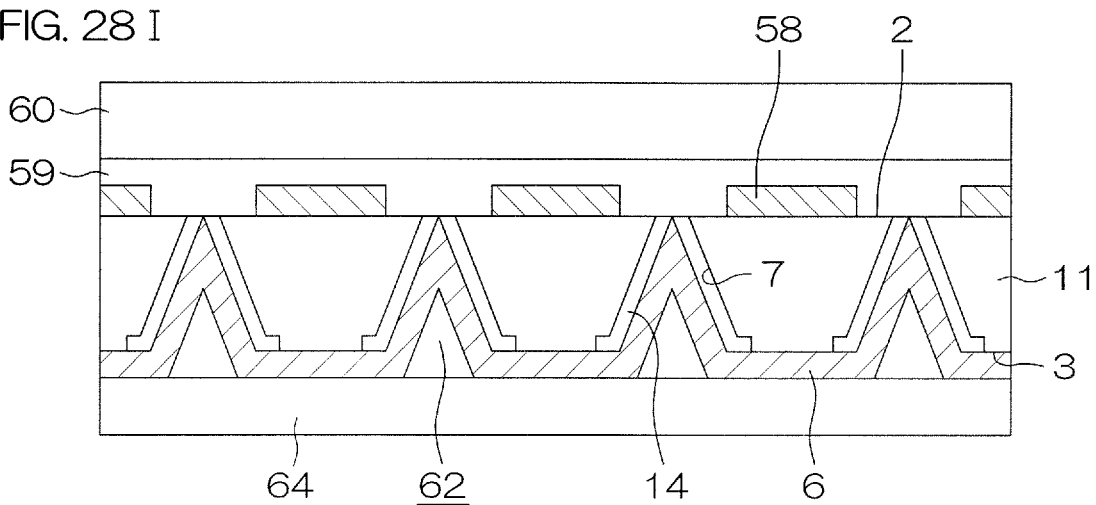
FIG. 28I is a view showing a step subsequent to the step of FIG. 28H.

Thereafter, a dicing tape 64 is allowed to adhere to the rear-surface-3 side of the semiconductor layer 11, i.e., to adhere to the drain electrode 6 as shown in FIG. 28I.

Figure 28J:
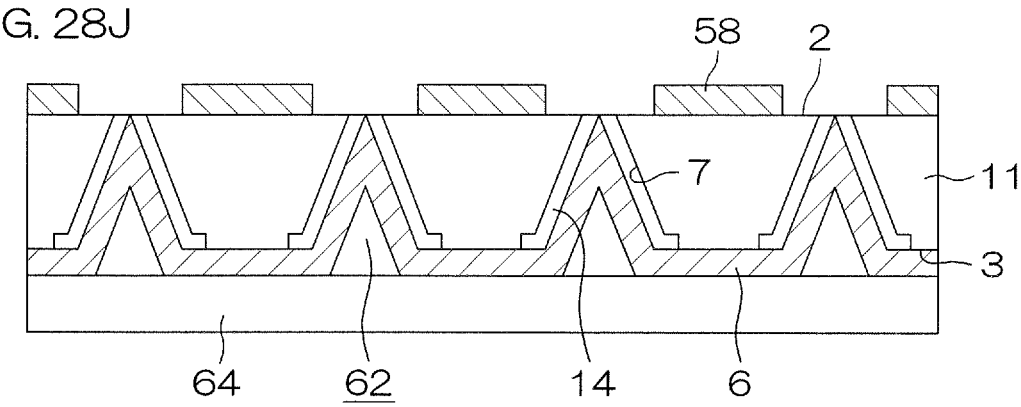
FIG. 28J is a view showing a step subsequent to the step of FIG. 28I.

Thereafter, the support substrate 60 on the front-surface-2 side of the semiconductor layer 11 is removed together with the adhesive member 59 as shown in FIG. 28J.

Figure 28K:
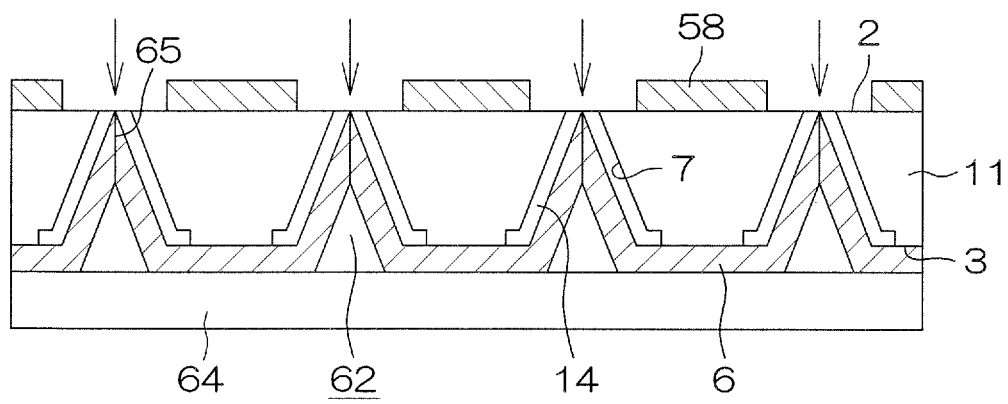
FIG. 28K is a view showing a step subsequent to the step of FIG. 28J.

Thereafter, the semiconductor layer 11 is cut along a dicing line 65 that has been set along, for example, the groove 62 as shown in FIG. 28K. This dicing step is not required if the etching step of FIG. 28E is performed from the rear surface 3 to the front surface 2 of the semiconductor layer 11.

Figure 28L:
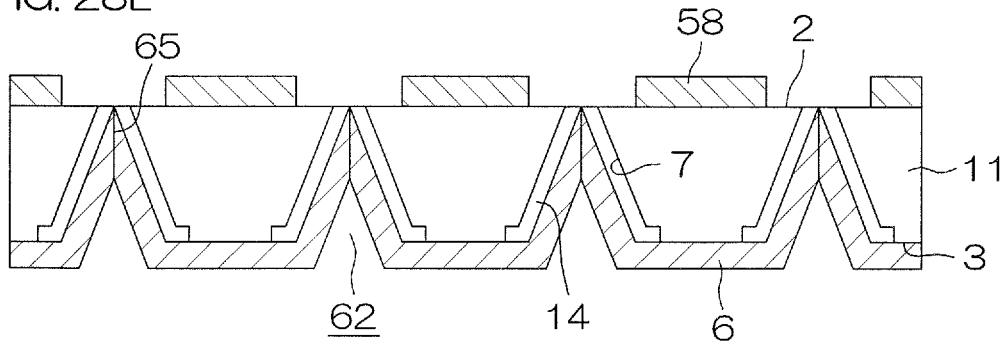
FIG. 28L is a view showing a step subsequent to the step of FIG. 28K.

Thereafter, the dicing tape 64 is removed, and, as a result, semiconductor devices 1 each of which is one of a plurality of individual pieces are obtained as shown in FIG. 28L.

According to the aforementioned method, the end surface 7 is formed so as to be allowed to face the rear-surface-3 side of the semiconductor layer 11 by means of etching. It is possible to form the electric-field relaxation region 14 by means of ion implantation into the end surface 7 as above, and therefore it is possible to easily form the electric-field relaxation region 14 with lower energy than in a case in which the electric-field relaxation region 14 ranging from the front surface 2 to the rear surface 3 of the semiconductor layer 11 is formed by ion implantation as in the aforementioned preferred embodiment. Additionally, it is possible to make the steps simpler than in a case in which the electric-field relaxation region 14 is formed by backfilling the through-hole 19 shown in FIG. 6A to FIG. 6D.

Although FIGS. 28A to 28L show a case in which the etching of the semiconductor layer 11 is performed from the rear surface 3 to the front surface 2, these steps may be changed to the steps of FIGS. 29A to 29E.

Figure 29A:
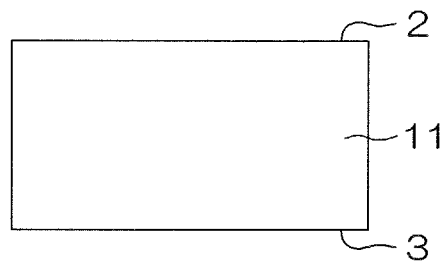
FIG. 29A is a view showing a part of another manufacturing processes of the semiconductor device of FIG. 24.
Figure 29B:
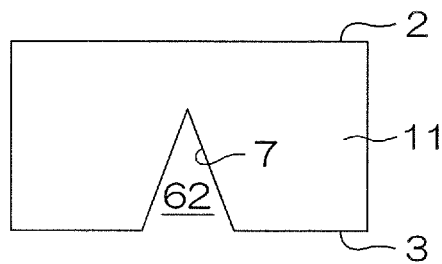
FIG. 29B is a view showing a step subsequent to the step of FIG. 29A.
Figure 29C:
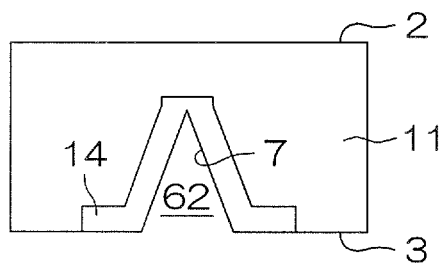
FIG. 29C is a view showing a step subsequent to the step of FIG. 29B.
Figure 29D:
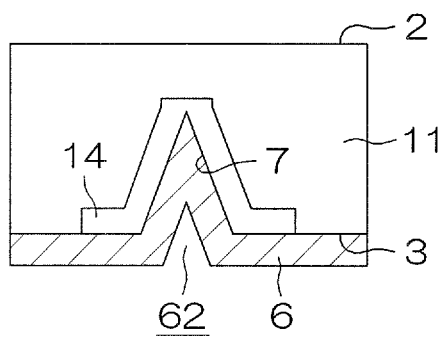
FIG. 29D is a view showing a step subsequent to the step of FIG. 29C.
Figure 29E:
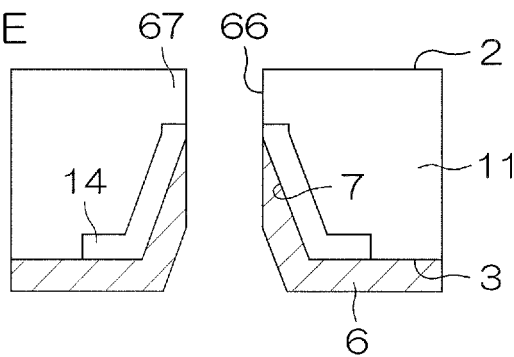
FIG. 29E is a view showing a step subsequent to the step of FIG. 29D.

In detail, the etching of the semiconductor layer 11 may be stopped at a midway point in the thickness direction of the semiconductor layer 11 from the rear surface 3 as shown in FIG. 29B after the rear surface 3 of the semiconductor layer 11 is exposed by the rear-surface grinding step of FIG. 29A. Thereafter, a step of forming the electric-field relaxation region 14 (FIG. 29C) and a step of forming the drain electrode 6 (FIG. 29D) are performed, and then a dicing step is performed as shown in FIG. 29E. In this case, a part that has not yet been etched in the semiconductor layer 11 is exposed as an end surface 66 perpendicular to the front surface 2 as shown in FIG. 29E. Therefore, an upper part on the front-surface-2 side in the end surface 7 of the semiconductor layer 11 is exposed as the perpendicular end surface 66. The perpendicular end surface 66 is allowed to appear by the dicing step, and has not yet been formed when ions are implanted to form the electric-field relaxation region 14 and when the drain electrode 6 is formed. Therefore, neither the electric-field relaxation region 14 nor the drain electrode 6 is formed at the perpendicular end surface 66, and an $n^-$ type region 67 that is a part of the $n^-$ type drift region 29 is exposed.

Figure 30:
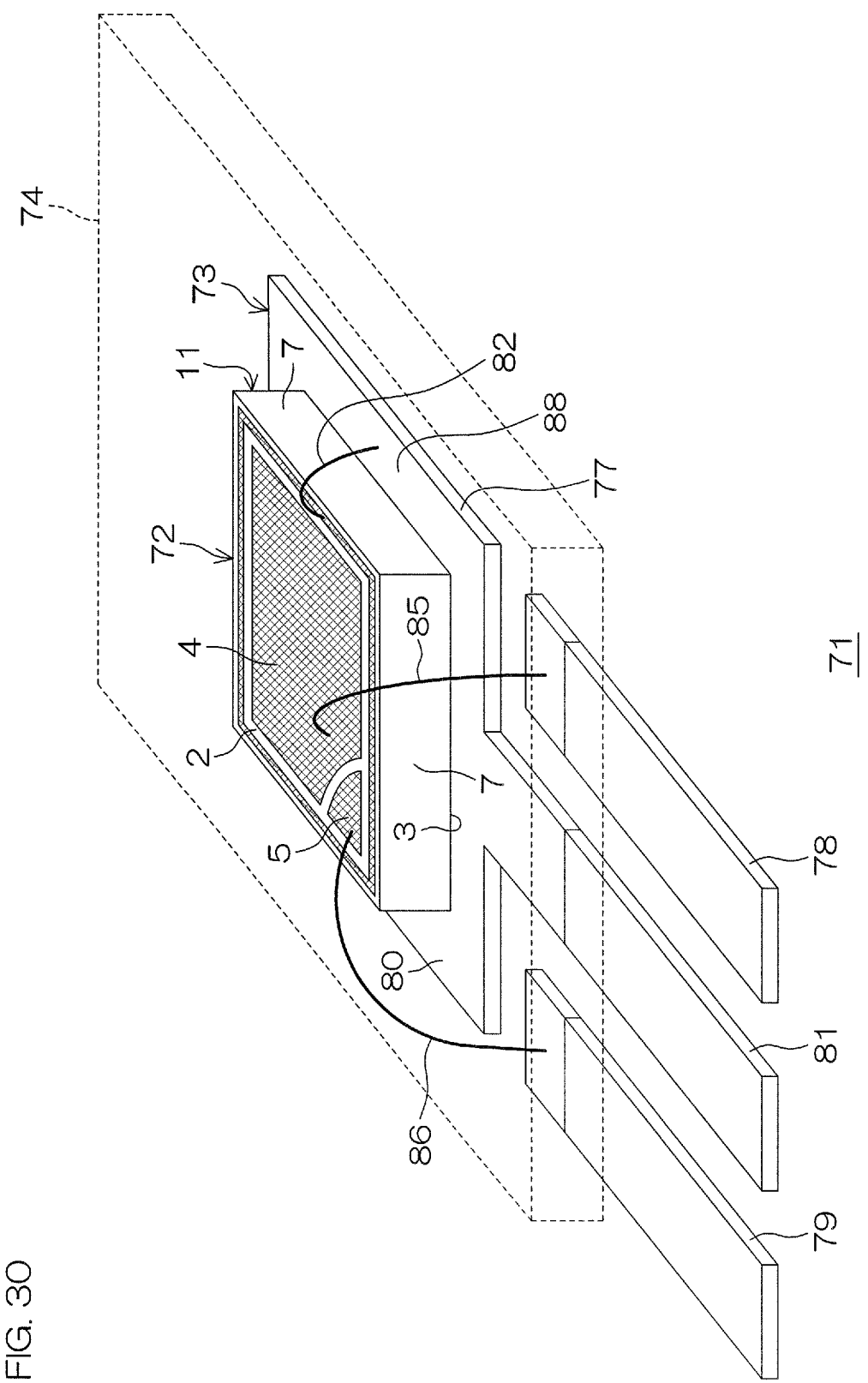
FIG. 30 is a schematic perspective view of a semiconductor package according to a preferred embodiment of the present invention.

FIG. 30 is a schematic perspective view of a semiconductor package 71 according to a preferred embodiment of the present invention. In FIG. 30, the same reference sign is given to a component equivalent to each component of FIGS. 1 to 23, and a description of this component is omitted. Additionally, for clarity, the inside of a resin package 74 is shown in a see-through manner in FIG. 30.

The semiconductor package 71 includes a semiconductor chip 72, a substrate terminal 73, and the resin package 74.

The semiconductor chip 72 may be configured in the same way as the semiconductor device 1 shown in FIG. 1 to FIG. 23.

The substrate terminal 73 is a plate (a metal substrate) made of a metallic material, such as Cu, and includes a drain terminal 77, a source terminal 78, and a gate terminal 79.

The drain terminal 77 includes an island portion 80 that is quadrangular in a plan view and a linear terminal portion 81 that extends from a side of the island portion 80. The source terminal 78 and the gate terminal 79 are each formed in the shape of a line parallel to the terminal portion 81 of the drain terminal 77, and are disposed on the right side and on the left side of the drawing sheet, respectively, so as to sandwich the central drain terminal 77 (the terminal portion 81) placed therebetween from both sides in the width direction.

The island portion 80 is used to support the semiconductor chip 72, and has an area larger than the semiconductor chip 72. Accordingly, the island portion 80 has an outer peripheral portion 88 that is a part placed outside the semiconductor chip 72 and that surrounds the semiconductor chip 72 in the mounted state of the semiconductor chip 72.

The drain electrode (the drain electrode 6 of FIG. 3) of the semiconductor chip 72 is electrically connected to the island portion 80 by means of die bonding. On the other hand, the source electrode 4 and the gate pad 5 of the semiconductor chip 72 are electrically connected to the source terminal 78 and to the gate terminal 79 through bonding wires 85 and 86, respectively. Additionally, if the semiconductor chip 72 includes the second drain electrode 37 shown in FIG. 12 and FIG. 14, the second drain electrode 37 is connected to the drain electrode 6 through a bonding wire 82 and through the drain terminal 77 (the island portion 80). This makes it possible to equalize the electric potential of the drain electrode 6 and that of the second drain electrode 37 with each other.

Next, electric-field relaxation effects achieved by the aforementioned electric-field relaxation region 14 will be described with reference to FIG. 31 and FIG. 32.

Figure 31:
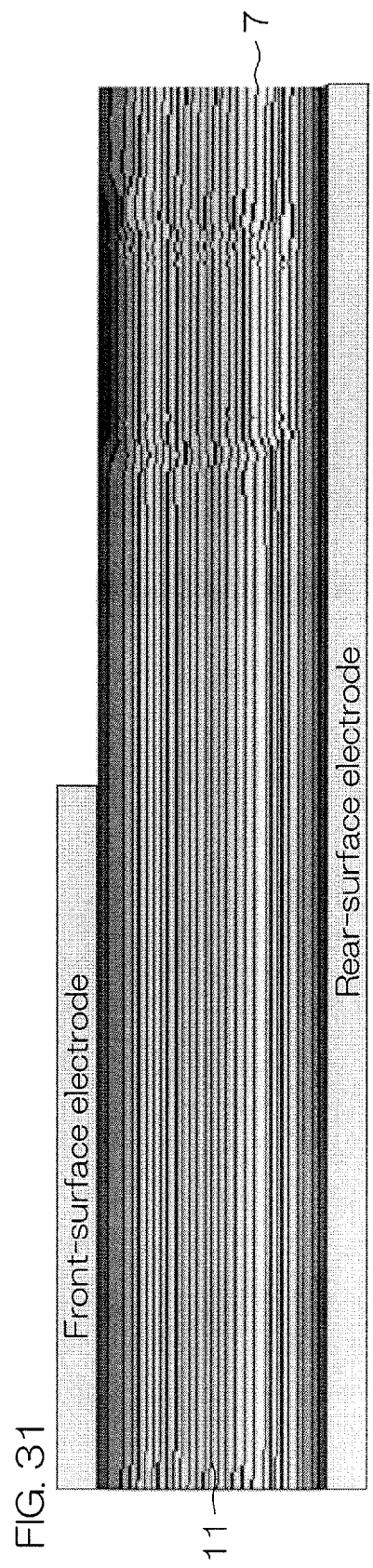
FIG. 31 is a view to verify an electric-field relaxation effect brought about by an electric-field relaxation region.
Figure 32:
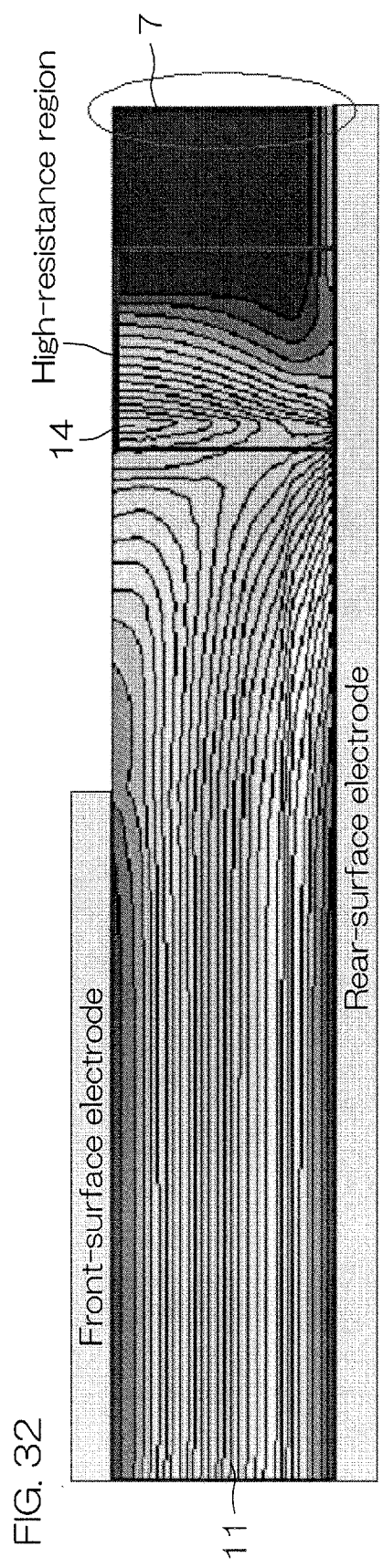
FIG. 32 is a view to verify an electric-field relaxation effect brought about by an electric-field relaxation region.

FIG. 31 and FIG. 32 are views (simulations) that show electric field distributions when a reverse voltage is applied to a front-surface electrode and a rear-surface electrode disposed on the front surface and the rear surface of the semiconductor layer 11, respectively. FIG. 31 is an example in which the electric-field relaxation region 14 is not included in the outer peripheral region, whereas FIG. 32 is an example in which the electric-field relaxation region 14 (high-resistance region) is included in the outer peripheral region.

If the electric-field relaxation region 14 is not included as shown in FIG. 31, a high-intensity electric field (an area in which an interval between equipotential lines is narrow) is distributed up to the end surface 7 of the semiconductor layer 11. Therefore, if a defective region exists in the end surface 7 of the semiconductor layer 11 because of dicing, concern will be caused about a case in which a leakage current will occur because of the generation of electron-hole pairs in the defective region when a reverse voltage is applied.

On the other hand, if the electric-field relaxation region 14 is included as shown in FIG. 32, a high-intensity electric field is intercepted by the electric-field relaxation region 14 (high-resistance region), and the high-intensity electric field is prevented from being applied to the end surface 7 of the semiconductor layer 11. Therefore, even if a defective region exists in the end surface 7 of the semiconductor layer 11 because of dicing, it is also possible to prevent a leakage current from flowing in the defective region because of the generation of electron-hole pairs.

Although the preferred embodiments of the present invention have been described as above, the present invention can also be embodied in modes differing from the aforementioned modes.

Figure 33:
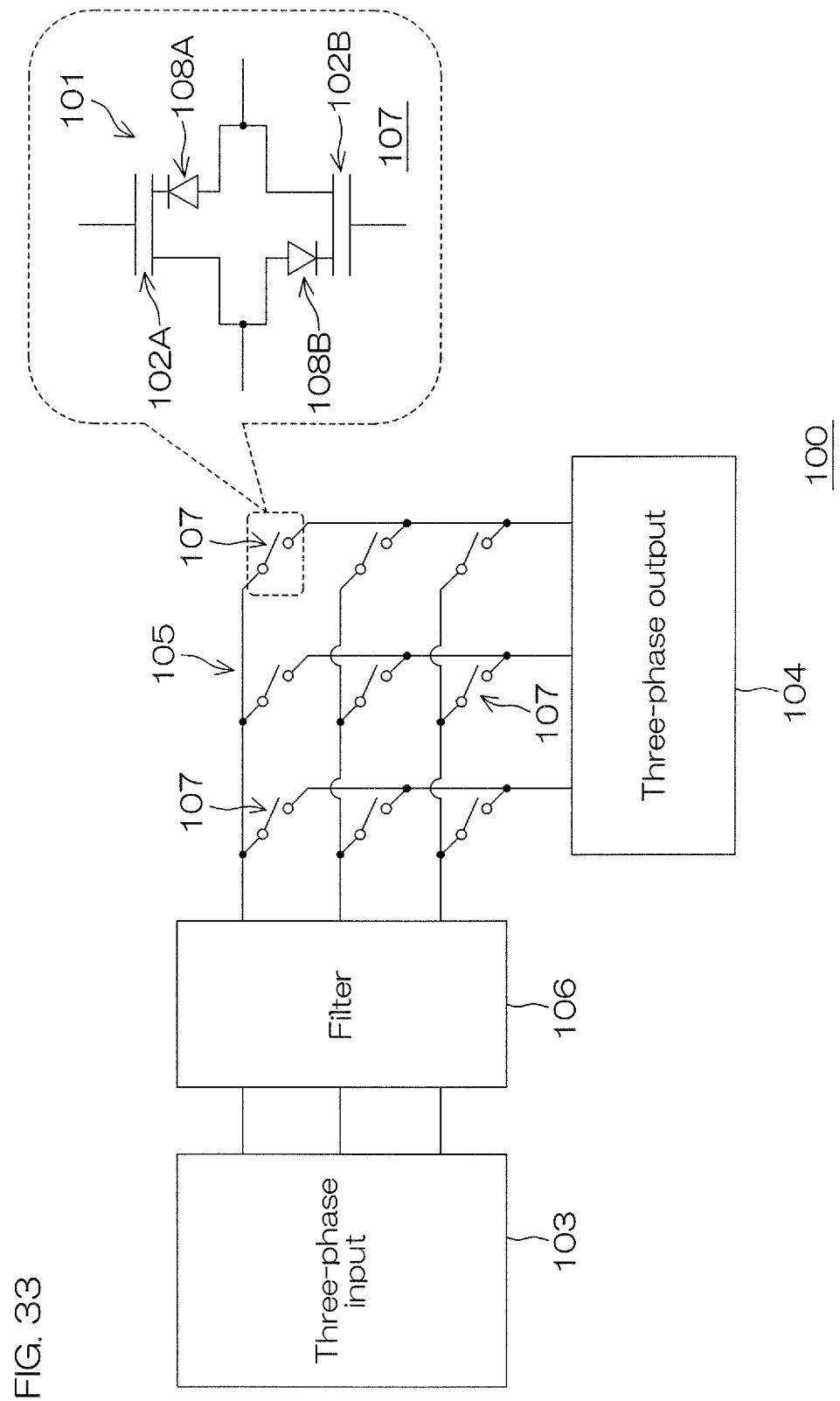
FIG. 33 is a matrix converter circuit diagram in which a semiconductor device according to a preferred embodiment of the present invention has been incorporated as a bidirectional switch.

For example, the aforementioned semiconductor device 1 can be incorporated into a matrix converter circuit 100 shown in FIG. 33 as a bidirectional switch. In detail, the matrix converter circuit 100 includes a three-phase input portion 103, a three-phase output portion 104, a circuit main portion 105, and a filter circuit 106. The semiconductor device 1 is introduced as a bidirectional switch 101 in each switch portion 107 of the circuit main portion 105. The bidirectional switch 101 can be configured by a combination of two transistors (semiconductor devices 1) 102A and 102B and two diodes 108A and 108B.

Additionally, for example, the aforementioned semiconductor device 1 may have a protective film 68 that is formed at least in the outer peripheral region 12 of the semiconductor layer 11 and with which an area from the peripheral edge portion of the source electrode 4 to the end surface 7 of the semiconductor layer 11 is covered as shown in FIG. 34. The terminal of the protective film 68 is not necessarily required to be the end surface 7 of the semiconductor layer 11. For example, polyimide can be used as the protective film 68. With respect to the protective film 68, only a case in which it is employed in the mode of FIG. 3 was shown, and yet the protective film 68 can also be employed in the modes of FIG. 7, FIG. 8, FIG. 10, FIG. 12, FIG. 14, FIG. 15, FIG. 17, FIG. 18, FIG. 19, and FIG. 24, of course.

Additionally, although only a case in which the MIS transistor structure is formed at the front-surface portion of the semiconductor layer was shown in the aforementioned preferred embodiments, it is also allowable to form the electric-field relaxation region of the preferred embodiment of the present invention in an element, such as a JFET element or a diode element, in which the MIS transistor structure is not formed. Additionally, although only a case in which a rear-surface electrode is Schottky junction was shown, it is allowable to employ the rear-surface electrode of ohmic contact.

Additionally, although only a case in which the semiconductor layer 11 is made of SiC was shown in the aforementioned preferred embodiments, the material of the semiconductor layer 11 may be another material called a wide bandgap type, such as GaN, or the semiconductor layer 11 may be Si. Additionally, if the semiconductor device of the preferred embodiment of the present invention is used as a bidirectional switch of a power supply device, it becomes possible to easily obtain a power supply device in which the reliability of a withstand voltage has been improved and in which the on-state power loss is small.

Besides, various design changes can be made within the scope of the subject matter mentioned in the claims.

REFERENCE SIGNS LIST

1 Semiconductor device
2 Front surface (of semiconductor layer)
3 Rear surface (of semiconductor layer)
4 Source electrode
6 Drain electrode
7 End surface (of semiconductor layer)
11 Semiconductor layer
12 Outer peripheral region
13 Active region
14 Electric-field relaxation region
17 N type peripheral region
18 Base substrate
19 Through-hole
20 N$^-$ type layer
21 P type region
22 MIS transistor structure
23 P type body region
24 N$^+$ type source region
25 Gate insulating film
26 Gate electrode
29 N$^-$ type drift region
33 Surface termination structure 37 Second drain electrode
40 Trench
42 Second electric-field relaxation region
43 First semiconductor layer
44 Second semiconductor layer
45 Conductive material
71 Semiconductor package
73 Semiconductor chip
73 Substrate terminal
74 Resin package

The invention claimed is:

1. A semiconductor device comprising:
   a first conductivity type semiconductor layer that has a front surface, a rear surface on an opposite side of the front surface, and an end surface, the semiconductor layer having an active region and a peripheral region surrounding the active region;
   a circuit element formed at a front-surface portion of the semiconductor layer in the active region;
   a first electrode that is joined to the semiconductor layer in the rear surface of the semiconductor layer; and
   an electric-field relaxation region reaching the rear surface from the front surface of the semiconductor layer in the peripheral region, the electric-field relaxation region being either a high-resistance region having higher resistance than the semiconductor layer or a second conductivity type impurity region, and the electric-field relaxation region formed inwardly away from the end surface of the semiconductor layer such that the electric-field relaxation region surrounds the active region; and
   a first conductivity type peripheral impurity region formed between the electric-field relaxation region and the end surface of the semiconductor layer, wherein
   the first electrode is in contact with a part of the semiconductor layer in the active region and the peripheral impurity region in the rear surface of the semiconductor layer such that the first electrode forms a Schottky junction with the part of the semiconductor layer and the peripheral impurity region.

2. The semiconductor device according to claim 1, wherein the semiconductor layer is SiC, and the electric-field relaxation region is a high-resistance region having a crystal defect concentration of $1 \times 10^{14}$ cm$^{-3}$ to $1 \times 10^{22}$ cm$^{-3}$.

3. The semiconductor device according to claim 1, wherein the semiconductor layer is SiC, and the electric-field relaxation region is a second conductivity type impurity region having an impurity concentration of $1 \times 10^{18}$ cm$^{-3}$ to $1 \times 10^{22}$ cm$^{-3}$.

4. The semiconductor device according to claim 1, wherein the semiconductor device further comprising an auxiliary electrode that is in contact with the peripheral impurity region in the front surface of the semiconductor layer and that is electrically connected to the first electrode.

5. The semiconductor device according to claim 4, wherein the auxiliary electrode straddles a boundary portion between the electric-field relaxation region and the peripheral impurity region, and is in contact with both the electric-field relaxation region and the peripheral impurity region.

6. The semiconductor device according to claim 1, wherein the electric-field relaxation region reaches the end surface of the semiconductor layer.

7. The semiconductor device according to claim 6, wherein the first electrode is in contact with the electric-field relaxation region in the rear surface of the semiconductor layer, the semiconductor device further comprising an auxiliary electrode that is in contact with the electric-field relaxation region in the front surface of the semiconductor layer and that is electrically connected to the first electrode.

8. The semiconductor device according to claim 1, wherein a MIS transistor structure serving as the circuit element is formed at the front-surface portion of the semiconductor layer.

9. The semiconductor device according to claim 1, wherein the peripheral region of the semiconductor layer includes a flat portion with which the front surface of the semiconductor layer is flat, and
wherein the electric-field relaxation region reaches the rear surface from the front surface of the semiconductor layer of the flat portion.

10. The semiconductor device according to claim 1, further comprising a concave portion formed from the front surface in the peripheral region of the semiconductor layer,
wherein the electric-field relaxation region is formed along an inner surface of the concave portion, and has a bottom portion exposed at the rear surface of the semiconductor layer.

11. The semiconductor device according to claim 1, further comprising a second electric-field relaxation region that is formed at a rear-surface portion of the semiconductor layer and that is either a high-resistance region having higher resistance than the semiconductor layer or a second conductivity type impurity region.

12. The semiconductor device according to claim 11, wherein the second electric-field relaxation region is exposed to the rear surface of the semiconductor layer, and
wherein the first electrode is in contact with the second electric-field relaxation region in the rear surface of the semiconductor layer.

13. The semiconductor device according to claim 11, wherein a plurality of the second electric-field relaxation regions are arranged in a discrete and matrix manner when the semiconductor layer is seen from a side of the rear surface.

14. The semiconductor device according to claim 11, wherein a plurality of the second electric-field relaxation regions are arranged in a stripe manner, or the second electric-field relaxation region is formed in a grid pattern manner when the semiconductor layer is seen from a side of the rear surface.

15. The semiconductor device according to claim 1, further comprising a surface termination structure formed on a more inward side than the electric-field relaxation region in the peripheral region of the semiconductor layer.

16. The semiconductor device according to claim 8, further comprising a second electrode that is formed on the semiconductor layer and that is electrically connected to a source or an emitter of the MIS transistor structure.

17. A semiconductor package comprising:
the semiconductor device of claim 1;
a lead frame on which the semiconductor device is mounted; and
a sealing resin that seals the semiconductor device and at least one part of the lead frame.

18. A power source conversion device in which the semiconductor device of claim 8 is used as a bidirectional switching device.

19. The power source conversion device according to claim 18, wherein the bidirectional switching device is used as a switching circuit of a matrix converter circuit from multiphase input to multiphase output.

* * * * *

UNITED STATES PATENT AND TRADEMARK OFFICE
CERTIFICATE OF CORRECTION

Page 1 of 1

PATENT NO. : 10,923,562 B2
APPLICATION NO. : 16/325963
DATED : February 16, 2021
INVENTOR(S) : Seigo Mori et al.

It is certified that error appears in the above-identified patent and that said Letters Patent is hereby corrected as shown below:

On the Title Page

In title (Item (54)), and in the Specification Column 1, Line 2 please delete the word:
"SEMICONDCUTOR"

And insert:
--SEMICONDUCTOR--

Signed and Sealed this
Sixth Day of April, 2021

Drew Hirshfeld
*Performing the Functions and Duties of the
Under Secretary of Commerce for Intellectual Property and
Director of the United States Patent and Trademark Office*